(12) United States Patent
Nam

(10) Patent No.: US 11,165,022 B2
(45) Date of Patent: Nov. 2, 2021

(54) METHOD OF MANUFACTURING MEMORY DEVICE

(71) Applicant: Samsung Electronics Co., Ltd., Suwon-si (KR)

(72) Inventor: Kihyung Nam, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 67 days.

(21) Appl. No.: 16/722,871

(22) Filed: Dec. 20, 2019

(65) Prior Publication Data

US 2020/0365803 A1  Nov. 19, 2020

(30) Foreign Application Priority Data

May 13, 2019  (KR) .................. 10-2019-0055841

(51) Int. Cl.
*H01L 45/00*  (2006.01)

(52) U.S. Cl.
CPC .......... *H01L 45/1675* (2013.01); *H01L 45/06* (2013.01); *H01L 45/1253* (2013.01)

(58) Field of Classification Search
None
See application file for complete search history.

(56) References Cited

U.S. PATENT DOCUMENTS

| | | |
|---|---|---|
| 8,486,819 B2 | 7/2013 | Kim |
| 8,614,135 B2 | 12/2013 | Eun et al. |
| 8,728,940 B2 | 5/2014 | Pellizzer et al. |
| 9,054,306 B2 | 6/2015 | Eun |
| 9,196,827 B2 | 11/2015 | Oh et al. |
| 9,257,484 B2 | 2/2016 | Okajima |
| 9,269,747 B2 | 2/2016 | Pellizzer et al. |
| 9,299,747 B1 | 3/2016 | Pellizzer et al. |
| 9,306,165 B2 | 4/2016 | Lee et al. |
| 9,559,147 B2 | 1/2017 | Eun |
| 9,577,010 B2 | 2/2017 | Sciarrillo |
| 9,735,151 B1 | 8/2017 | Apodaca et al. |
| 9,768,378 B2 | 9/2017 | Pellizzer et al. |
| 9,780,144 B2 | 10/2017 | Seong et al. |
| 9,793,323 B1 | 10/2017 | Lung et al. |
| 9,853,031 B1 | 12/2017 | Cho et al. |

(Continued)

FOREIGN PATENT DOCUMENTS

KR  10-2014-0081168 A  7/2014

*Primary Examiner* — Mounir S Amer
(74) *Attorney, Agent, or Firm* — Harness, Dickey & Pierce, P.L.C.

(57) ABSTRACT

A method of manufacturing a memory device is provided. The method includes the steps of forming a plurality of lower conductive lines on a substrate, forming a plurality of memory units on the plurality of lower conductive lines, forming a switch stack that defines a plurality of first lines, the plurality of first lines extending in parallel in a first direction on the plurality of memory units, forming an upper conductive layer on the switch stack, forming an etch mask that defines a plurality of second lines, the plurality of second lines extending in parallel in a second direction on the upper conductive layer, the second direction being different from the first direction, and forming a plurality of upper conductive lines and a plurality of switch units by etching the upper conductive layer and the switch stack using the etch mask.

13 Claims, 111 Drawing Sheets

(56) References Cited

U.S. PATENT DOCUMENTS

| | | |
|---|---|---|
| 9,887,354 B2 | 2/2018 | Jeong et al. |
| 10,062,841 B2 | 8/2018 | Park et al. |
| 2012/0119181 A1* | 5/2012 | Oh .................. H01L 27/224 |
| | | 257/4 |
| 2017/0117327 A1 | 4/2017 | Terai |
| 2018/0006219 A1 | 1/2018 | Seo et al. |
| 2018/0151623 A1 | 5/2018 | Terai |
| 2018/0287055 A1 | 10/2018 | Park |
| 2019/0386213 A1* | 12/2019 | Lai .................. H01L 27/2481 |

* cited by examiner

METHOD OF MANUFACTURING MEMORY DEVICE

CROSS-REFERENCE TO RELATED APPLICATION

This application claims priority under 35 U.S.C. § 119 to Korean Patent Application No. 10-2019-0055841, filed on May 13, 2019, in the Korean Intellectual Property Office, the disclosure of which is incorporated herein in its entirety by reference.

BACKGROUND

The inventive concepts relate to methods of manufacturing a memory device. More particularly, the inventive concepts relate to methods of manufacturing a phase change memory device.

A phase change random access memory (PRAM) is a non-volatile memory that stores data using phase change of a material. A memory cell of the PRAM may include a memory unit including a phase change material and a switch unit for selecting the memory unit. The memory cell may be connected to an upper conductive line and a lower conductive line (for example, a bit line and a word line).

SUMMARY

The inventive concepts provide highly integrated phase change memory devices.

According to an aspect of the inventive concepts, a method of manufacturing a memory device may include forming a plurality of lower conductive lines on a substrate, forming a plurality of memory units on the plurality of lower conductive lines, forming a switch stack that defines a plurality of first lines, the plurality of first lines extending in parallel in a first direction on the plurality of memory units, forming an upper conductive layer on the switch stack, forming an etch mask that defines a plurality of second lines, the plurality of second lines extending in parallel in a second direction on the upper conductive layer, the second direction being different from the first direction, and forming a plurality of upper conductive lines and a plurality of switch units by etching the upper conductive layer and the switch stack using the etch mask.

According to another aspect of the inventive concepts, a method of manufacturing a memory device may include forming a plurality of lower conductive lines, forming a plurality of memory units on the plurality of lower conductive lines, forming a plurality of switch units on the plurality of memory units, forming a plurality of upper conductive lines on the plurality of switch units, and forming a first insulating layer including a plurality of first recesses extending in parallel, wherein the plurality of upper conductive lines are formed in the plurality of first recesses in the first insulating layer after the first insulating layer is formed.

According to another aspect of the inventive concepts, a method of manufacturing a memory device may include forming a lower conductive line, forming at least one insulating layer on the lower conductive line, the at least one insulating layer comprising at least one hole, forming a first electrode pattern, a switch pattern, a second electrode pattern, a phase change pattern, and a third electrode pattern in the at least one hole in the at least one insulating layer, and forming an upper conductive line.

BRIEF DESCRIPTION OF THE DRAWINGS

Example embodiments of the inventive concepts will be more clearly understood from the following detailed description taken in conjunction with the accompanying drawings in which:

FIGS. 1A to 11A are plan views for explaining a method of manufacturing a memory device according to an example embodiment of the inventive concepts, FIGS. 1B to 11B are front views for explaining the method of manufacturing the memory device according to the example embodiment of the inventive concepts, and FIGS. 1C to 11C are side views for explaining the method of manufacturing the memory device according to the example embodiment of the inventive concepts.

FIGS. 12A to 15A are plan views for explaining a method of manufacturing a memory device according to an example embodiment of the inventive concepts, FIGS. 12B to 15B are front views for explaining the method of manufacturing the memory device according to the example embodiment of the inventive concepts, and FIGS. 12C to 15C are side views for explaining the method of manufacturing the memory device according to the example embodiment of the inventive concepts.

FIGS. 16A to 18A are plan views for explaining a method of manufacturing a memory device according to an example embodiment of the inventive concepts, FIGS. 16B to 18B are front views for explaining the method of manufacturing the memory device according to the example embodiment of the inventive concepts, and FIGS. 16C to 18C are side views for explaining the method of manufacturing the memory device according to the example embodiment of the inventive concepts.

FIGS. 19A to 21A are plan views for explaining a method of manufacturing a memory device according to an example embodiment of the inventive concepts, FIGS. 19B to 21B are front views for explaining the method of manufacturing the memory device according to the example embodiment of the inventive concepts, and FIGS. 19C to 21C are side views for explaining the method of manufacturing the memory device according to the example embodiment of the inventive concepts.

FIGS. 24A to 26A are plan views for explaining a method of manufacturing a memory device according to an example embodiment of the inventive concepts, FIGS. 24B to 26B are front views for explaining the method of manufacturing the memory device according to the example embodiment of the inventive concepts, and FIGS. 24C to 26C are side views for explaining the method of manufacturing the memory device according to the example embodiment of the inventive concepts.

FIGS. 27A to 29A are plan views for explaining a method of manufacturing a memory device according to an example embodiment of the inventive concepts, FIGS. 27B to 29B are front views for explaining the method of manufacturing the memory device according to the example embodiment of the inventive concepts, and FIGS. 27C to 29C are side views for explaining the method of manufacturing the memory device according to the example embodiment of the inventive concepts.

FIGS. 32A to 34A are plan views for explaining a method of manufacturing a memory device according to an example embodiment of the inventive concepts, FIGS. 32B to 34B are front views for explaining the method of manufacturing the memory device according to the example embodiment of the inventive concepts, and FIGS. 32C to 34C are side views for explaining the method of manufacturing the memory device according to the example embodiment of the inventive concept.

DETAILED DESCRIPTION

Figure 1A:
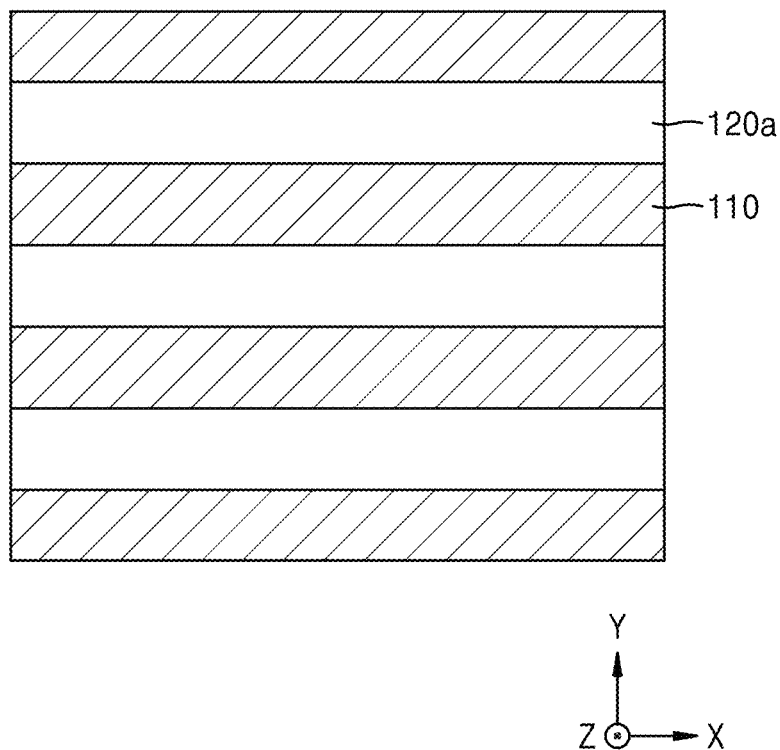

Hereinafter, the terms "damascene technique" and "etch technique" will be used herein. As used herein, the term "damascene technique" refers to a process technique in which an insulating layer having a hole and/or a recess is first formed and then a structure to be desired is formed in the hole and/or recess. The step of forming the insulating layer having a hole and/or a recess may include, for example, forming the insulating layer and etching the insulating layer. The step of forming the structure in the hole and/or the recess may include, for example, forming a material layer on the insulating layer and polishing and/or etching the material layer.

On the other hand, the term "etch technique" refers to a process type in which a structure to be desired is first formed and then an insulating layer surrounding a sidewall of the structure is formed. For example, the step of forming the structure may include forming a material layer and etching the material layer. The step of forming the insulating layer surrounding the sidewall of the structure may include, for example, forming the insulating layer on the structure and etching and/or polishing the insulating layer.

In addition, the ordinal expressions such as "first", "second", "third", etc. used herein mean only the mentioned order with regard to the relevant specific example embodiment within the detailed description of the specification and a set of claims. In addition, the order in which an element is mentioned in the detailed description of the specification and the order in which the element is mentioned in the set of claims may be different. For example, an element referred to a second insulating layer in the detailed description of the specification may be referred to a first insulating layer within the set of claims. Further, the order in which an element is referred to in a set of claims and the order in which the element is mentioned in the other set of claims may be different. Thus, an element referred to "a first insulating layer" in a set of claims may be different from an element referred to "a first insulating layer" in another set of claims.

FIGS. 1A to 11A are plan views for explaining a method of manufacturing a memory device according to an example embodiment of the inventive concepts, FIGS. 1B to 11B are front views for explaining the method of manufacturing the memory device according to the example embodiment of the inventive concepts, and FIGS. 1C to 11C are side views for explaining the method of manufacturing the memory device according to the example embodiment of the inventive concepts. According to a method of manufacturing a memory device according to an example embodiment of the inventive concepts shown in FIGS. 1A to 11C, a plurality of upper conductive lines 180 (see FIGS. 10A to 10C) and a plurality of switch units SU (see FIGS. 10A to 10C) may be formed by etching an upper conductive layer 180L (see FIGS. 9A to 9C) and a switch stack SS (see FIGS. 9A to 9C) using an etch mask M (see FIGS. 9A to 9C).

Figure 1B:
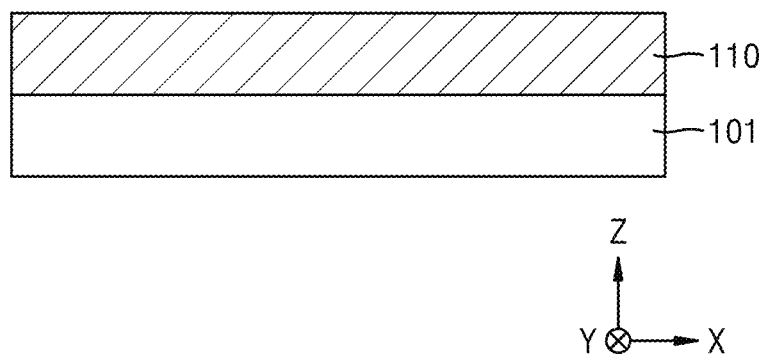
Figure 1C:
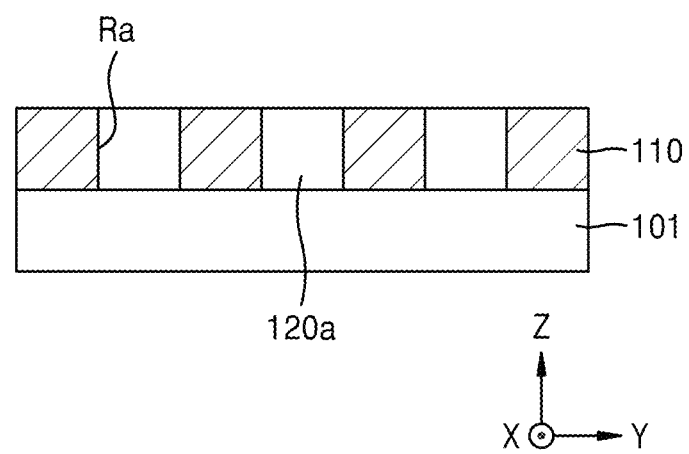

Referring to FIGS. 1A to 1C, a plurality of lower conductive lines 110 may be formed on a substrate 101. Each of the plurality of lower conductive lines 110 may correspond to a word line or a bit line of a phase change random access memory (PRAM). The plurality of lower conductive lines 110 may each extend in parallel in a first direction (an X direction). The plurality of lower conductive lines 110 may be formed in a first insulating layer 120a.

In an example embodiment, the plurality of lower conductive lines 110 may be formed using the damascene technique. That is, the first insulating layer 120a may be formed first, and the plurality of lower conductive lines 110 may be formed later in the first insulating layer 120a. For example, the first insulating layer 120a may be formed on the substrate 101, and then the first insulating layer 120a may be etched to form a plurality of first recesses Ra in the first insulating layer 120a that may each extend in parallel in the first direction (the X direction) and expose the substrate 101, and then a lower conductive layer may be formed on the first insulating layer 120a and the substrate 101, and then the lower conductive layer may be polished and/or etched so that an upper surface of the first insulation layer 120a is exposed.

In another example embodiment, the plurality of lower conductive lines 110 may be formed using the etch technique. That is, the plurality of lower conductive lines 110 may be formed first, and then the first insulating layer 120a may be formed later. For example, the lower conductive layer may be formed, and then the plurality of lower conductive lines 110 may be formed by etching the lower conductive layer, and then the first insulating layer 120a may be formed on the plurality of lower conductive lines 110, and then the first insulating layer 120a may be polished and/or etched so that an upper surface of each of the plurality of lower conductive lines 110 is exposed.

The substrate 101 may include any material, such as organic material, ceramic, semiconductor, or combinations thereof. The substrate 101 may include, for example, Group IV semiconductor material, Group III-V semiconductor material, Group II-VI semiconductor material, or combinations thereof. The Group IV semiconductor material may include, for example, silicon (Si), germanium (Ge), or silicon (Si)-germanium (Ge). The III-V semiconductor material may include, for example, gallium arsenide (GaAs), indium phosphide (InP), gallium phosphide (GaP), indium arsenide (InAs), indium antimony (InSb), or indium gallium arsenide (InGaAs). The II-VI semiconductor material may include, for example, zinc telluride (ZnTe), or cadmium sulfide (CdS). The substrate 101 may include a bulk wafer or an epitaxial layer. The plurality of lower conductive lines 110 may include any conductive material including metal, metal nitride, metal oxide, or combinations thereof. The plurality of lower conductive lines 110 may include, for example, W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, or combinations thereof. The first insulating layer 120a may include silicon oxide, silicon nitride, or a combination thereof.

Figure 2A:
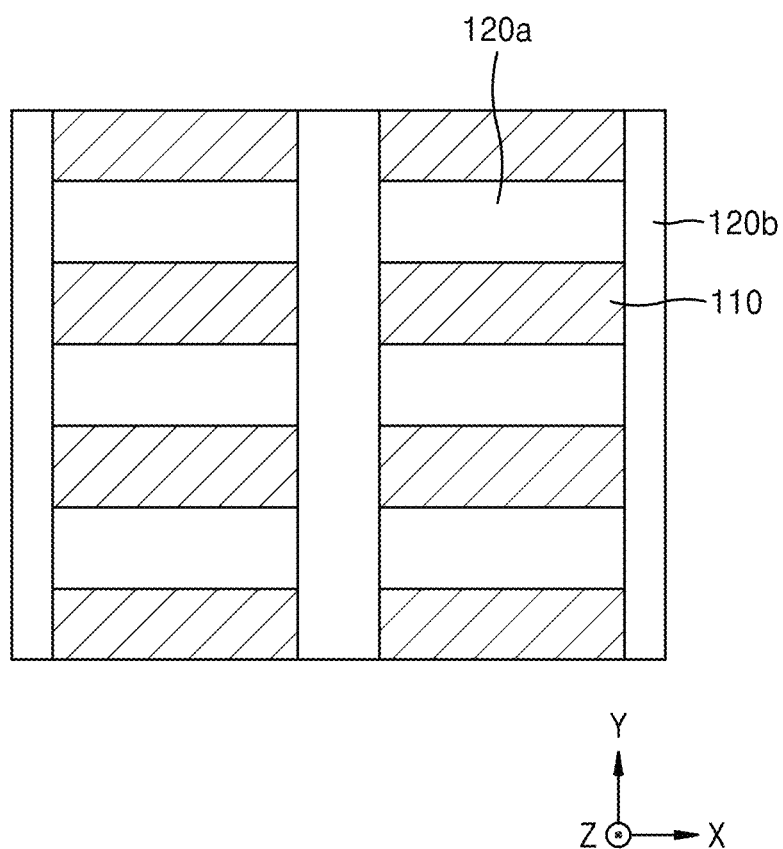
Figure 2B:
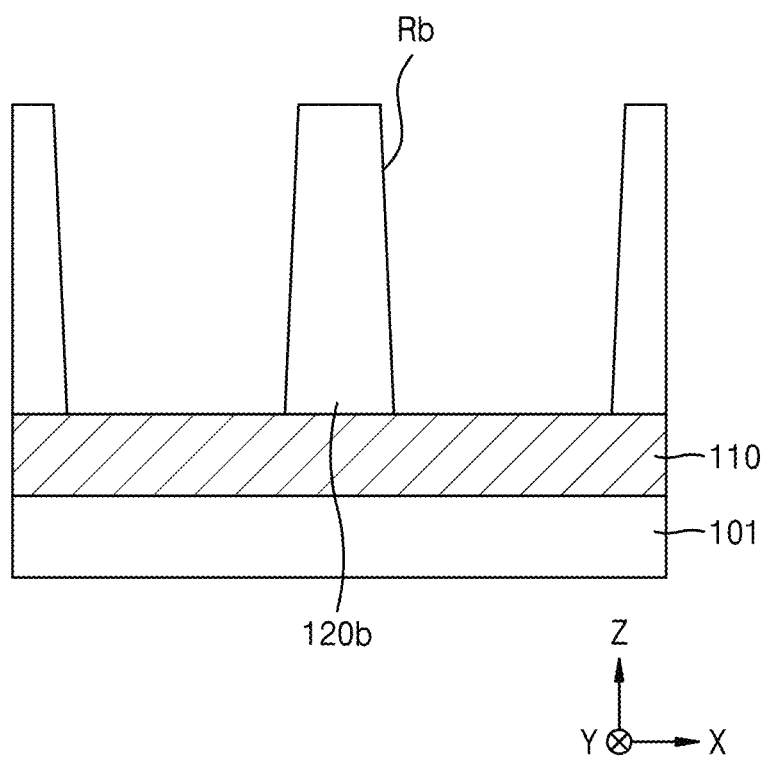
Figure 2C:
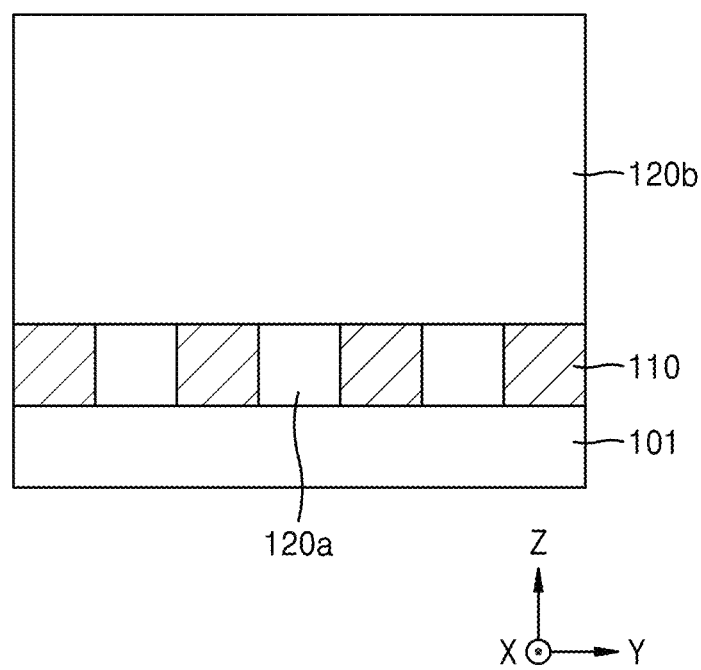

Referring to FIGS. 2A to 2C, a second insulating layer 120b may be formed on the plurality of lower conductive lines 110 and the first insulating layer 120a. The second insulating layer 120b may include silicon oxide, silicon nitride, or a combination thereof. In addition, a plurality of second recesses Rb may be formed in the second insulating layer 120b that each extend in parallel in a second direction (a Y direction) and expose the plurality of lower conductive lines 110 and the first insulating layer 120a. That is, the second insulating layer 120b may be patterned into a plurality of lines each extending in parallel in the second direction (the Y direction).

Figure 3A:
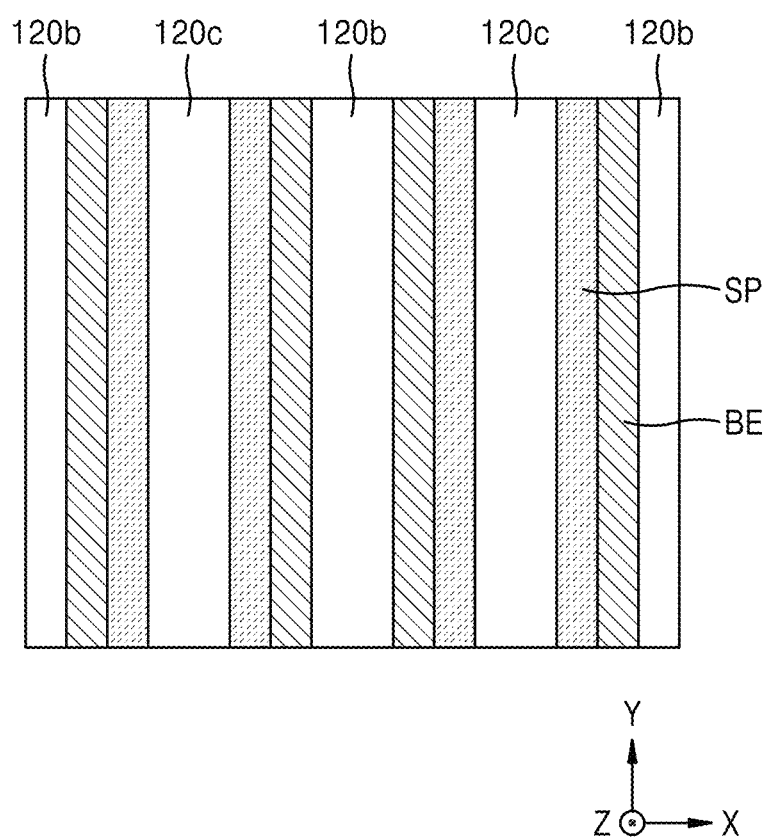
Figure 3B:
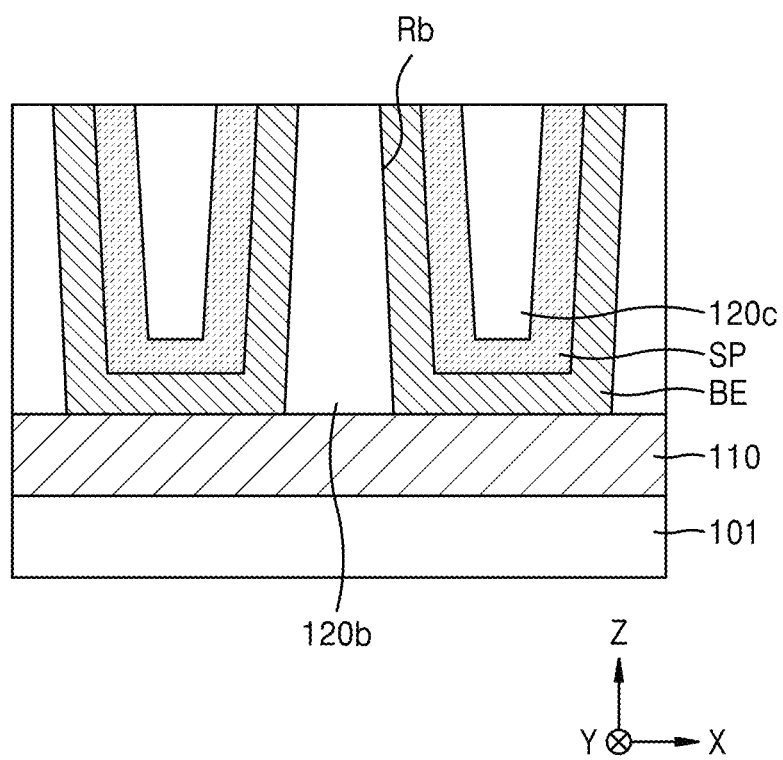
Figure 3C:
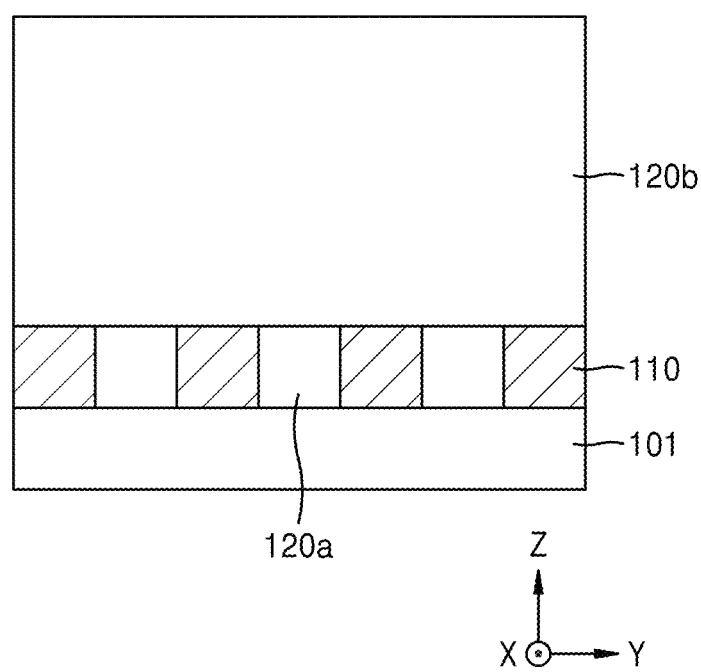

Referring to FIGS. 3A to 3C, a plurality of lower electrode patterns BE, a plurality of spacer patterns SP, and a third insulating layer 120c may be formed in the plurality of second recesses Rb in the second insulating layer 120b. For example, a lower electrode layer (not shown), a spacer layer (not shown), and a material layer (not shown) for forming the third insulating layer 120c may be sequentially formed on the first insulating layer 120a, the plurality of lower conductive lines 110, and the second insulating layer 120b, and then the lower electrode patterns BE and the plurality of spacer patterns SP may be formed and the third insulating layer 120c may be patterned by polishing and/or etching the lower electrode layer, the spacer layer, and the material layer for forming the third insulating layer 120c so that an upper surface of the second insulating layer 120b is exposed. In some example embodiments, the plurality of spacer patterns SP may be omitted. In this specification, a step of forming the material layer for forming the third insulating layer 120c on the lower electrode layer may include a step of forming the material layer for forming the third insulating layer 120c directly on the lower electrode layer, as well as a step of forming at least one additional layer such as the space layer on the lower electrode layer and then forming the material layer for forming the third insulating layer 120c on the at least one additional layer.

The plurality of lower electrode patterns BE may include metal, metal nitride, carbon-based conductive material, or combinations thereof. For example, the plurality of lower electrode patterns BE may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof. The plurality of spacer patterns SP may include silicon oxide, silicon nitride, or a combination thereof. The third insulating layer 120c may include silicon oxide, silicon nitride, or a combination thereof.

Figure 4A:
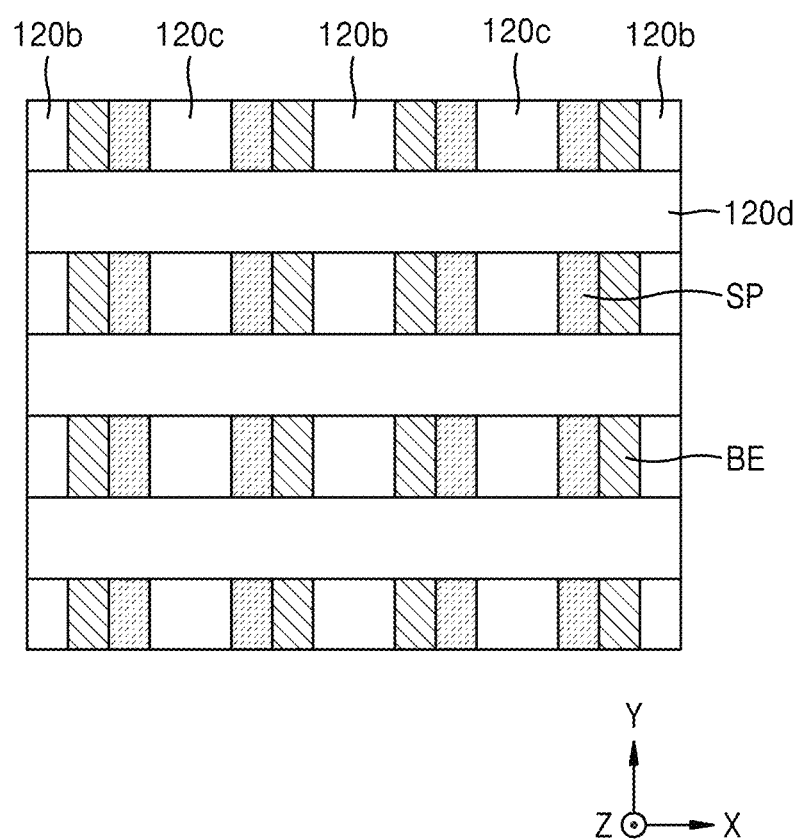
Figure 4B:
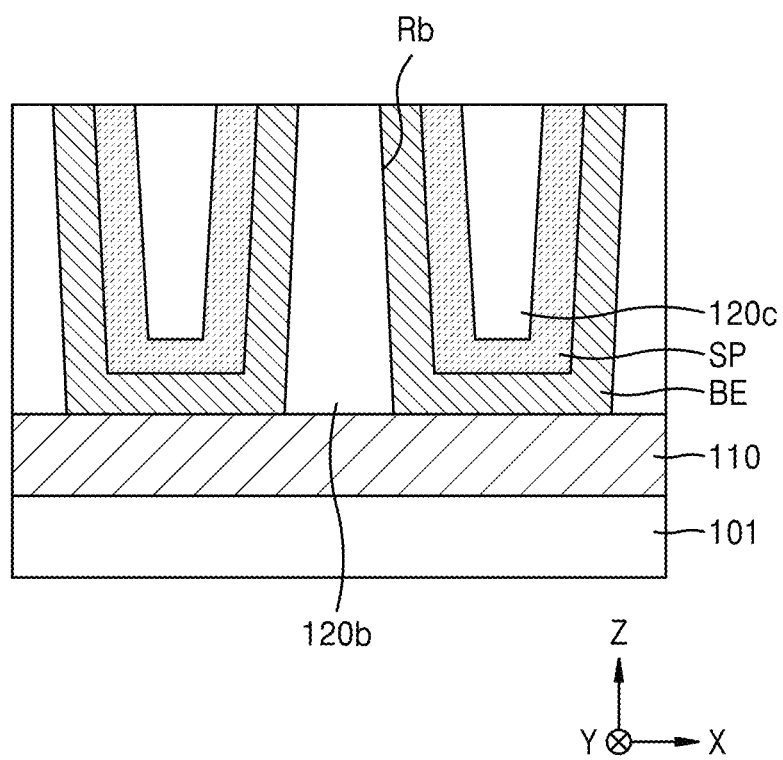
Figure 4C:
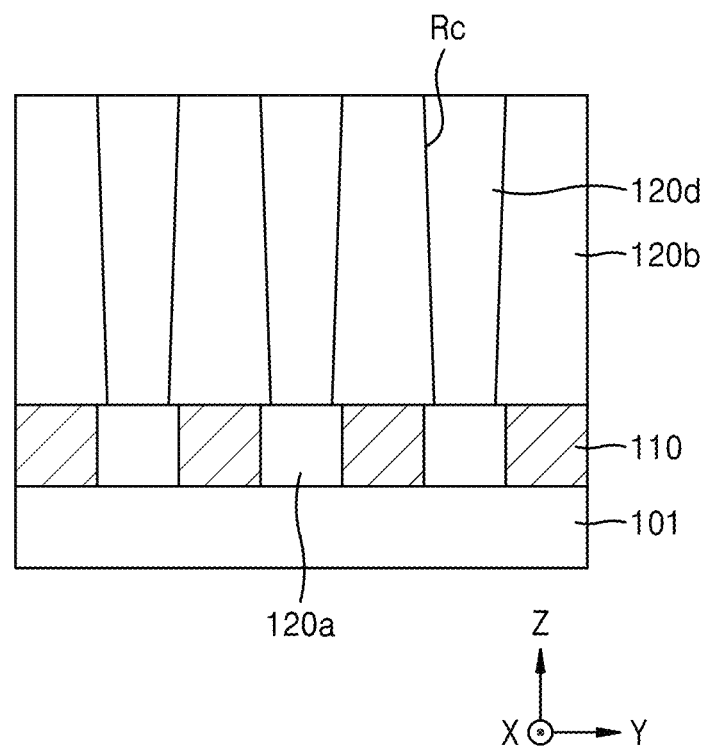

Referring to FIGS. 4A to 4C, a plurality of third recesses Rc may be formed to extend in parallel in the first direction (the X direction) while intersecting with the second insulating layer 120b, the plurality of lower electrode patterns BE, the plurality of spacer patterns SP, and the third insulating layer 120c, and to expose the first insulating layer 120a. For example, an etch mask (not shown) having a shape of a plurality of lines may be formed to extend in parallel in the first direction (the X direction) on the second insulating layer 120b, the plurality of lower electrode layer patterns BE, the plurality of spacer patterns SP, and the third insulating layer 120c, and then the second insulating layer 120b, the plurality of lower electrode layer patterns BE, the plurality of spacer patterns SP, and the third insulating layer 120c may be etched by using the etch mask.

In addition, a fourth insulating layer 120d may be formed in the plurality of third recesses Rc. For example, the fourth insulating layer 120d may be formed on the first insulating layer 120a, the second insulating layer 120b, the plurality of lower electrode patterns BE, the plurality of spacer patterns SP, and the third insulating layer 120c, and then the fourth insulating layer 120d may be polished and/or etched so that an upper surface of the second insulating layer 120b and an upper surface of the third insulating layer 120c are exposed.

Figure 5A:
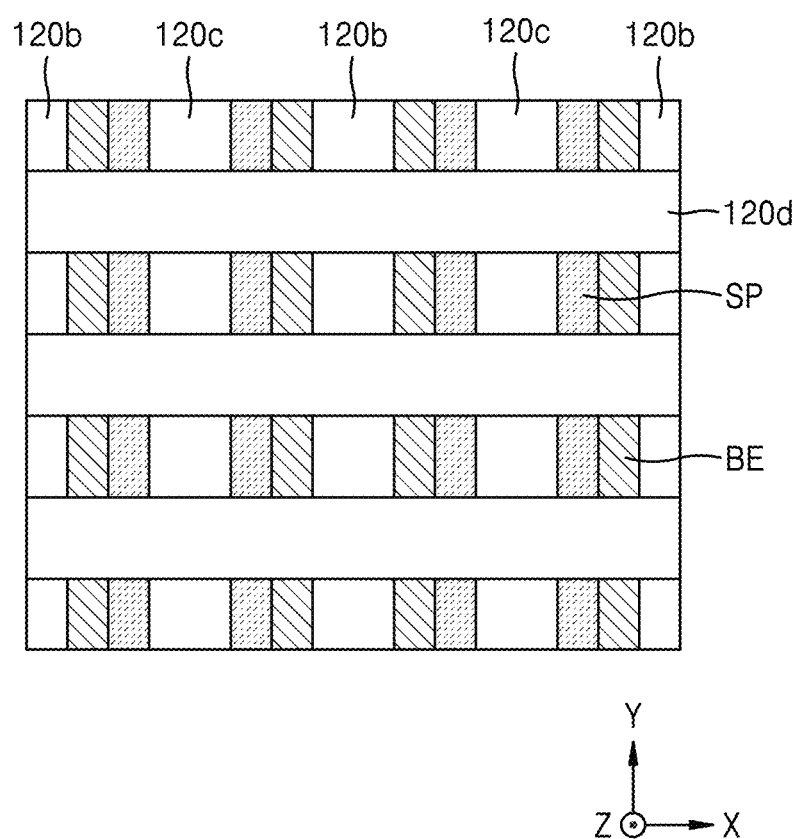
Figure 5B:
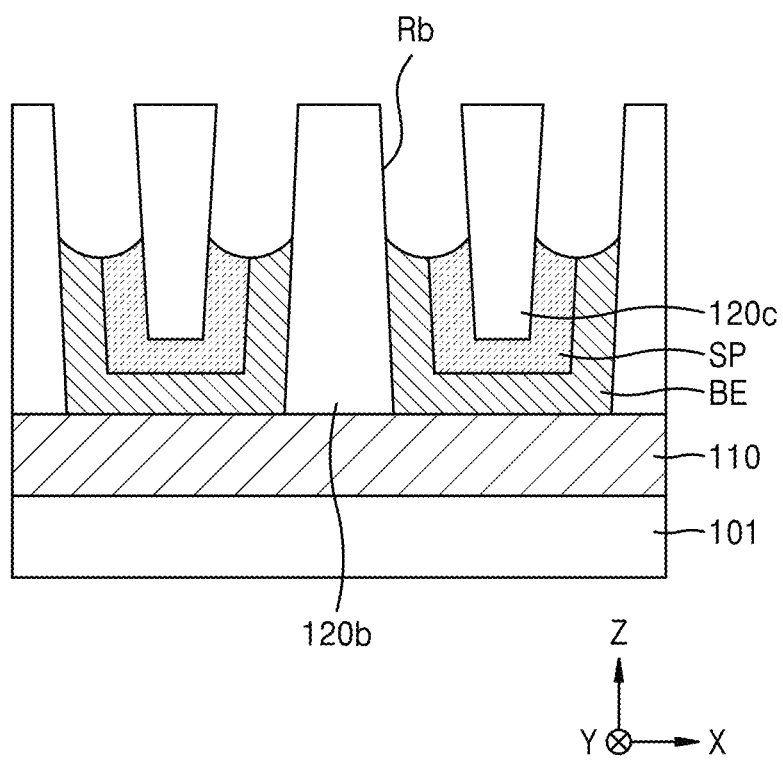
Figure 5C:
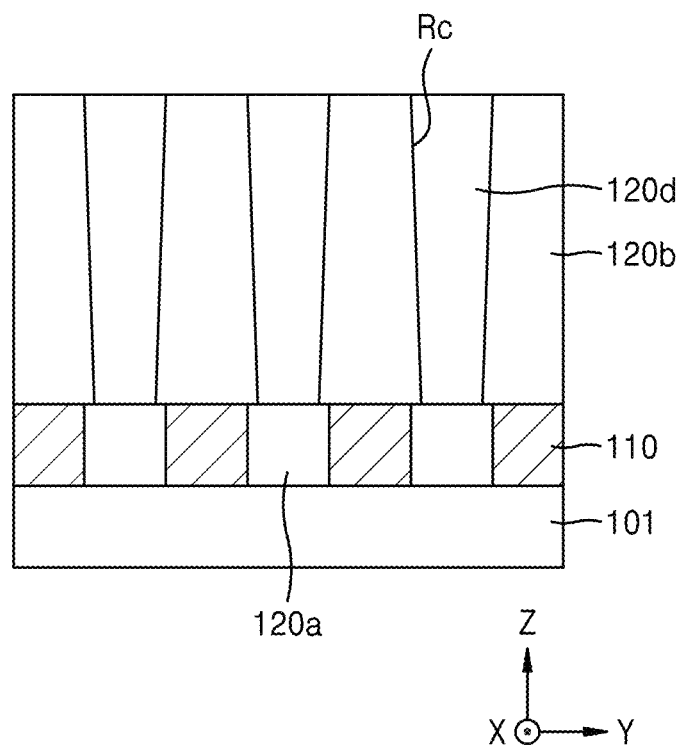

Referring to FIGS. 5A to 5C, an upper portion of each of the plurality of lower electrode patterns BE and an upper portion of each of the plurality of spacer patterns SP may be etched. Accordingly, an upper end of each of the plurality of lower electrode patterns BE and an upper end of each of the plurality of spacer patterns SP may be lower than the upper surface of the second insulating layer 120b and the upper surface of the third insulating layer 120c.

Figure 6A:
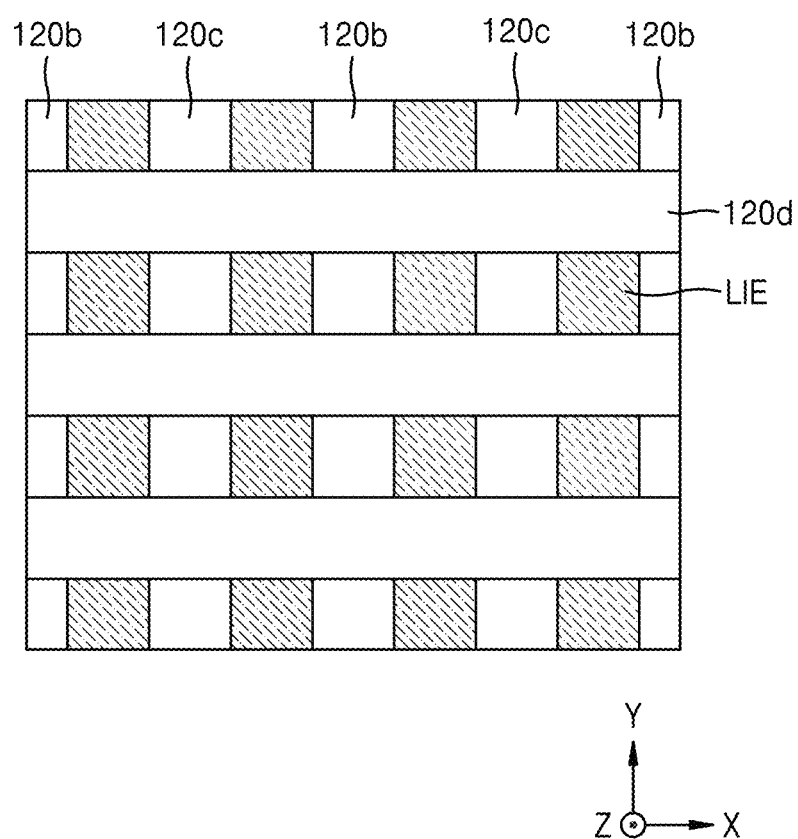
Figure 6B:
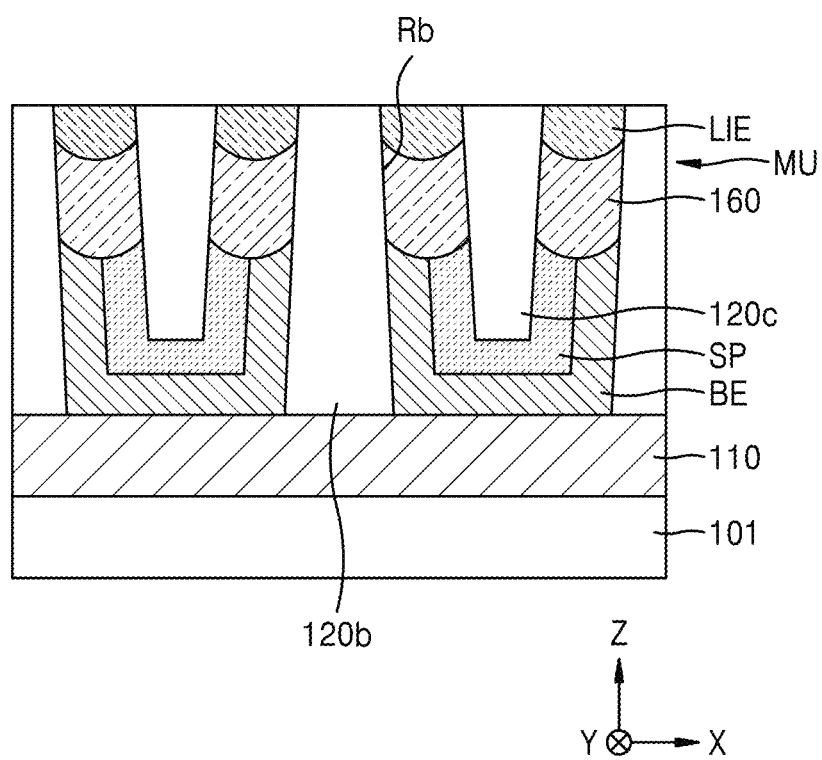
Figure 6C:
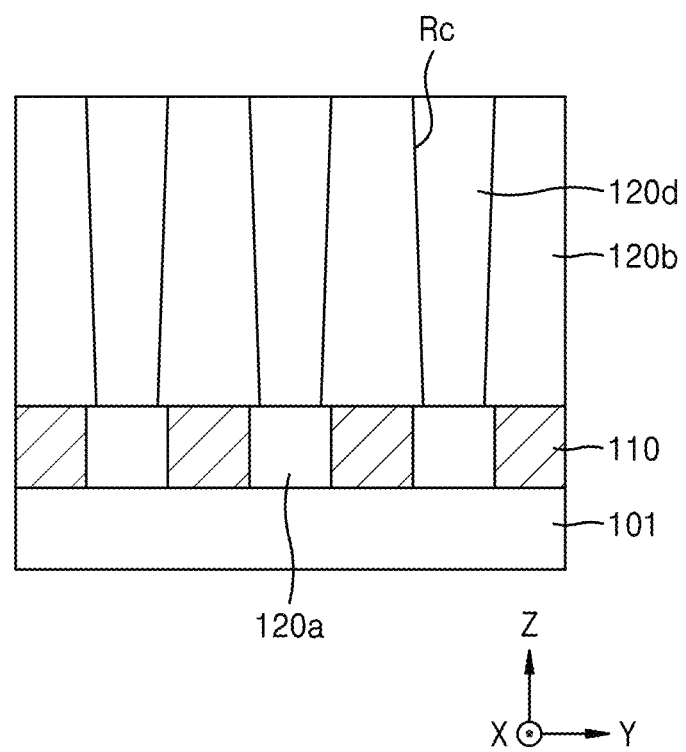

Referring to FIGS. 6A to 6C, a plurality of phase change patterns 160 and a plurality of lower intermediate electrode patterns LIE may be formed between the second insulating layer 120b and the third insulating layer 130c. Thus, a plurality of memory units MU may be formed. The plurality of memory units MU may be formed using the damascene technique. That is, the second insulating layer 120b including the plurality of second recesses Rb is formed first, and then the plurality of memory units MU may be formed in the plurality of second recesses Rb in the second insulating layer 120b. Each of the plurality of memory units MU may include each of the plurality of lower electrode patterns BE, each of the plurality of phase change patterns 160, and each of the plurality of lower intermediate electrode patterns LIE. Further, two neighboring memory units of the plurality of memory units MU may share one lower electrode pattern BE.

The plurality of phase change patterns 160 may include a chalcogenide material such as Ge—Sb—Te (GST). The plurality of lower intermediate electrode patterns LIE may include metal, metal nitride, carbon-based conductive material, or combinations thereof. For example, the plurality of lower intermediate electrode patterns LIE may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof.

For example, a phase change layer may be formed on the second insulating layer 120b, the third insulating layer 120c, the plurality of spacer patterns SP, and the plurality of lower electrode patterns BE, and then the plurality of phase change patterns 160 may be formed by polishing and/or etching the phase change layer such that an upper end of each of the plurality of the phase change patterns 160 is lower than the upper surface of the second insulating layer 120b and the upper surface of the third insulating layer 120c. Further, a lower intermediate electrode layer may be formed on the second insulating layer 120b, the third insulating layer 120c and the plurality of phase change patterns 160, and then the plurality of lower intermediate electrode patterns LIE may be formed by polishing and/or etching the lower intermediate electrode layer such that the upper surface of the second insulating layer 120b and the upper surface of the third insulating layer 120c are exposed.

In FIGS. 4A to 4C, it is illustrated that the fourth insulating layer 120d is formed before forming the plurality of phase change patterns 160 and the plurality of lower intermediate electrode patterns LIE, but according to another example embodiment, the fourth insulating layer 120d may be formed after forming the plurality of phase change patterns 160 and the plurality of lower intermediate electrode patterns LIE. For example, an etch mask (not shown) having a shape of a plurality of lines may be formed to extend in parallel in the first direction (the X direction) on the second insulating layer 120b, the third insulating layer 120c, and the plurality of lower intermediate electrode patterns LIE, and then the plurality of third recesses Rc may be formed to extend in plural in the first direction (the X direction) and to expose the first insulating layer 120a, by etching the second insulating layer 120b, the plurality of lower electrode layer patterns BE, the plurality of spacer patterns SP, the third insulating layer 120c, the plurality of phase change patterns 160, and the plurality of lower intermediate electrode patterns LIE using the etch mask. Then, the fourth insulating layer 120d may be formed in the plurality of third recesses Rc. For example, the fourth insulating layer 120d may be formed on the second insulating layer 120b, the plurality of lower electrode patterns BE, the plurality of spacer patterns SP, the third insulating layer 120c, the plurality of phase change patterns 160, and the plurality of lower intermediate electrode pattern LIE, and then the fourth insulating layer 120d may be polished and/or etched so that the upper surface of the second insulating layer 120b and the upper surface of the third insulating layer 120c and an upper surface of each of the plurality of lower intermediate electrode patterns LIE are exposed.

Figure 7A:
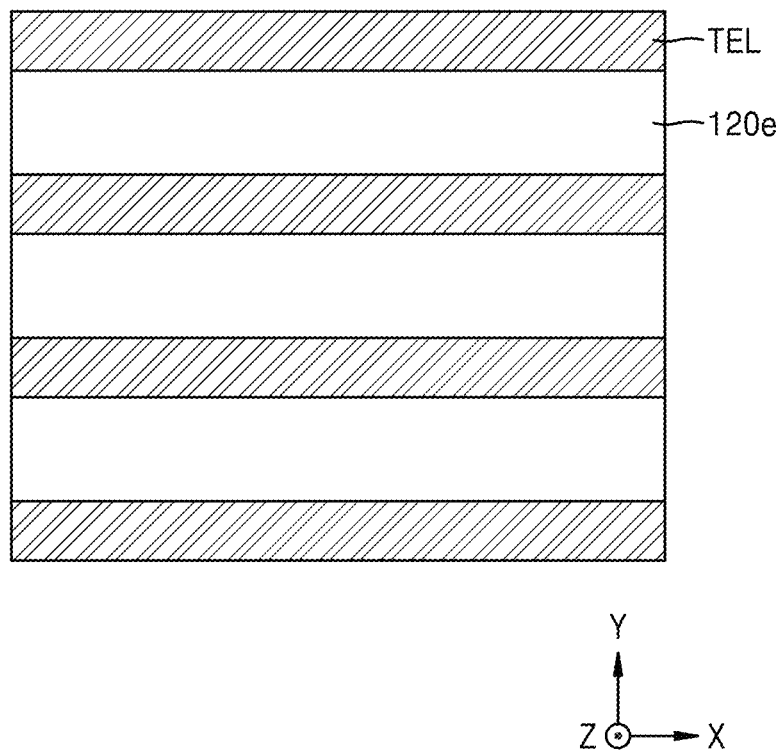
Figure 7B:
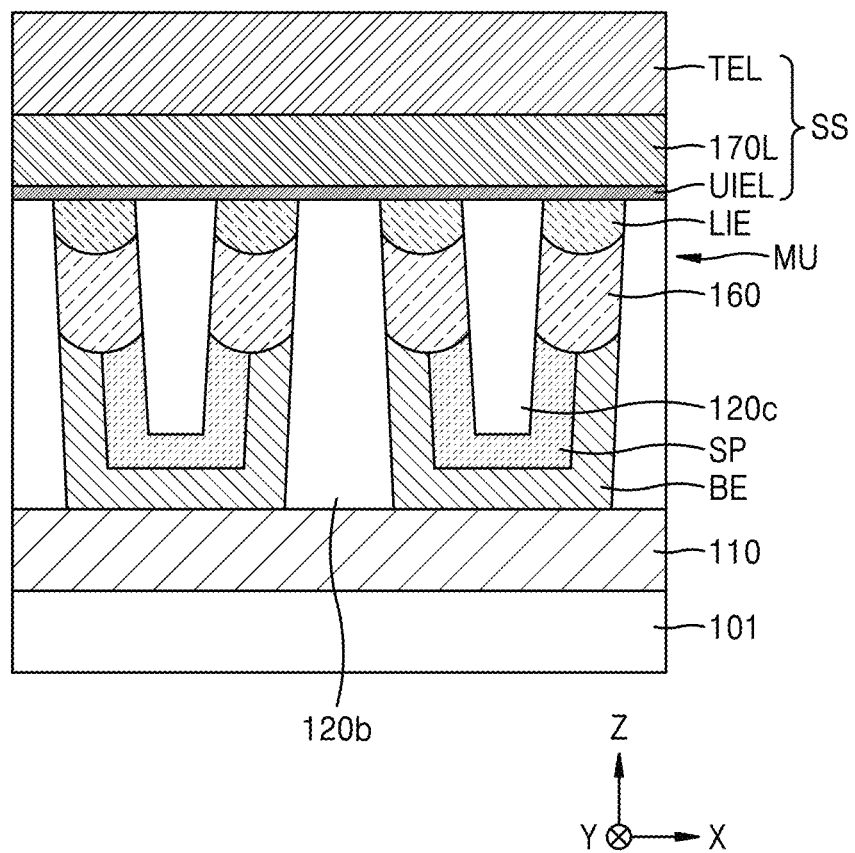
Figure 7C:
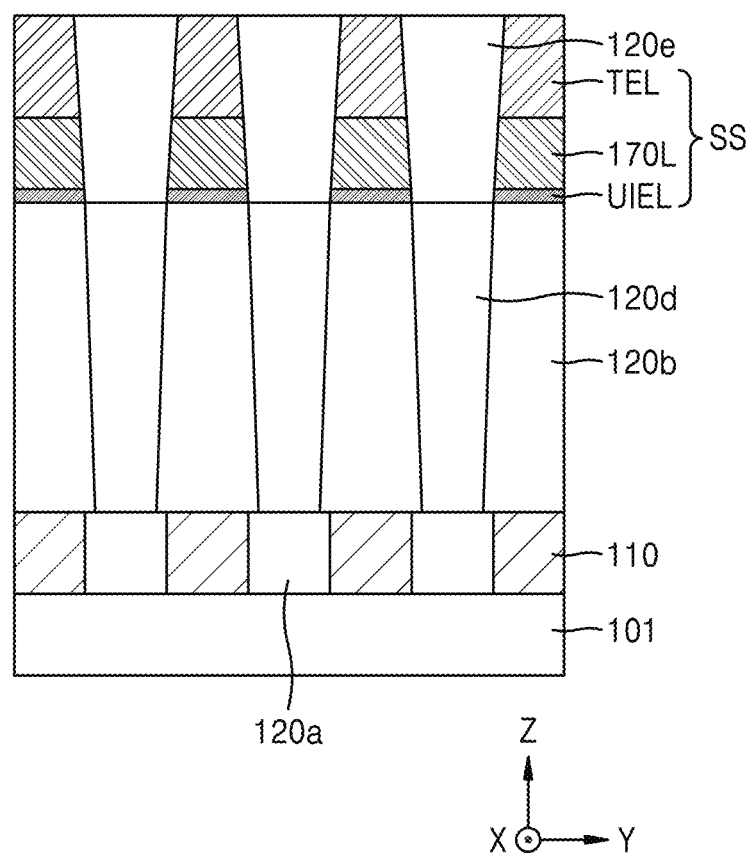

Referring to FIGS. 7A to 7C, a switch stack SS may be formed on the plurality of memory units MU, the second insulating layer 120b, and the third insulating layer 120c. The switch stack SS may include an upper intermediate electrode layer UIEL, a switch layer 170L, and an upper electrode layer TEL. The switch stack SS may have a shape of a plurality of lines extending in parallel in the first direction (the X direction).

In some example embodiments, the switch stack SS may be formed using the etch technique. That is, a fifth insulating layer 120e may be formed after the switch stack SS is formed. For example, individual layers (now shown) for forming the switch stack SS may be formed on the second insulating layer 120b, the third insulating layer 120c, the fourth insulating layer 120d, and the plurality of memory units MU. An etch mask (not shown) having a shape of a plurality of lines extending in parallel in the first direction (the X direction) may be formed on the individual layer for forming the switch stack SS, and then the stacked layers for forming the switch stack SS may be etched to form the switch stack SS by using the etch mask. Hereafter, the fifth insulating material (not shown) may be formed on the switch stack SS and the fourth insulating layer 120d, and then the fifth insulating material may be polished and/or etched to form the fifth insulating layer 120e such that an upper surface of the switch stack SS is exposed.

In another example embodiment, the switch stack SS may be formed using the damascene technique. That is, the fifth insulating layer 120e may be formed first, and then the switch stack SS may be formed in the fifth insulating layer 120e. For example, the fifth insulating layer 120e may be first formed on the second insulating layer 120b, the third insulating layer 120c, the fourth insulating layer 120d, and the plurality of memory units MU, and then a plurality of recesses may be formed to extend in parallel in the first direction (the X direction) in the fifth insulating layer 120e and expose the second insulating layer 120b, the third insulating layer 120c and the plurality of memory units MU. Thereafter, the upper intermediate electrode layer UIEL, the switch layer 170L, and the upper electrode layer TEL may be formed in the plurality of recesses in the fifth insulating layer 120e. For example, the upper intermediate electrode layer UIEL may be formed on the second insulating layer 120b, the third insulating layer 120c, the plurality of memory units MU, and the fifth insulating layer 120e, and then the upper intermediate electrode layer UIEL may be polished and/or etched so that an upper end of the upper intermediate electrode layer UIEL is lower than an upper surface of the fifth insulating layer 120e. Next, the switch layer 170L may be formed on the upper intermediate electrode layer UIEL and the fifth insulating layer 120e, and then the switch layer 170L may be polished and/or etched so that an upper end of the switch layer 170L is lower than the upper surface of the fifth insulating layer 120e. Next, the upper electrode layer TEL may be formed on the switch layer 170L and the fifth insulating layer 120e, and then the upper electrode layer TEL may be polished and/or etched so that the upper surface of the fifth insulating layer 120e is exposed.

The upper intermediate electrode layer UIEL may include metal, metal nitride, carbon-based conductive material, or combinations thereof. For example, the upper intermediate electrode layer UIEL may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof. The switch layer 170L may include chalcogenide switching material. For example, the switch layer 170L may include an ovonic threshold switching (OTS) material. The upper electrode layer TEL may include metal, metal nitride, carbon-based conductive material, or combinations thereof. For example, the upper electrode layer TEL may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof. The fifth insulating layer 120e may include silicon oxide, silicon nitride, or a combination thereof.

Figure 8A:
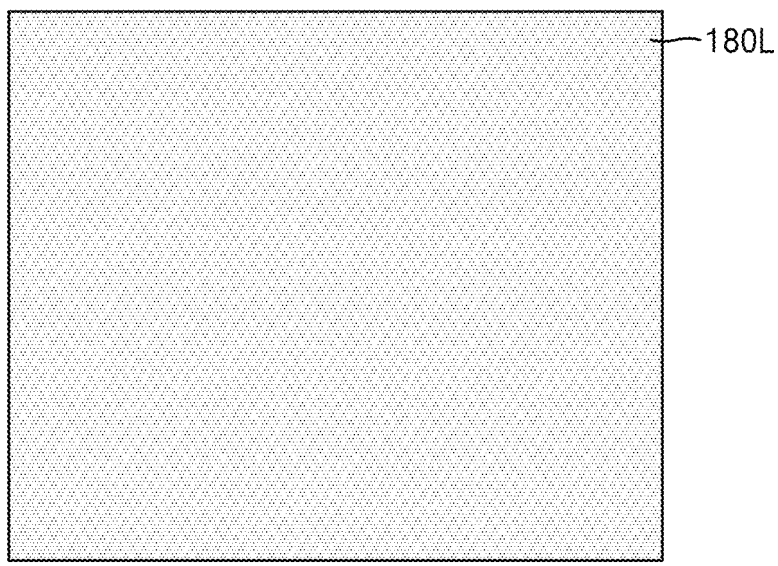
Figure 8B:
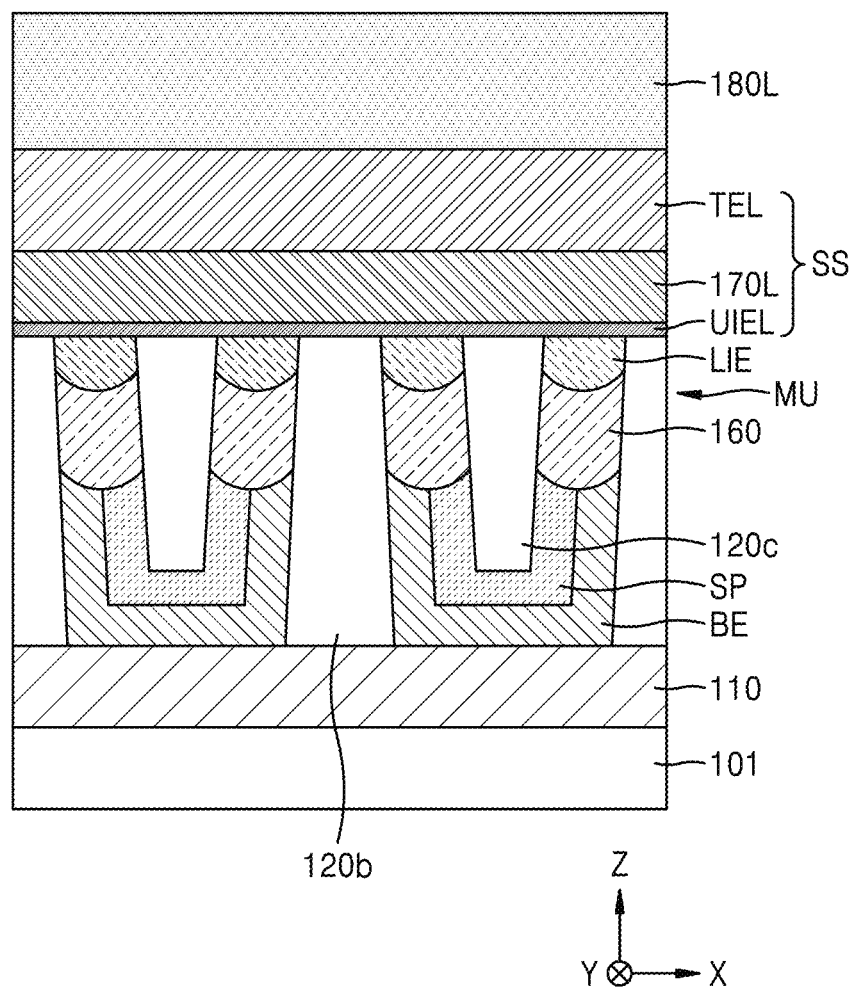
Figure 8C:
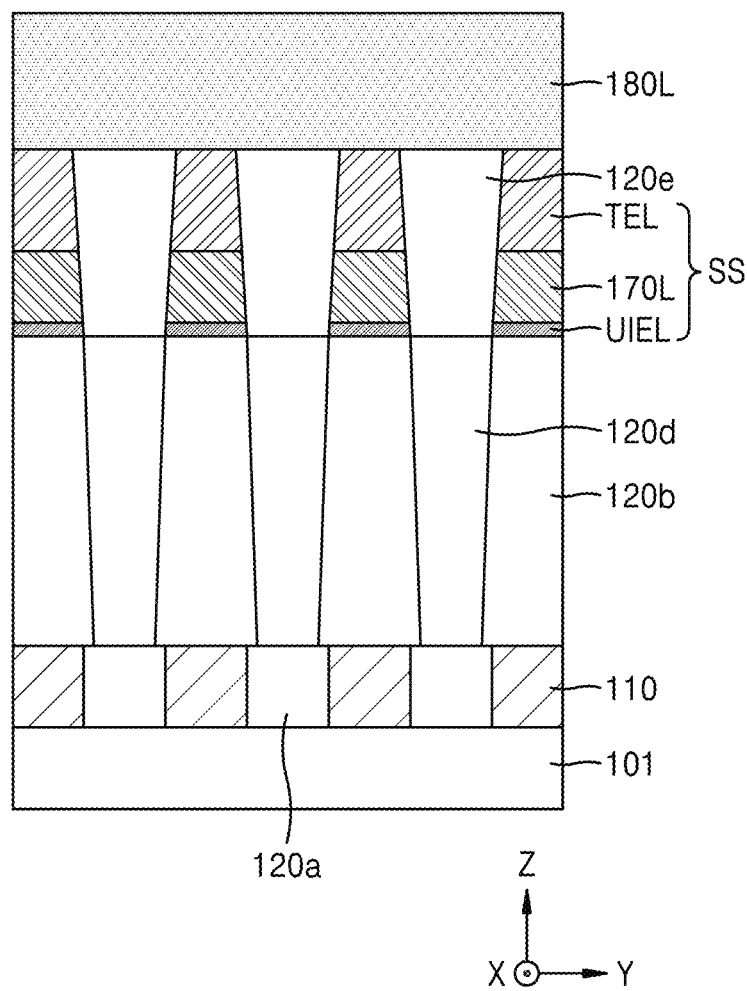

Referring to FIGS. 8A to 8C, an upper conductive layer 180L may be formed on the switch stack SS and the fifth insulating layer 120e. The upper conductive layer 180L may include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, or combinations thereof.

Figure 9A:
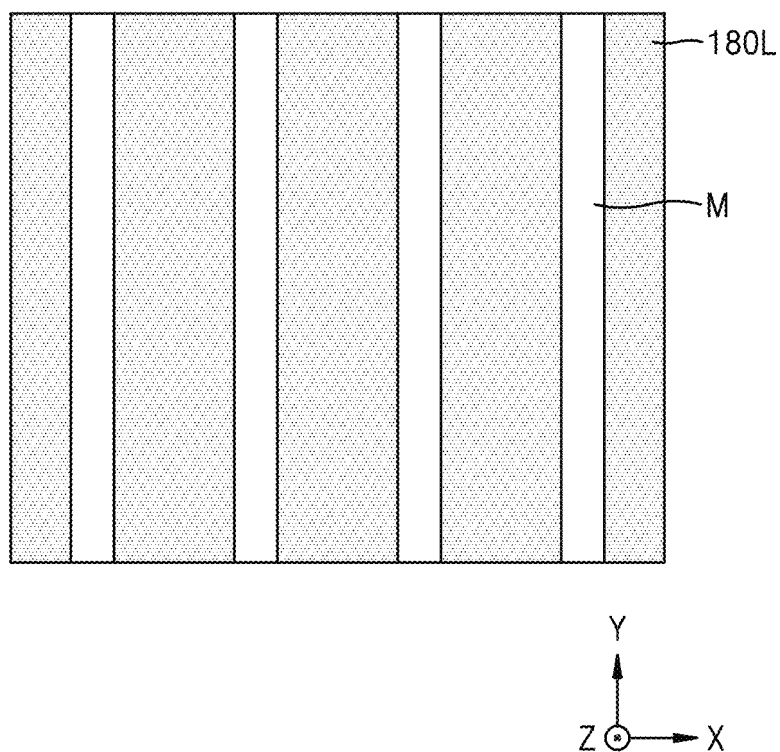
Figure 9B:
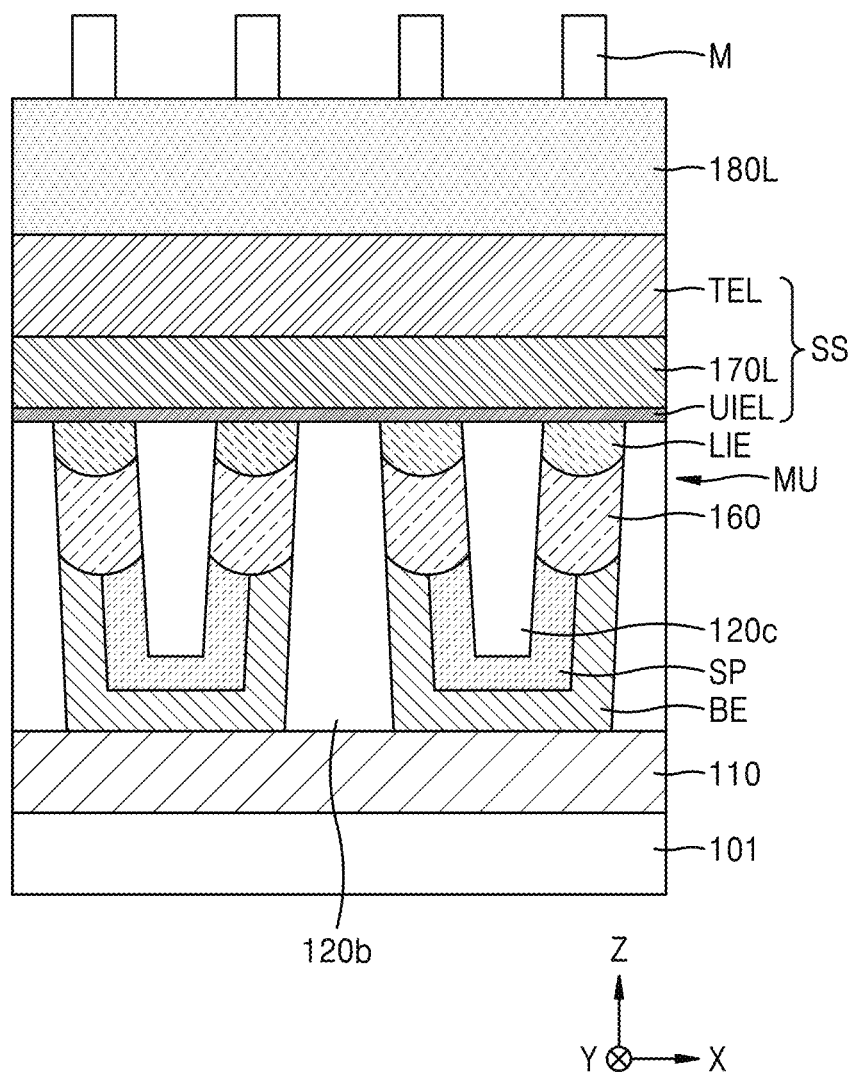
Figure 9C:
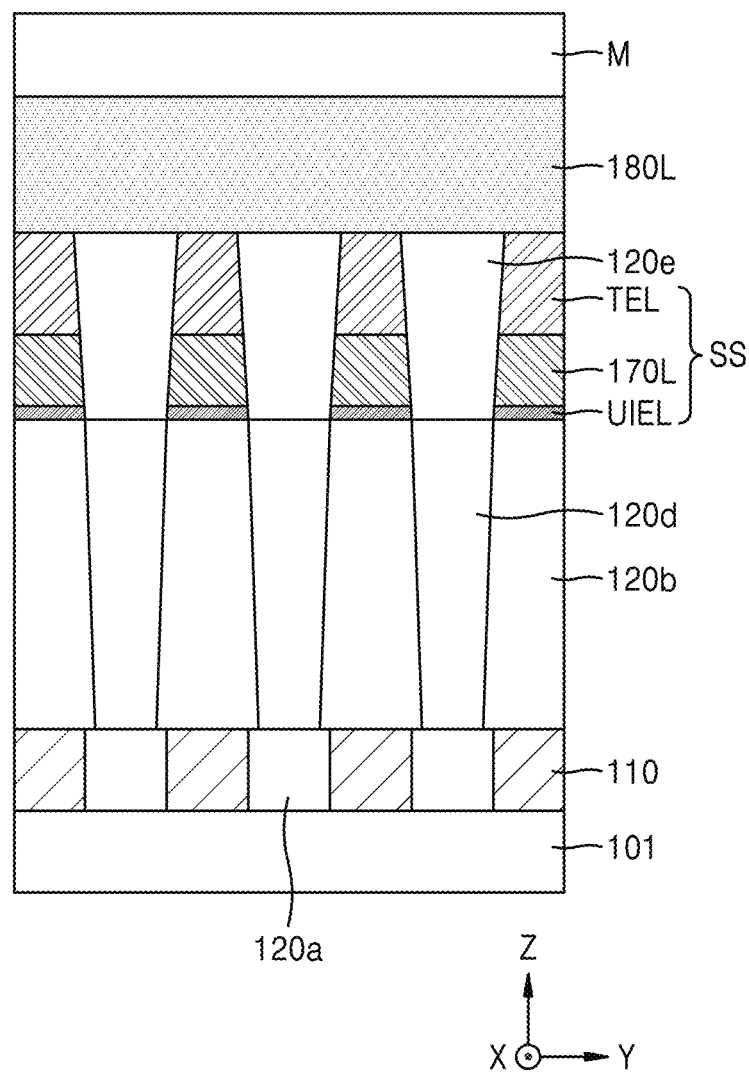

Referring to FIGS. 9A to 9C, an etch mask M may be formed on the upper conductive layer 180L. The etch mask M may be formed in a shape of a plurality of lines extending in parallel in the second direction (the Y direction).

Figure 10A:
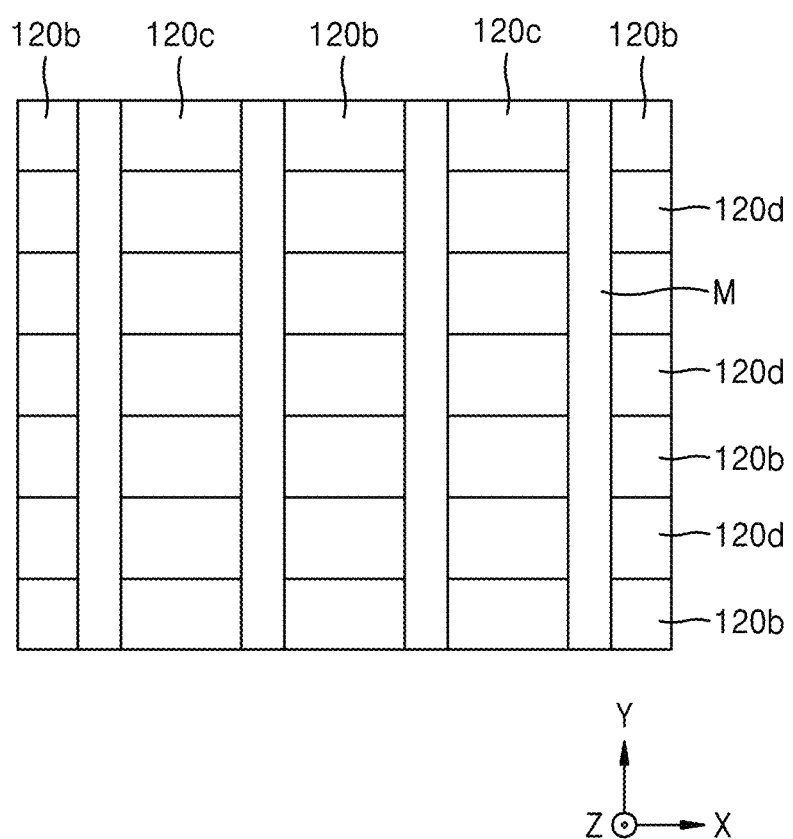
Figure 10B:
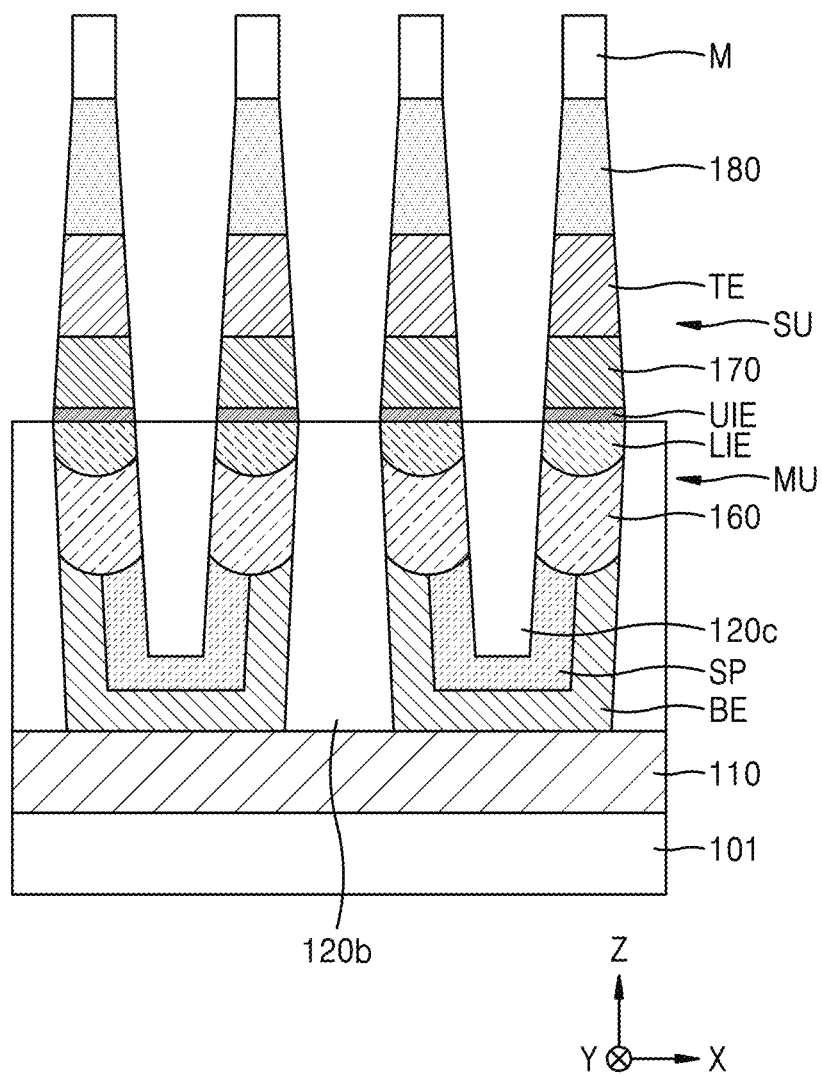
Figure 10C:
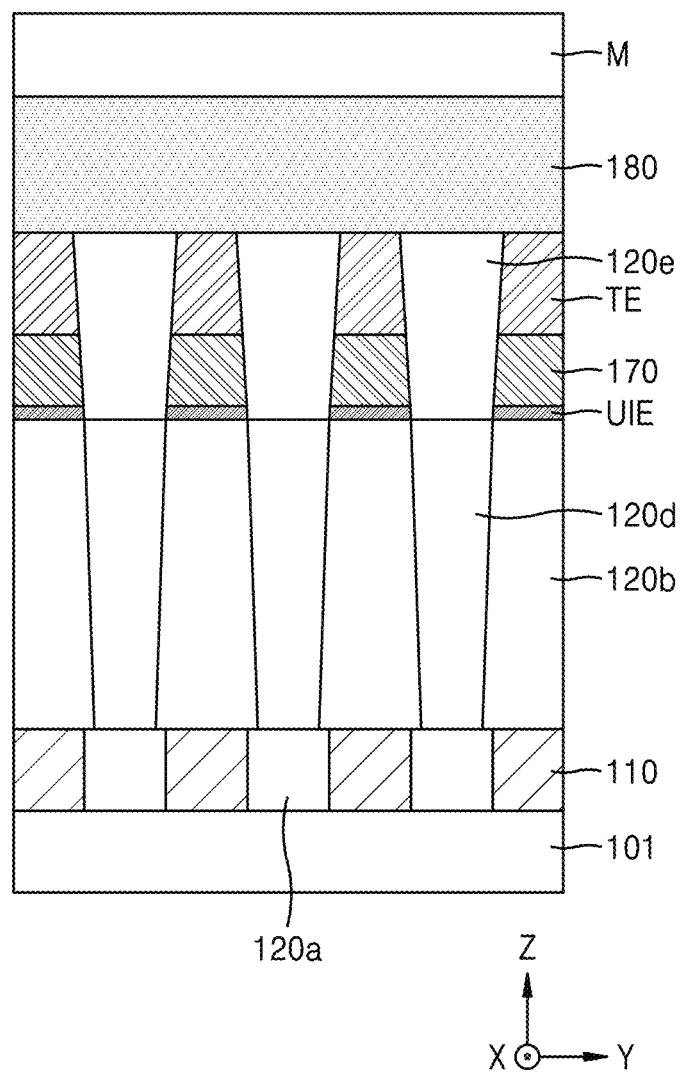

Referring to FIGS. 10A to 10C, a plurality of upper conductive lines 180 and a plurality of switch units SU may be formed by etching the upper conductive layer 180L and the switch stack SS (see FIGS. 9A to 9C) using the etch mask M. The upper conductive lines 180 may each extend in parallel in the second direction (the Y direction). The plurality of switch units SU may be formed in a shape of a plurality of columns spaced apart from each other in the first direction (the X direction) and the second direction (the Y direction) and each extending in the third direction (the Z direction). Each of the plurality of upper conductive lines 180 may correspond to the bit line or the word line of PRAM.

Figure 11A:
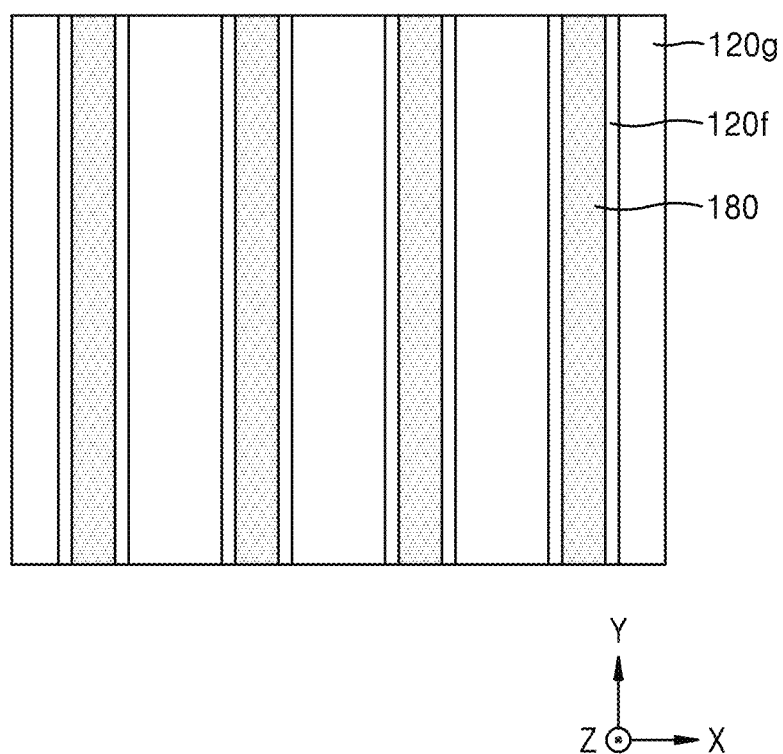
Figure 11B:
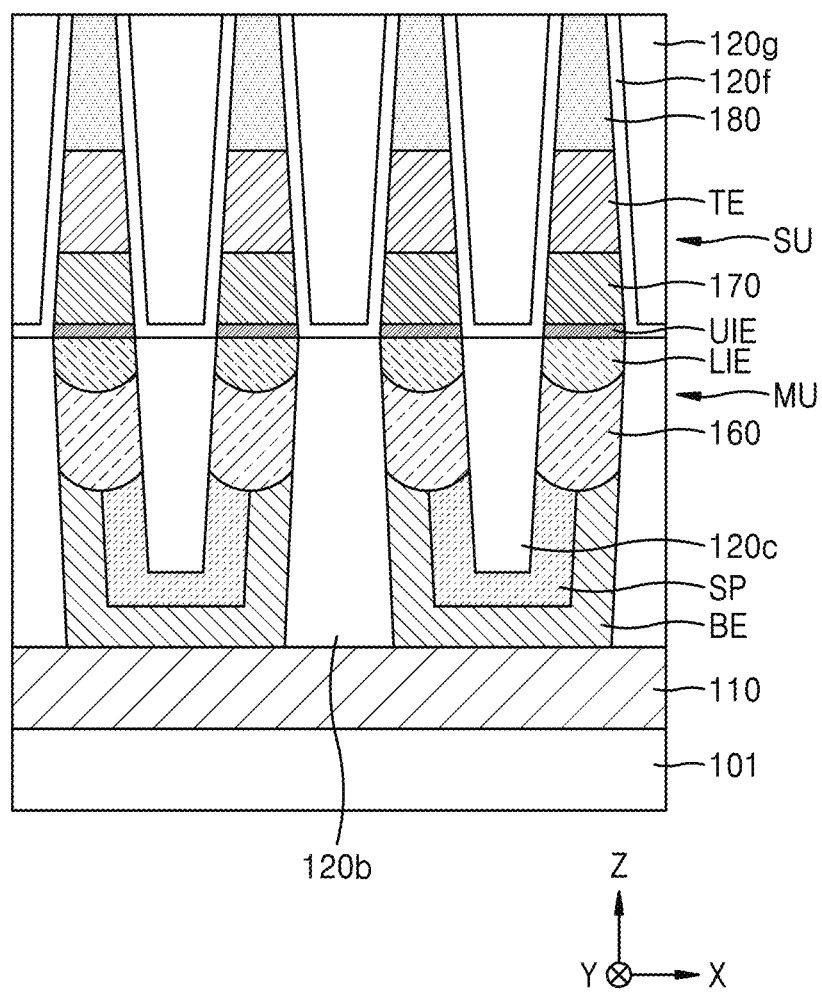
Figure 11C:
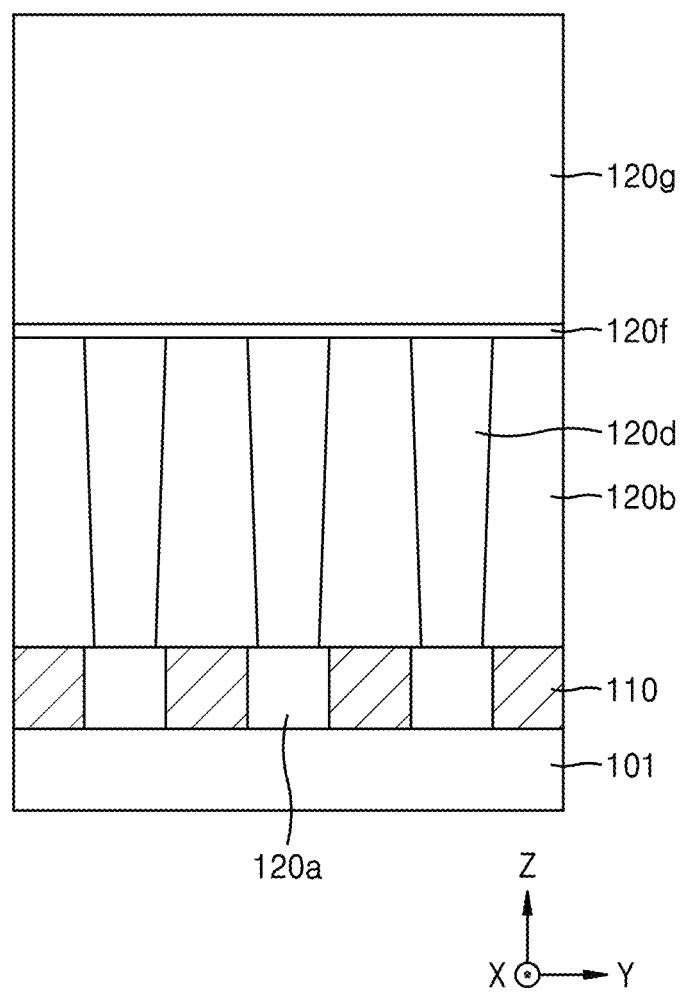

Referring to FIGS. 11A to 11C, a sixth insulating layer 120f and a seventh insulating layer 120g may be formed on the plurality of switch units SU, the plurality of upper conductive lines 180, the second insulating layer 120b, and the third insulating layer 120c, and then the sixth insulating layer 120f and the seventh insulating layer 120g may be polished and/or etched so that an upper surfaces of the plurality of upper conductive lines 180 are exposed. The sixth insulating layer 120f and the seventh insulating layer 120g may include silicon oxide, silicon nitride, or a combination thereof.

According to the method of manufacturing the memory device shown in FIGS. 1 to 11C, the upper conductive layer 180L and the switch stack SS (see FIGS. 9A to 9C) may be etched by using the etch mask M (see FIGS. 9A to 9C). Thus, misalignment between the plurality of upper conductive lines 180 and the plurality of switch units SU may be mitigated or prevented. Thus, a highly integrated phase change memory device may be manufactured.

FIGS. 12A to 15A are plan views for explaining a method of manufacturing a memory device according to an example embodiment of the inventive concepts, FIGS. 12B to 15B are front views for explaining the method of manufacturing the memory device according to the example embodiment of the inventive concepts, and FIGS. 12C to 15C are side views for explaining the method of manufacturing the memory device according to the example embodiment of the inventive concepts. According to the method of manufacturing the memory device of the inventive concepts shown in FIGS. 12A to 15C, the plurality of upper conductive lines 180 (see FIGS. 15A to 15C) may be formed using the damascene technique.

Figure 12A:
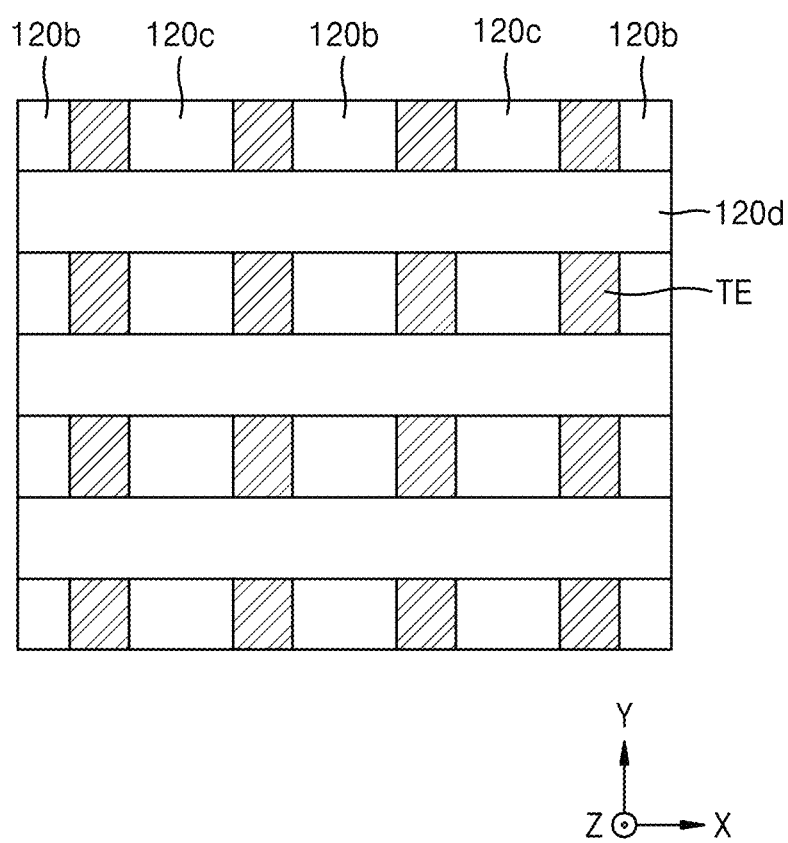
Figure 12B:
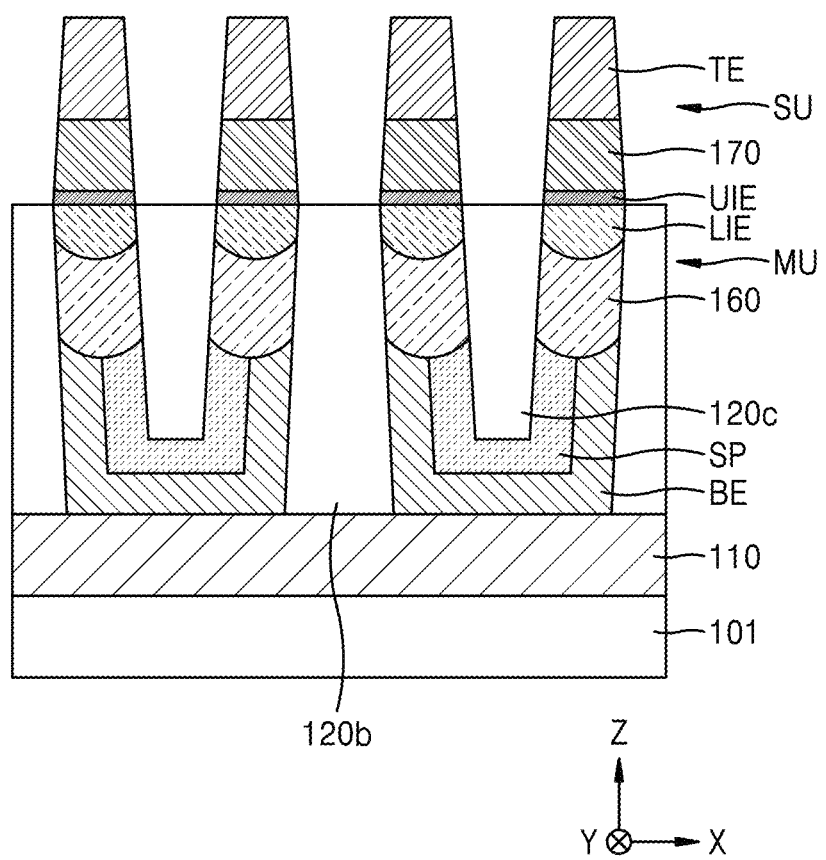
Figure 12C:
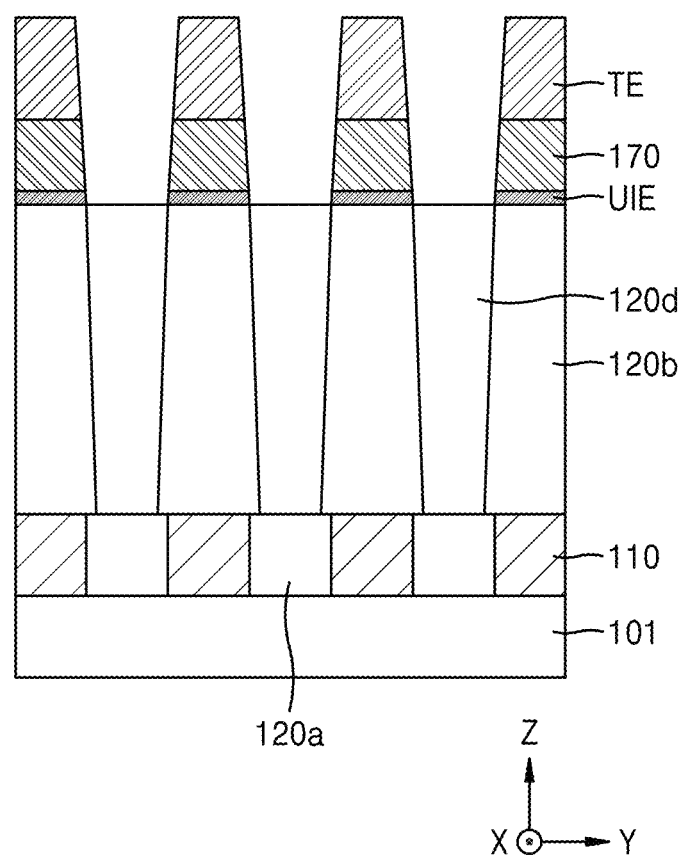

Referring to FIGS. 12A to 12C, the plurality of lower conductive lines 110, the first insulating layer 120a, the second insulating layer 120b, the third insulating layer 120c, the fourth insulating layer 120d, and the plurality of memory units MU may be formed as described with reference to FIGS. 1A to 6C.

Next, the plurality of switch units SU may be formed on the plurality of memory units MU. The plurality of switch units SU may be formed using the etch technique. That is, after the plurality of switch units SU are formed, and thereafter an eighth insulating layer 120h and a ninth insulating layer 120i (see FIGS. 13A to 13C) surrounding side walls of the plurality of switch units SU may be formed. For example, the upper intermediate electrode layer, the switch layer, and the upper electrode layer may be formed on the second insulating layer 120b, the third insulating layer 120c, the fourth insulating layer 120d, and the plurality of memory units MU. Thereafter, the upper intermediate electrode layer, the switch layer, and the upper electrode layer may be etched to form the plurality of switch units SU in the form of a plurality of columns, the plurality of switch units SU extending in the third direction (the Z direction) and spaced apart from each other in the first direction (the X direction) and the second direction (the Y direction).

Figure 13A:
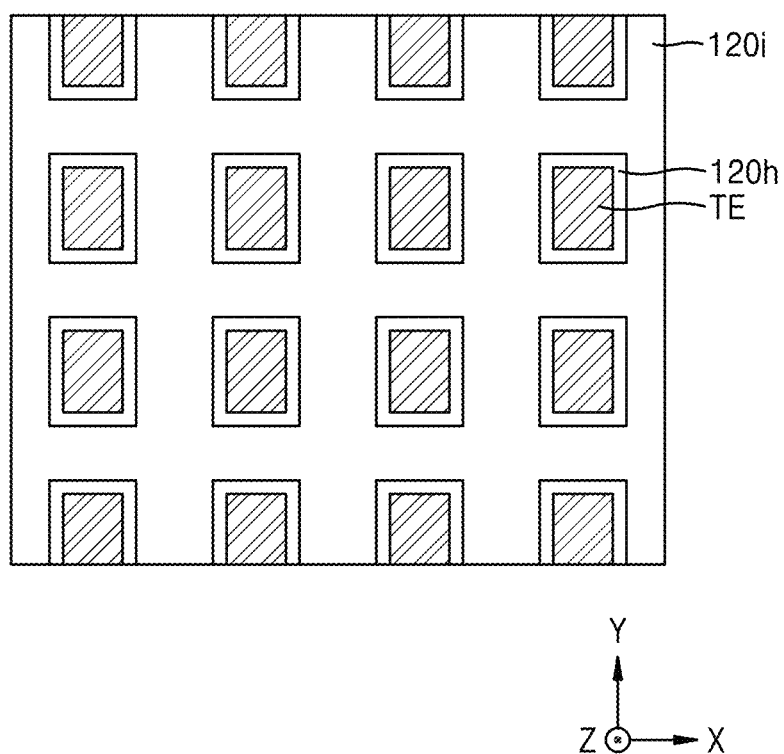
Figure 13B:
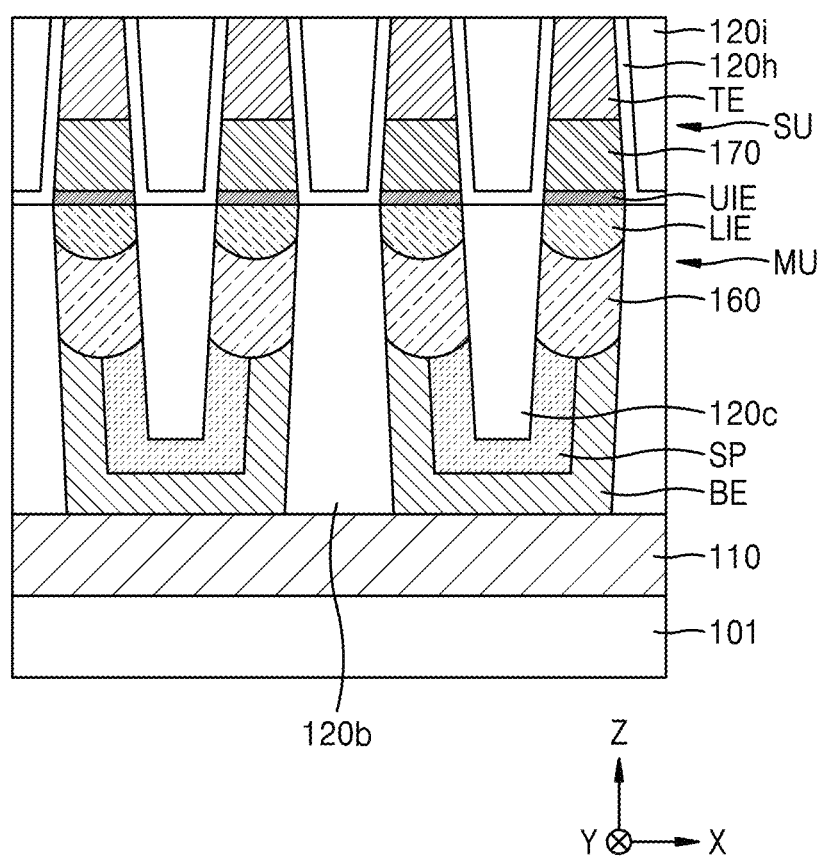
Figure 13C:
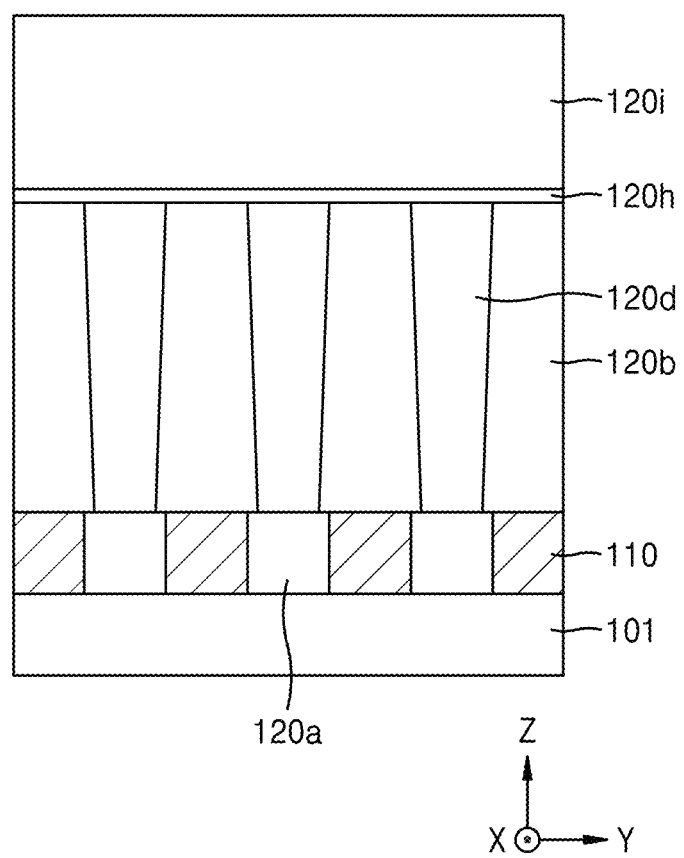

Referring to FIGS. 13A to 13C, the eighth insulating layer 120h and the ninth insulating layer 120i may be formed on the second insulating layer 120b, the third insulating layer 120c, the fourth insulating layer 120d, and the plurality of switch units SU. Thereafter, the eighth insulating layer 120h and the ninth insulating layer 120i may be polished and/or etched so that an upper surface of each of the plurality of switch units SU is exposed. The eighth insulating layer 120h and the ninth insulating layer 120i may include silicon oxide, silicon nitride, or a combination thereof.

Figure 14A:
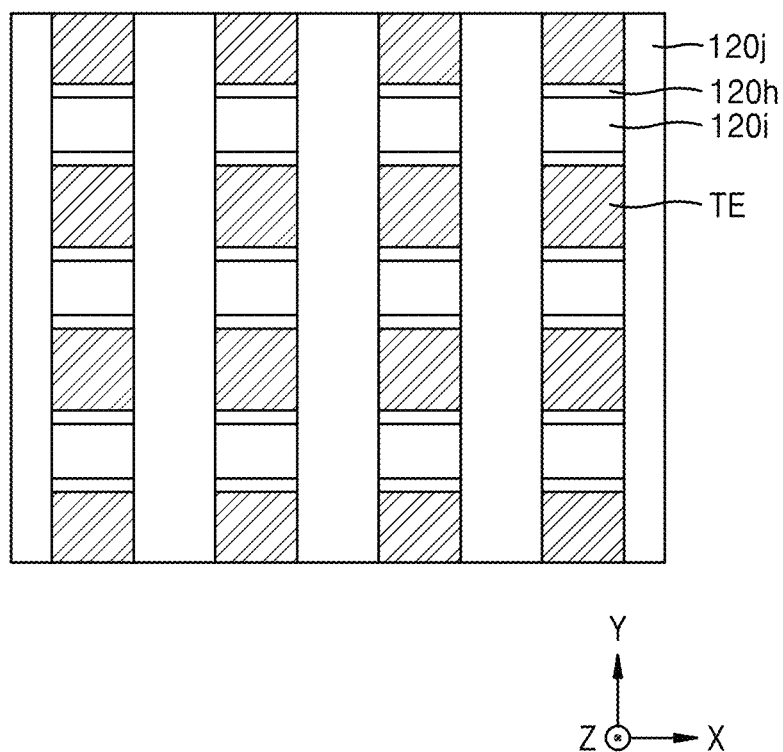
Figure 14B:
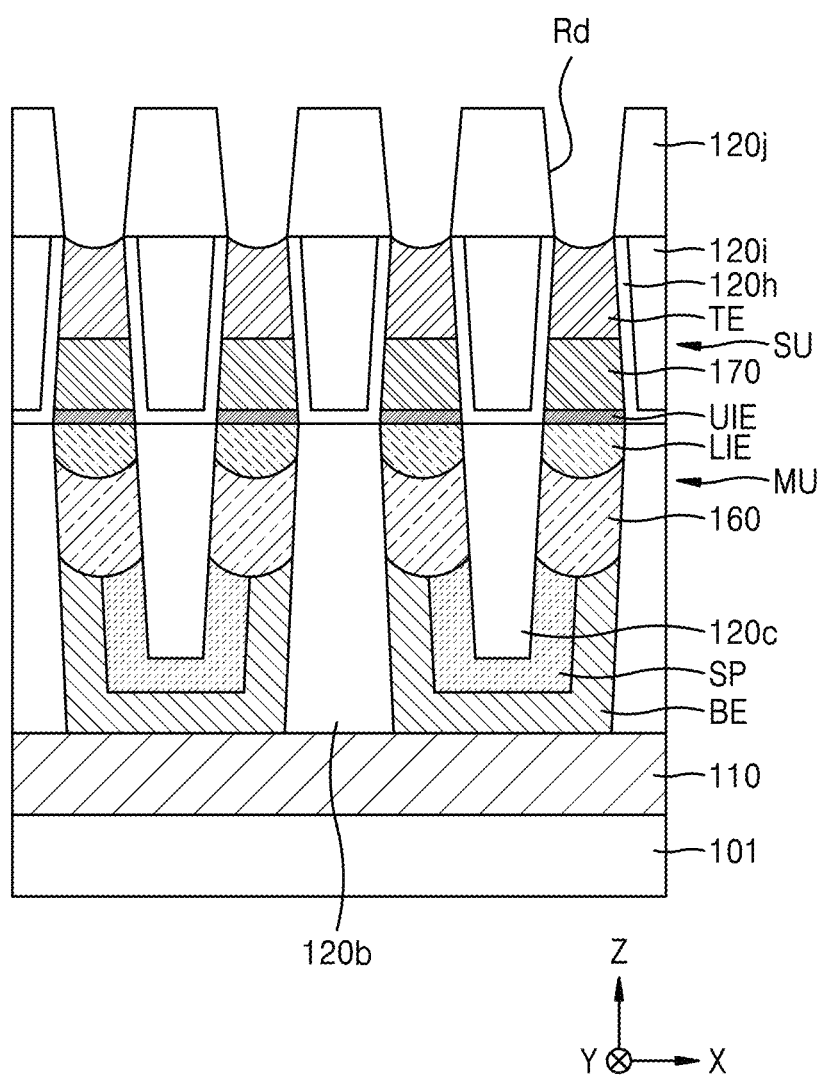
Figure 14C:
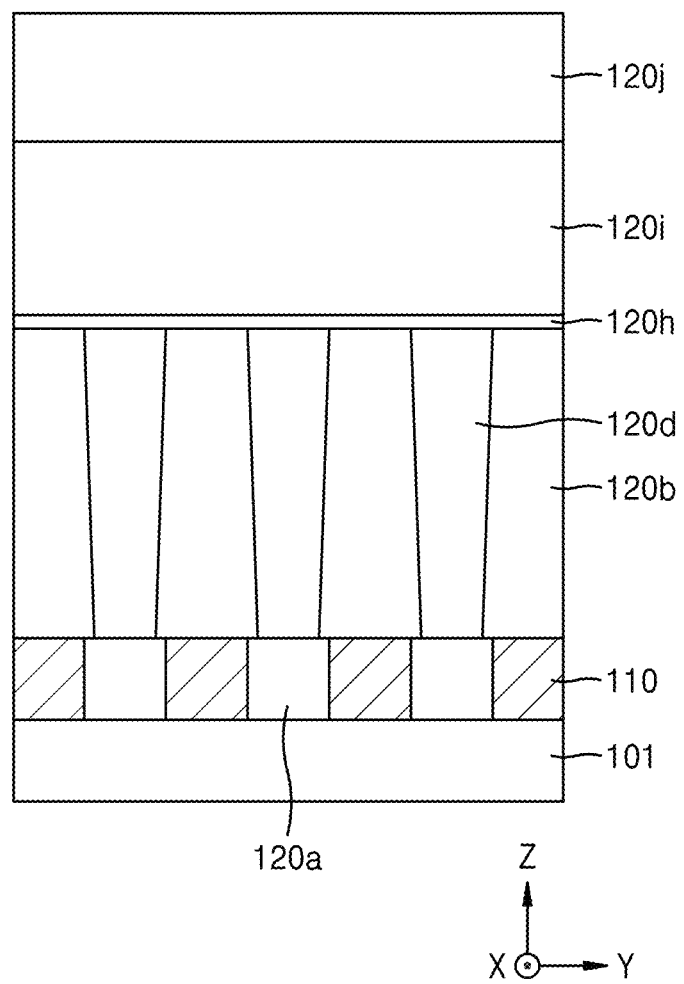

Referring to FIGS. 14A to 14C, a tenth insulating layer 120j including a plurality of fourth recesses Rd may be formed. The plurality of fourth recesses Rd may each extend in parallel in the second direction (the Y direction) and expose the plurality of switch units SU. That is, the tenth insulating layer 120j may be patterned into a plurality of lines extending in parallel in the second direction (the Y direction). For example, the tenth insulating layer 120j may be formed on the eighth insulating layer 120h, the ninth insulating layer 120i, and the plurality of switch units SU, and then the tenth insulating layer 120j may be etched to form the plurality of fourth recesses Rd in the tenth insulating layer 120j. The tenth insulating layer 120j may include silicon oxide, silicon nitride, or a combination thereof.

Figure 15A:
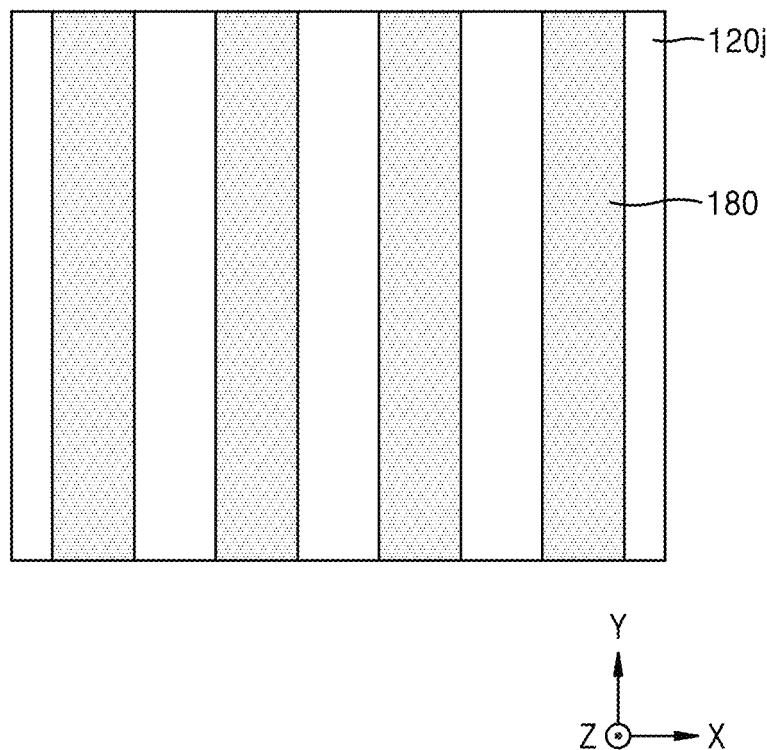
Figure 15B:
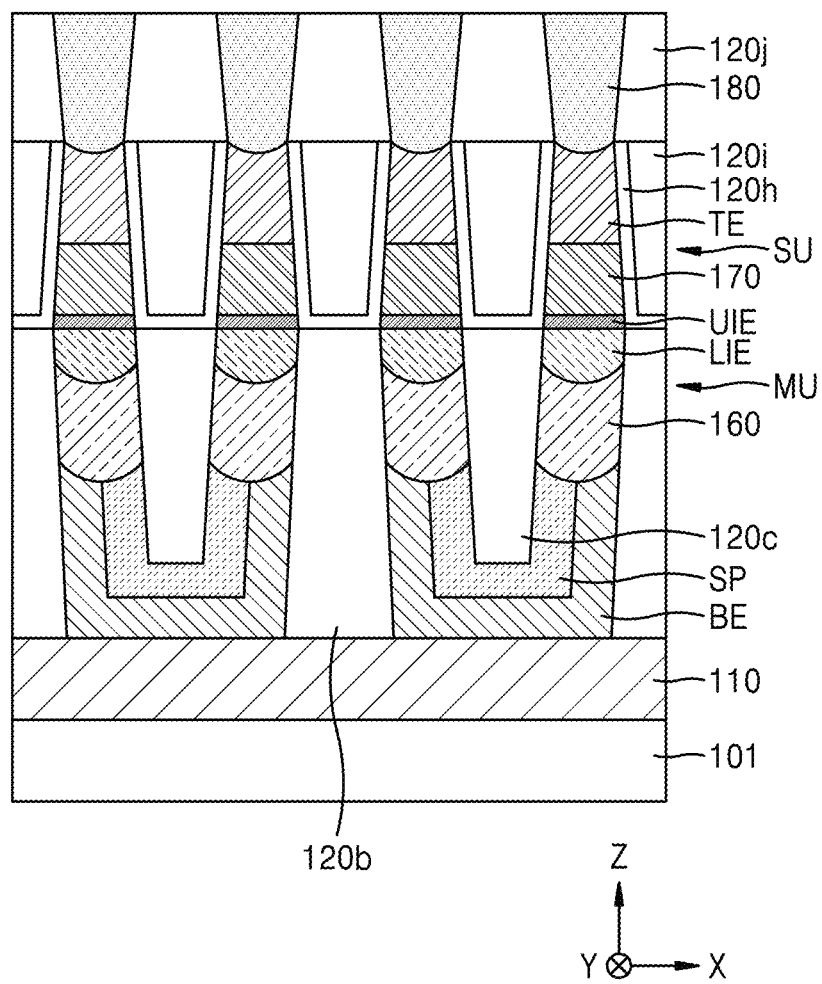
Figure 15C:
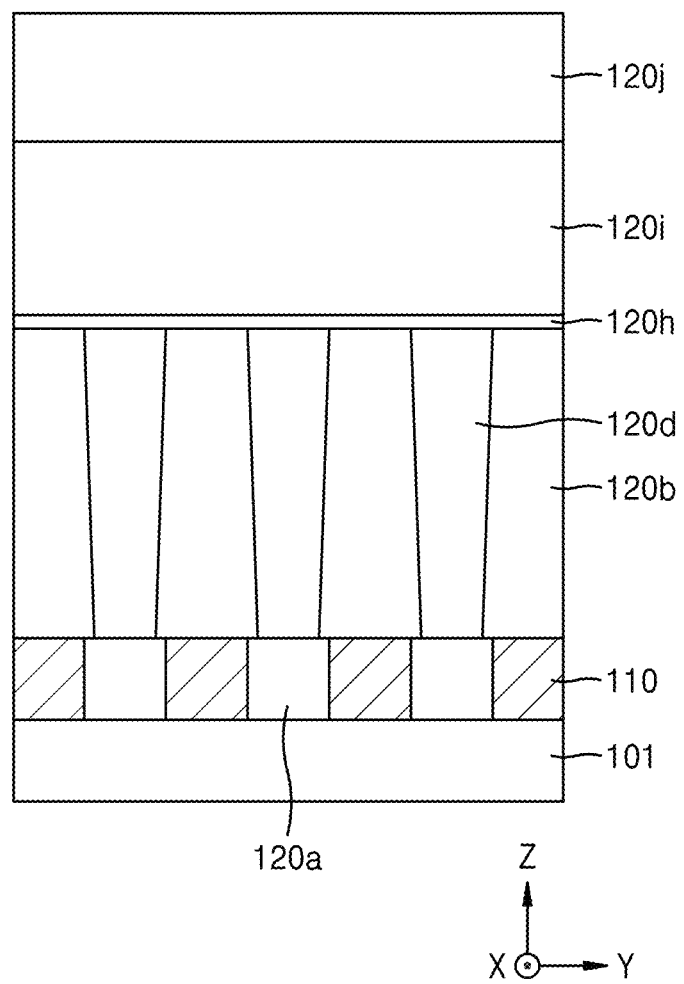

Referring to FIGS. 15A to 15C, the plurality of upper conductive lines 180 may be formed in the plurality of fourth recesses Rd in the tenth insulating layer 120j. The plurality of upper conductive lines 180 may be formed using the damascene technique. That is, the plurality of upper conductive lines 180 may be formed after the tenth insulating layer 120j is formed. For example, the upper conductive layer may be formed on the tenth insulating layer 120j, and then the upper conductive layer may be polished and/or etched to form the upper conductive lines 180 so that an upper surface of the tenth insulating layer 120j is exposed.

According to the method of manufacturing the memory device described with reference to FIGS. 12A to 15C, the plurality of upper conductive lines 180 may be manufactured using the damascene technique. Thus, even if an aspect ratio of each of the plurality of upper conductive lines 180 becomes large, it may be possible to mitigate or prevent some or all of the plurality of upper conductive lines 180 from collapsing or breaking, wherein the aspect ratio is a ratio of a height in the third direction (the Z direction) of each of the plurality of upper conductive lines 180 with respect to a width in the first direction (the X direction) of each of the plurality of upper conductive lines 180. Thus, a highly integrated phase change memory device may be manufactured.

FIGS. 16A to 18A are plan views for explaining a method of manufacturing a memory device according to an example embodiment of the inventive concepts, FIGS. 16B to 18B are front views for explaining the method of manufacturing the memory device according to the example embodiment of the inventive concepts, and FIGS. 16C to 18C are side views for explaining the method of manufacturing the memory device according to the example embodiment of the inventive concepts. According to the method of manufacturing the memory device of the inventive concepts shown in FIGS. 16A to 18C, the plurality of upper conductive lines 180 and the plurality of switch units SU (see FIGS. 18A to 18C) may be formed in the damascene type.

Figure 16A:
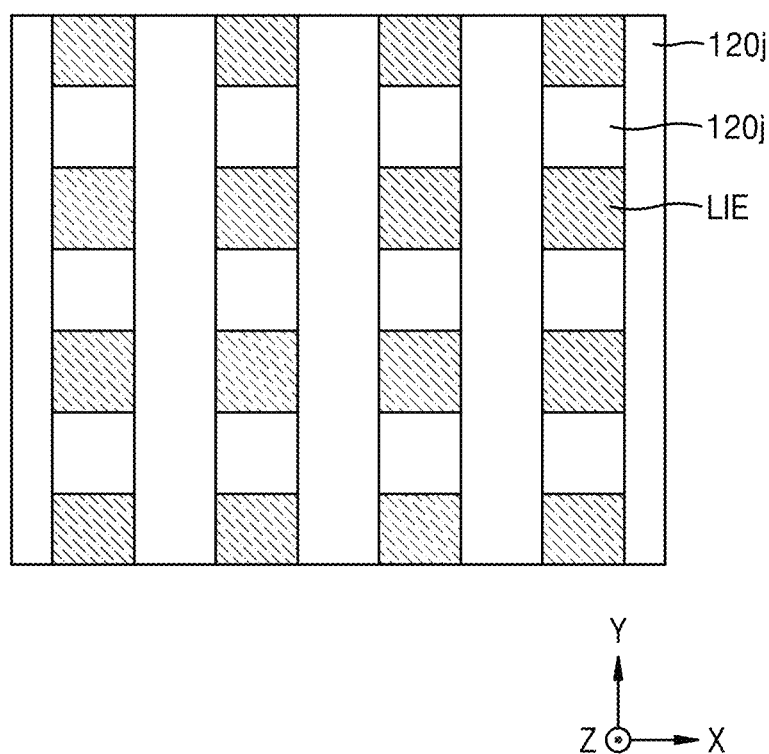
Figure 16B:
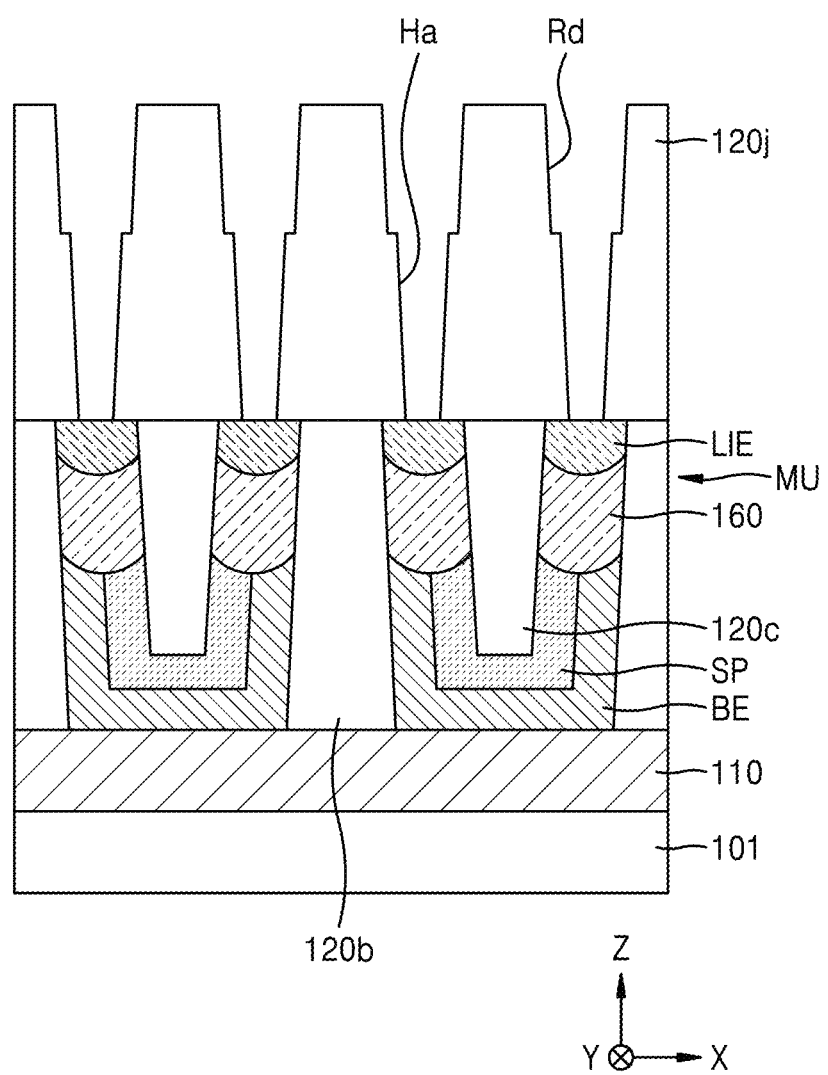
Figure 16C:
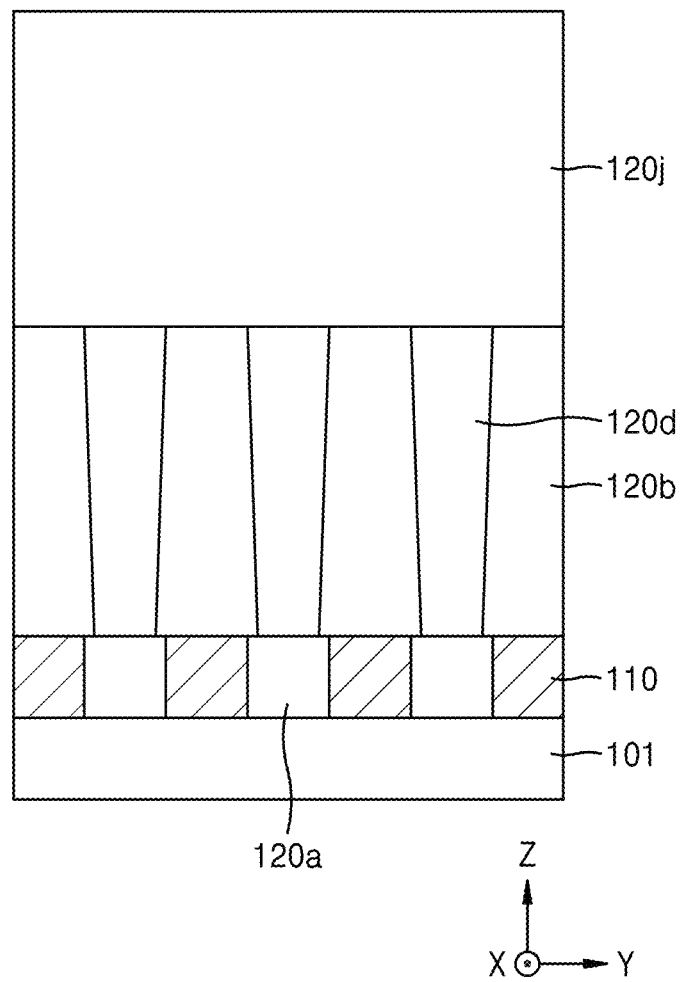

Referring to FIGS. 16A to 16C, the plurality of lower conductive lines 110, the first insulating layer 120a, the second insulating layer 120b, the third insulating layer 120c, the fourth insulating layer 120d, and the plurality of memory units MU may be formed as described with reference to FIGS. 1A to 6C.

Next, the tenth insulating layer 120*j* may be formed on the second insulating layer 120*b*, the third insulating layer 120*c*, and the fourth insulating layer 120*d*. The tenth insulating layer 120*j* may include a plurality of fourth recesses Rd each extending in parallel in the second direction (the Y direction) and a plurality of first holes Ha connected to the plurality of fourth recesses Rd below the plurality of fourth recesses Rd and exposing the plurality of memory units MU. The plurality of first holes Ha may be spaced apart from each other in the first direction (the X direction) and the second direction (the Y direction) and each extend in the third direction (the Z direction). For example, the tenth insulating layer 120*j* may be formed on the second insulating layer 120*b*, the third insulating layer 120*c*, the fourth insulating layer 120*d*, and the plurality of memory units MU, and then the plurality of fourth recesses Rd and the plurality of first holes Ha may be formed in the tenth insulating layer 120*j*. In some example embodiments, the plurality of fourth recesses Rd may be formed in the tenth insulating layer 120*j*, and then the plurality of first holes Ha may be formed in the tenth insulating layer 120*j*. In another example embodiment, the plurality of first holes Ha may be formed in the tenth insulating layer 120*j*, and then the plurality of fourth recesses Rd may be formed in the tenth insulating layer 120*j*.

Figure 17A:
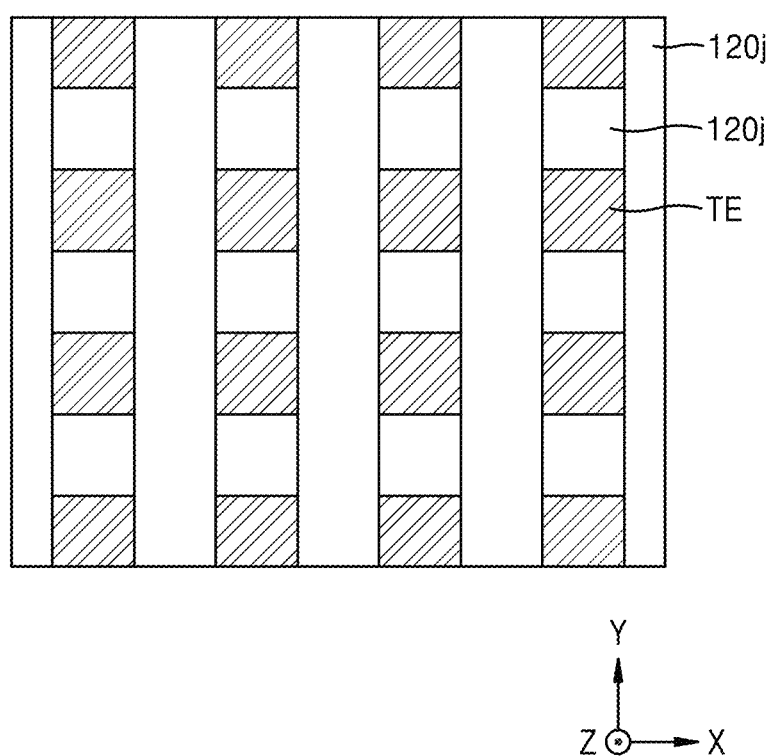
Figure 17B:
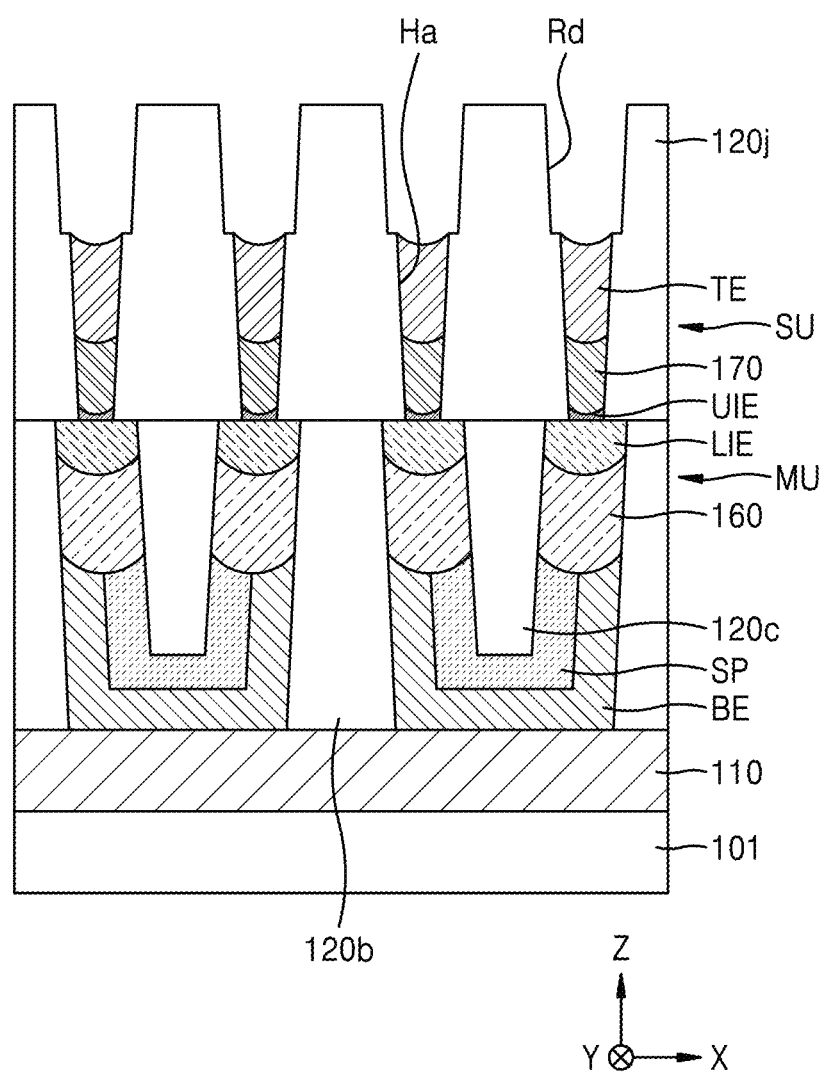
Figure 17C:
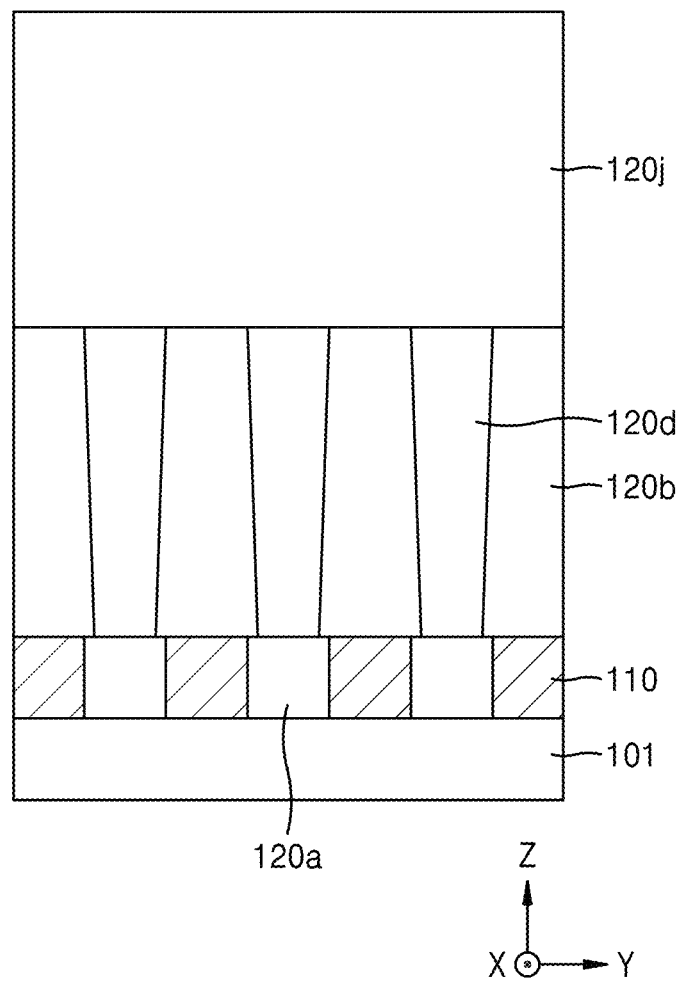

Referring to FIGS. 17A to 17C, the plurality of switch units SU may be formed in the plurality of first holes Ha in the tenth insulating layer 120*j*. For example, an upper intermediate electrode layer (not shown) may be formed on the tenth insulating layer 120*j* and the plurality of memory units MU, and then the plurality of upper intermediate electrode patterns UIE may be formed by polishing and/or etching the upper intermediate electrode layer so that an upper end of the upper intermediate electrode layer is lower than a bottom of each of the plurality of fourth recesses Rd. Next, a switch layer (not shown) may be formed on the tenth insulating layer 120*j* and the plurality of upper intermediate electrode patterns UIE, and then the plurality of switch patterns 170 may be formed by polishing and/or etching the switch layer so that an upper end of the switch layer is lower than a bottom of each of the plurality of fourth recesses Rd. Further, an upper electrode layer may be formed on the tenth insulating layer 120*j* and the plurality of switch patterns 170, and then the plurality of upper electrode patterns TE may be formed by polishing and/or etching the upper electrode layer so that a bottom of each of the plurality of fourth recesses Rd is exposed.

Figure 18A:
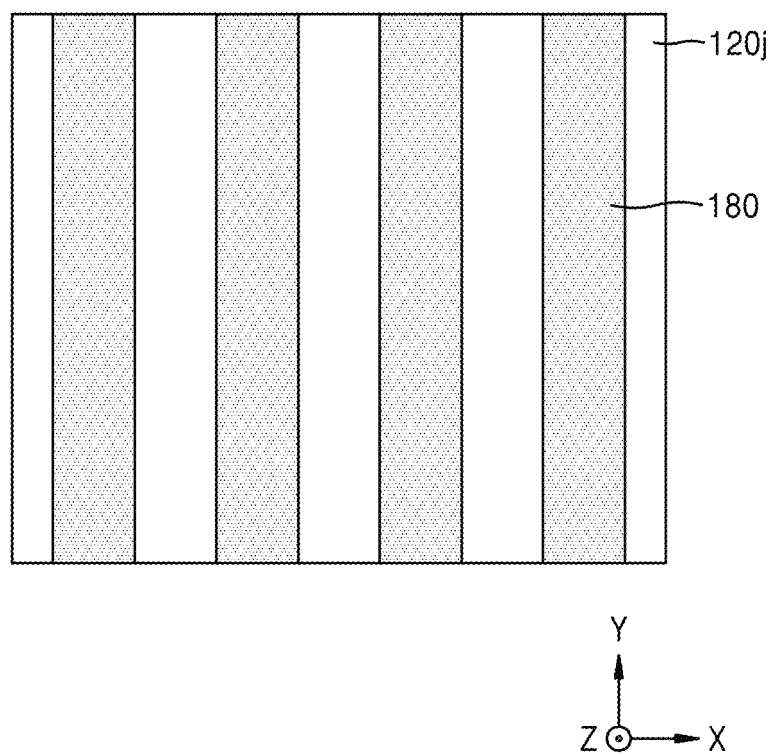
Figure 18B:
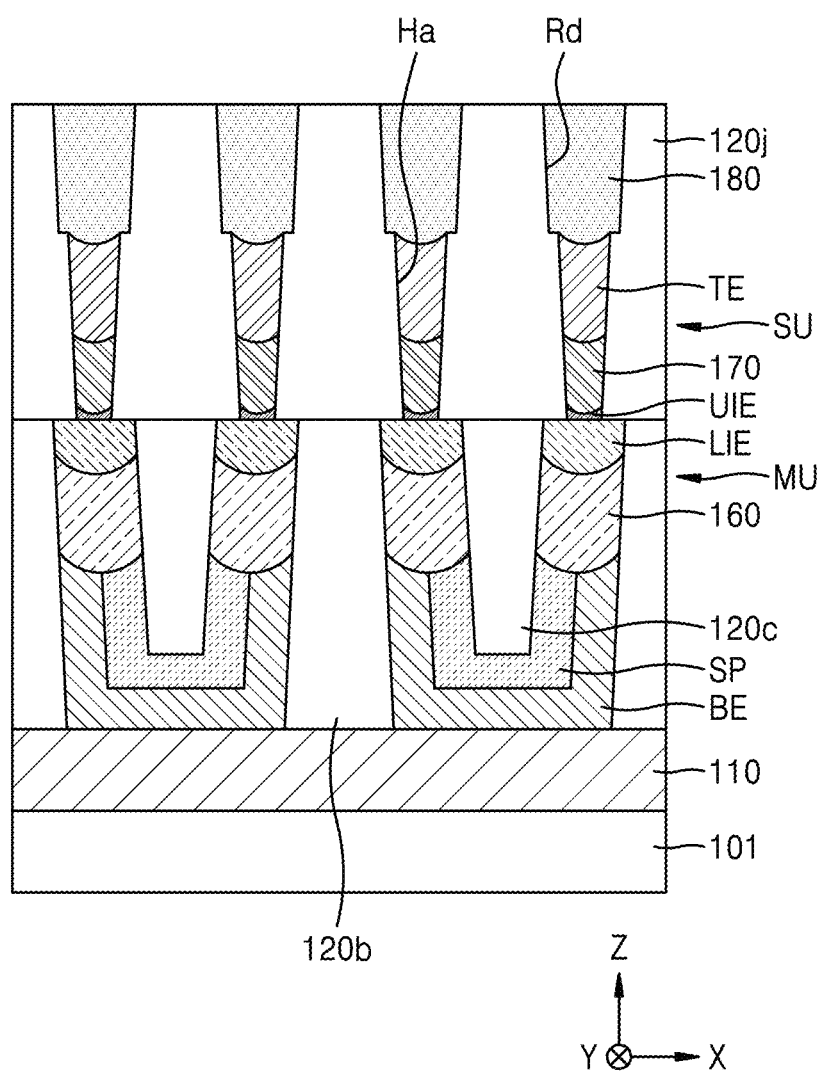
Figure 18C:
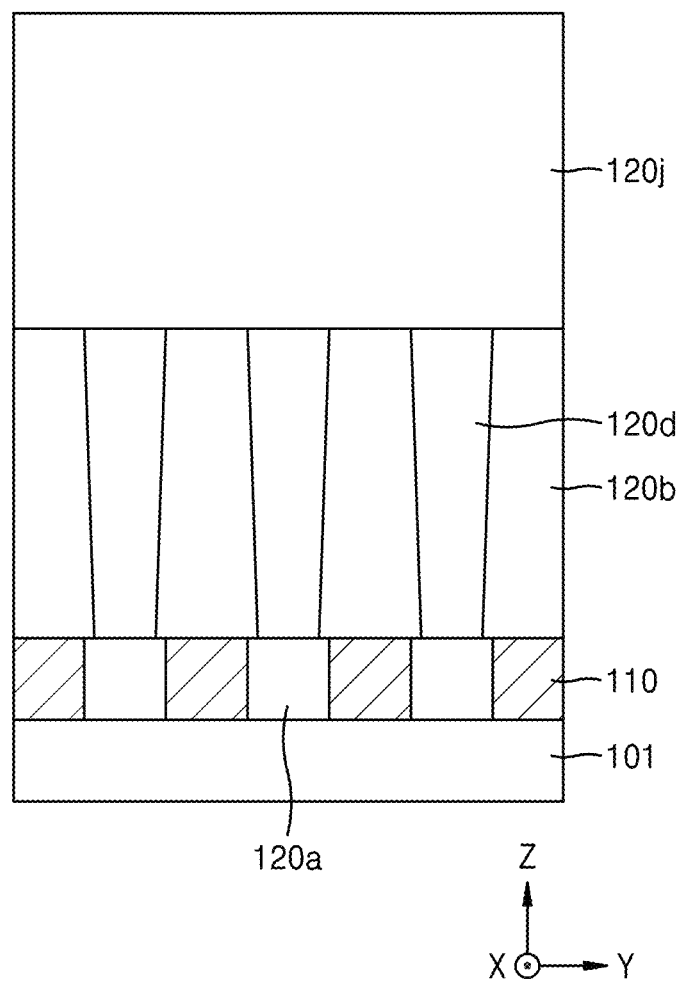

Referring to FIGS. 18A to 18C, the plurality of upper conductive lines 180 may be formed in the plurality of fourth recesses Rd in the tenth insulating layer 120*j*. For example, an upper conductive layer (not shown) may be formed on the tenth insulating layer 120*j* and the plurality of switch units SU, and then the plurality of upper conductive lines 180 may be formed by polishing and/or etching the upper conductive layer so that the upper surface of the tenth insulating layer 120*j* is exposed.

According to the method of manufacturing the memory device described with reference to FIGS. 16A to 18C, the plurality of switch units SU may be manufactured in the damascene type. That is, the tenth insulating layer 120*j* may be formed, and then the plurality of switch units SU may be formed in the plurality of first holes Ha in the tenth insulating layer 120*j*. Thus, even if an aspect ratio of each of the plurality of switch units SU becomes large, it may be possible to mitigate or prevent some or all of the plurality of switch units SU from collapsing or breaking, wherein the aspect ratio is a ratio of a height in the third direction (the Z direction) of each of the plurality of switch units SU with respect to a width in the first direction (the X direction) or in the second direction (the Y direction) of each of the plurality of switch units SU. Thus, a highly integrated phase change memory device may be manufactured.

FIGS. 19A to 21A are plan views for explaining a method of manufacturing a memory device according to an example embodiment of the inventive concepts, FIGS. 19B to 21B are front views for explaining the method of manufacturing the memory device according to the example embodiment of the inventive concepts, and FIGS. 19C to 21C are side views for explaining the method of manufacturing the memory device according to the example embodiment of the inventive concepts. According to the method of manufacturing the memory device of the inventive concepts shown in FIGS. 19A to 21C, the plurality of upper conductive lines 180 and the plurality of switch units SU (see FIGS. 21A to 21C) may be formed using the damascene technique.

Figure 19A:
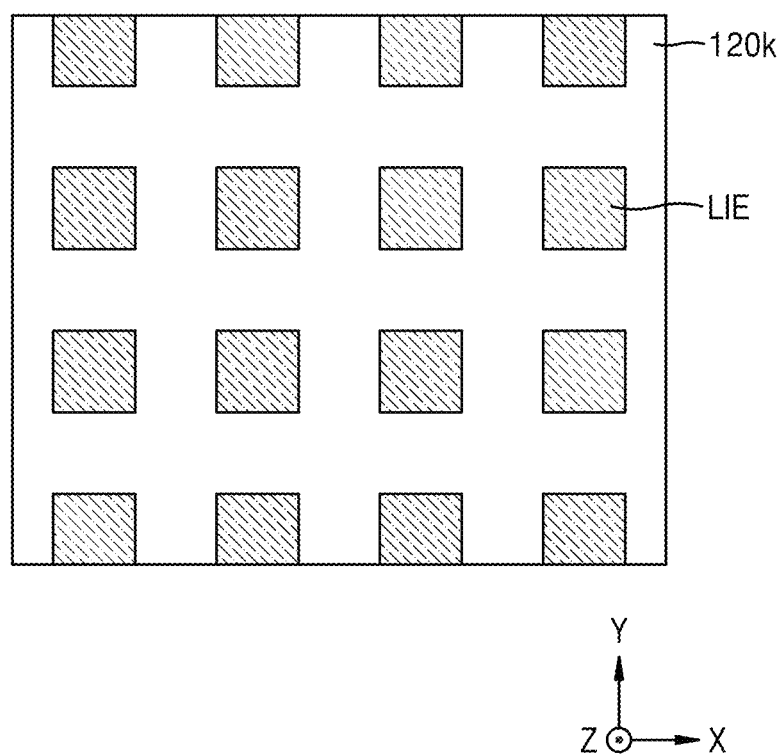
Figure 19B:
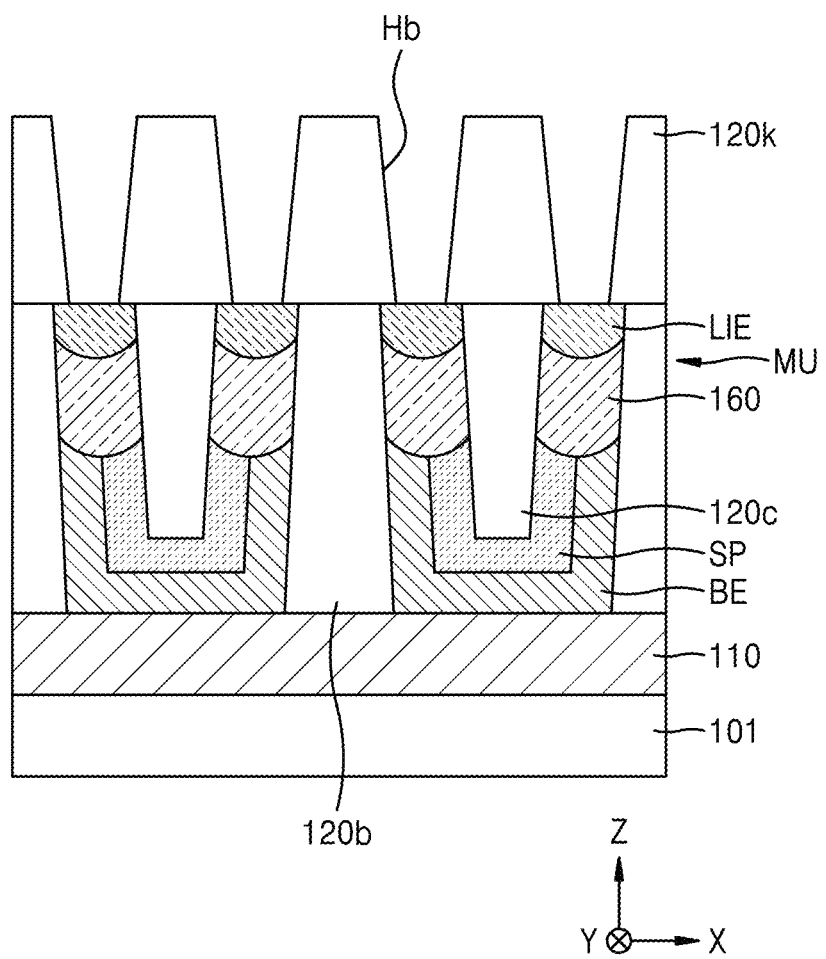
Figure 19C:
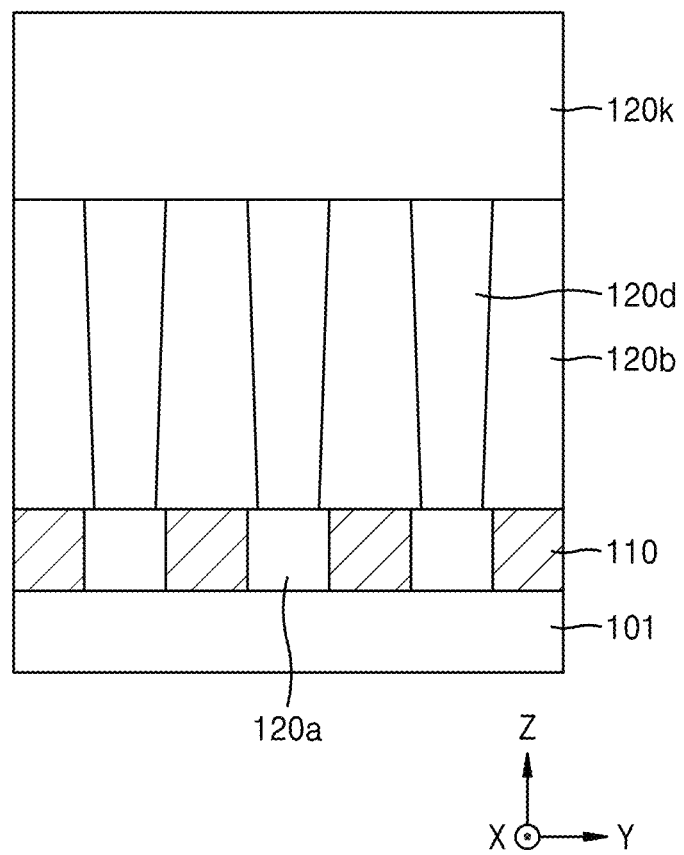

Referring to FIGS. 19A to 19C, the plurality of lower conductive lines 110, the first insulating layer 120*a*, the second insulating layer 120*b*, the third insulating layer 120*c*, the fourth insulating layer 120*d*, and the plurality of memory units MU may be first formed as described with reference to FIGS. 1A to 6C.

Next, an eleventh insulating layer 120*k* may be formed on the second insulating layer 120*b*, the third insulating layer 120*c*, and the fourth insulating layer 120*d*. The eleventh insulating layer 120*k* may include silicon oxide, silicon nitride, or a combination thereof. The eleventh insulating layer 120*k* may include a plurality of second holes Hb that expose the plurality of memory units MU and each extend in the third direction (the Z direction) while being spaced apart from each other in the first direction (X direction) and the second direction (Y direction). For example, the eleventh insulating layer 120*k* may be formed on the second insulating layer 120*b*, the third insulating layer 120*c*, the fourth insulating layer 120*d*, and the plurality of memory units MU, and then the eleventh insulating layer 120*k* may be etched so that the plurality of second holes Hb are formed in the eleventh insulating layer 120*k*.

Figure 20A:
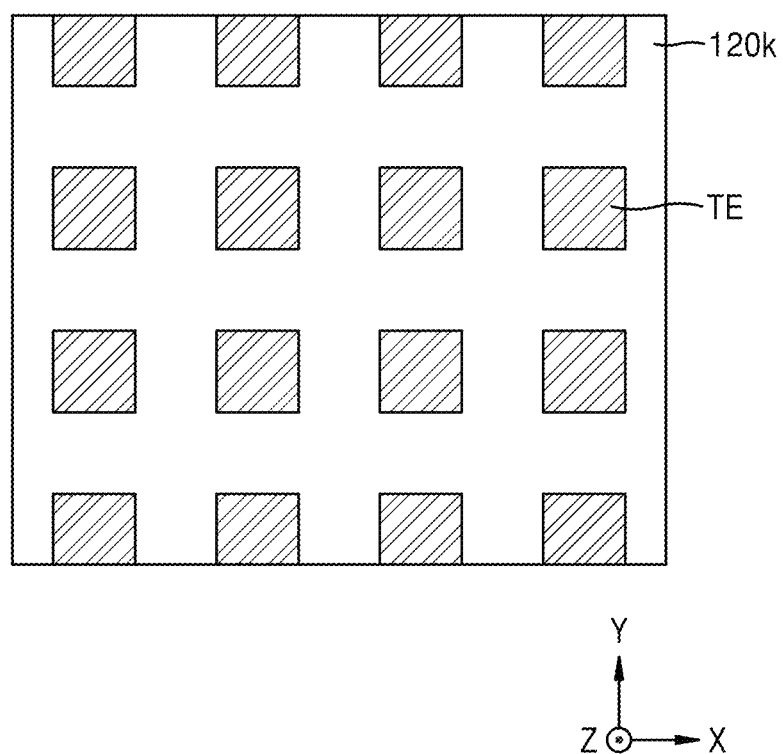
Figure 20B:
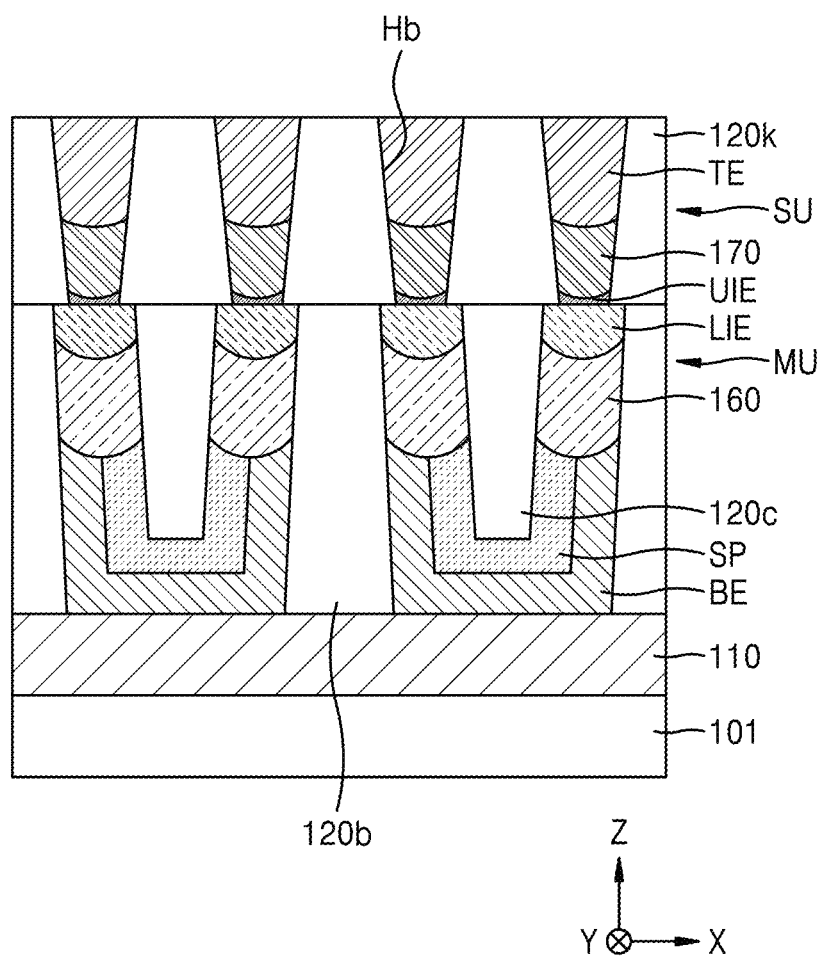
Figure 20C:
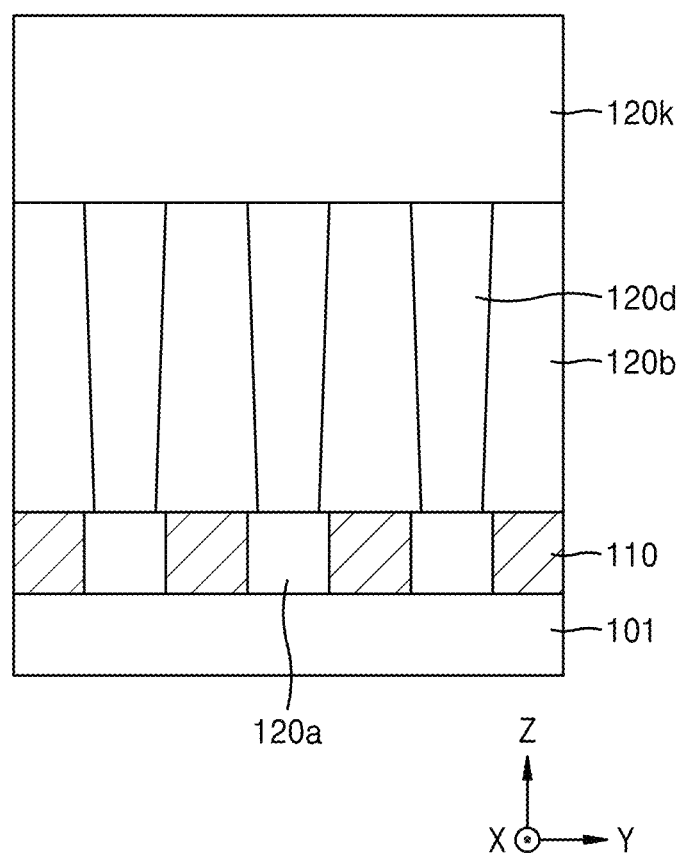

Referring to FIGS. 20A to 20C, the plurality of switch units SU may be formed in the plurality of second holes Hb in the eleventh insulating layer 120*k*. For example, an upper intermediate electrode layer (not shown) may be formed on the eleventh insulating layer 120*k* and the plurality of memory units MU, and then the plurality of upper intermediate electrode patterns UIE may be formed by polishing and/or etching the upper intermediate electrode layer so that an upper end of the upper intermediate electrode layer is lower than an upper surface of the eleventh insulating layer 120*k*. Next, a switch layer (not shown) may be formed on the eleventh insulating layer 120*k* and the plurality of upper intermediate electrode patterns UIE, and then the plurality of switch patterns 170 may be formed by polishing and/or etching the switch layer so that an upper end of the switch layer is lower than the upper surface of the eleventh insulating layer 120*k*. Further, an upper electrode layer (not shown) may be formed on the eleventh insulating layer 120*k* and the plurality of switch patterns 170, and then the plurality of upper electrode patterns TE may be formed by polishing and/or etching the upper electrode layer so that the upper surface of the eleventh insulating layer 120*k* is exposed.

Figure 21A:
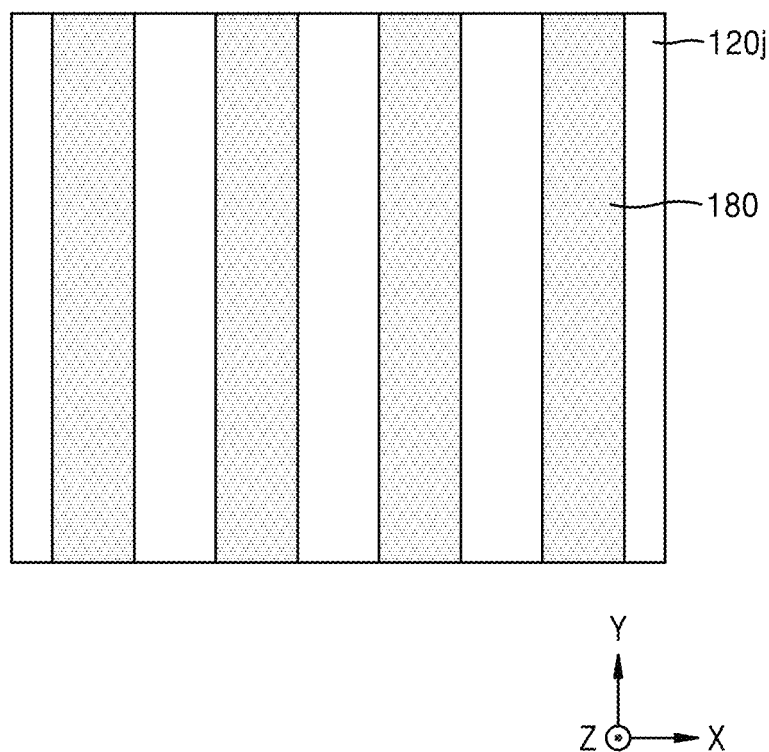
Figure 21B:
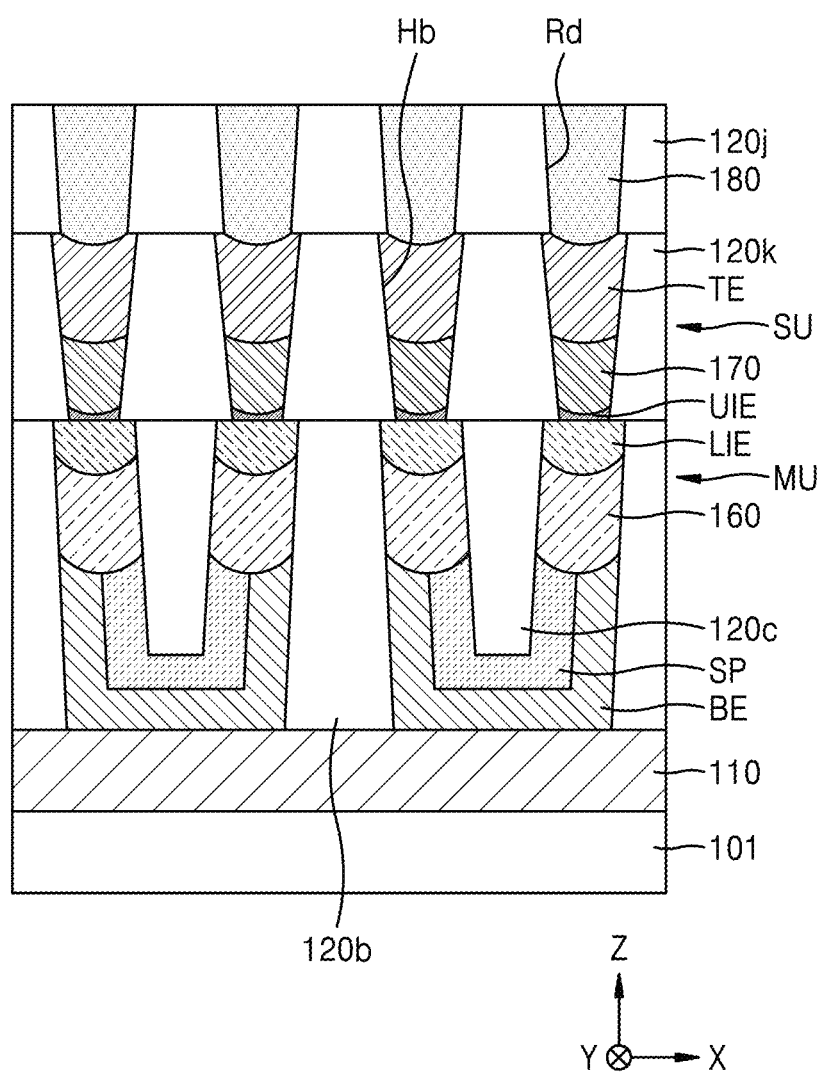
Figure 21C:
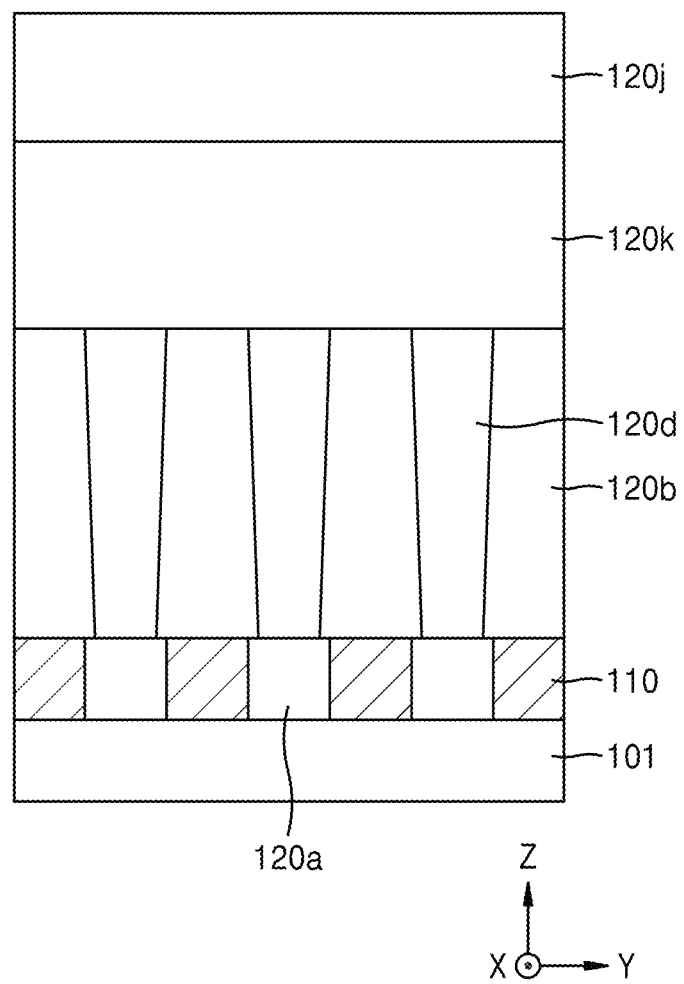

Referring to FIGS. 21A to 21C, a tenth insulating layer 120*j* may be formed to include a plurality of fourth recesses Rd that each extend in parallel in the second direction (the Y direction) on the eleventh insulating layer 120*k* and expose the plurality of switch units SU. For example, the tenth insulating layer 120j may be formed on the eleventh insulating layer 120k and the plurality of switch units SU, and then the tenth insulating layer 120j may be etched to form the plurality of fourth recesses Rd in the tenth insulating layer 120j.

Next, the plurality of upper conductive lines 180 may be formed in the plurality of fourth recesses Rd in the tenth insulating layer 120j. For example, the upper conductive layer may be formed on the tenth insulating layer 120j and the plurality of switch units SU, and then the plurality of upper conductive lines 180 may be formed by polishing and/or etching the upper conductive layer so that an upper surface of the tenth insulating layer 120j is exposed.

Figure 22A:
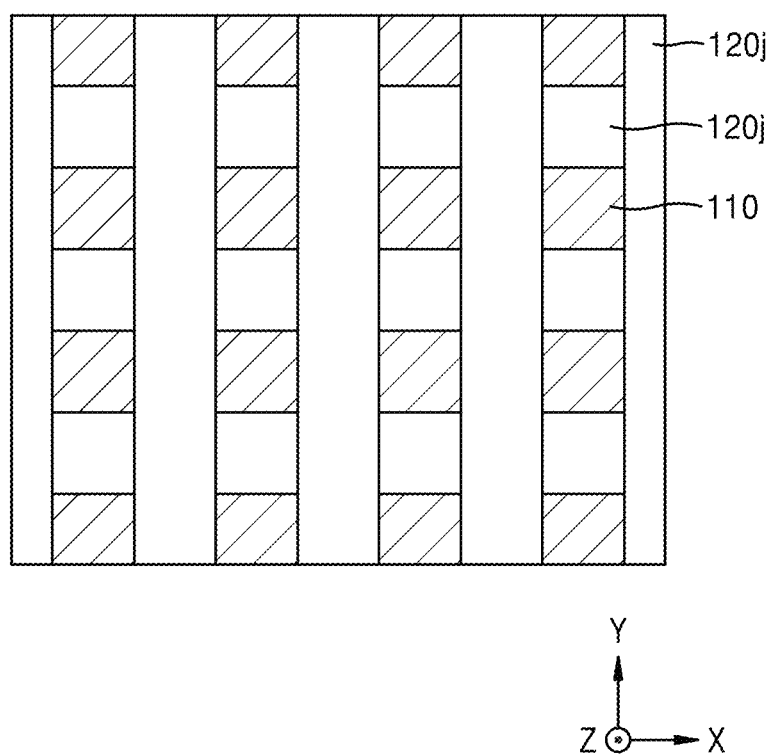
FIGS. 22A and 23A are plan views for explaining a method of manufacturing a memory device according to an example embodiment of the inventive concepts.
Figure 22B:
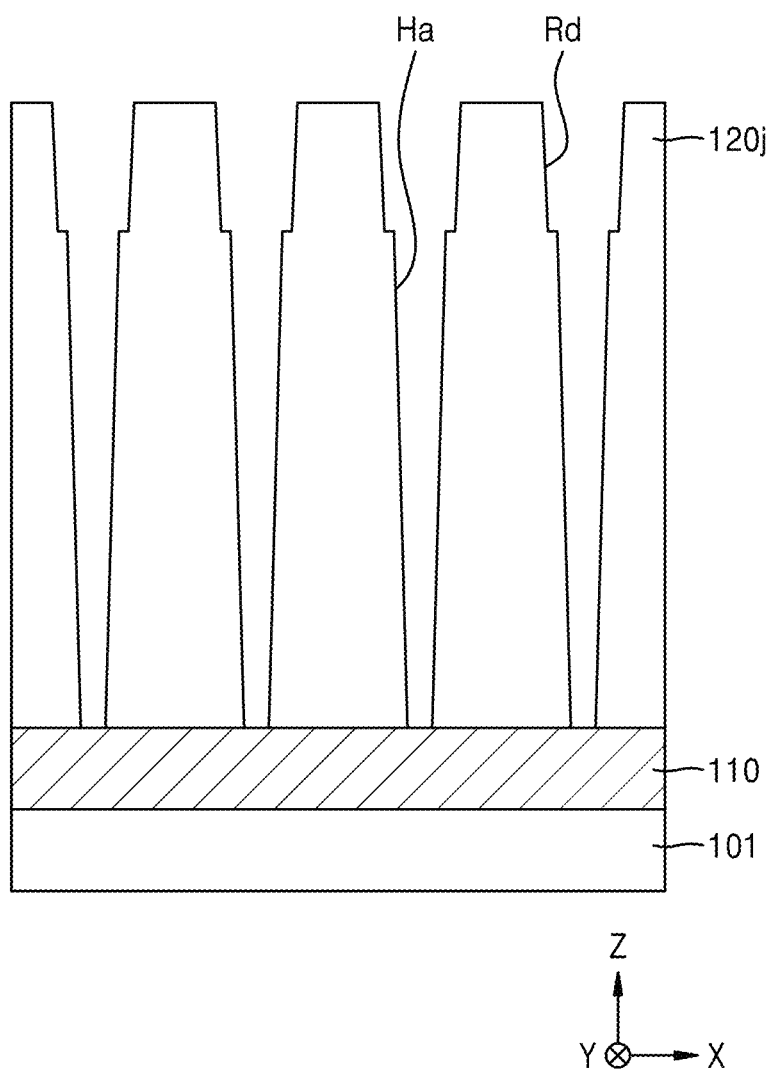
FIGS. 22B and 23B are front views for explaining the method of manufacturing the memory device according to the example embodiment of the inventive concepts.
Figure 22C:
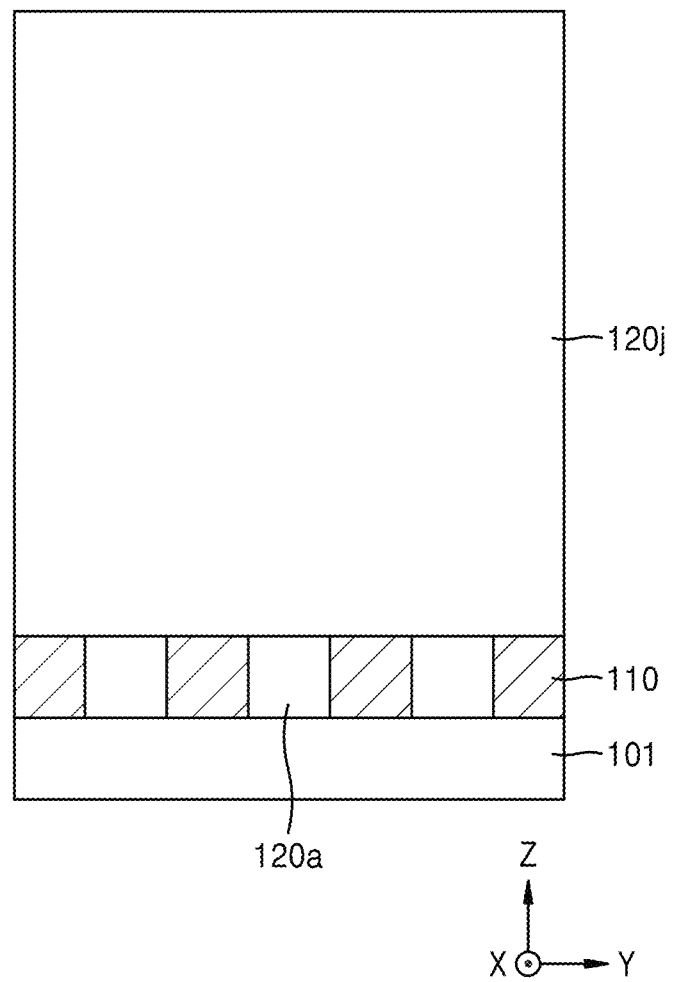
FIGS. 22C and 23C are side views for explaining the method of manufacturing the memory device according to the example embodiment of the inventive concepts.
Figure 23A:
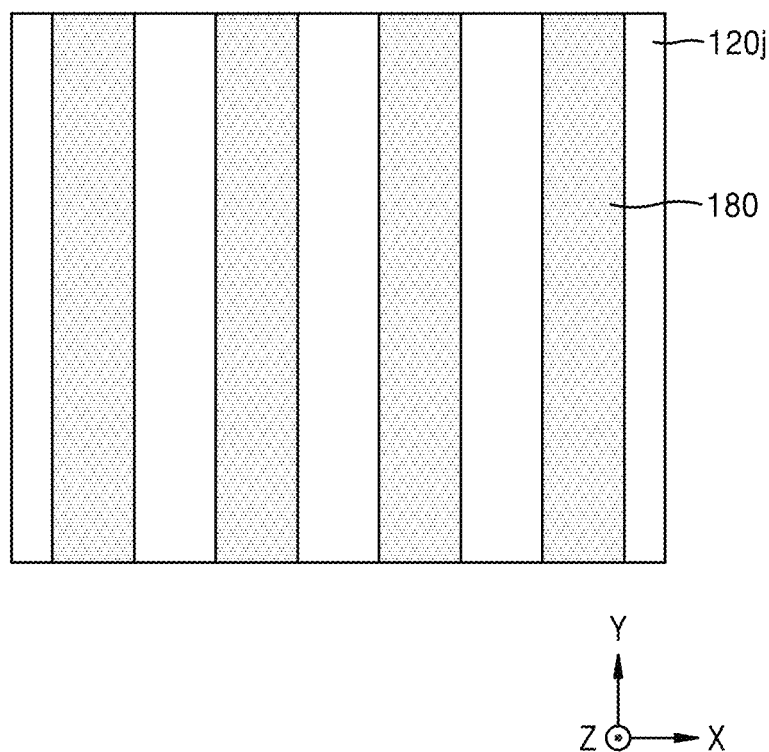
Figure 23B:
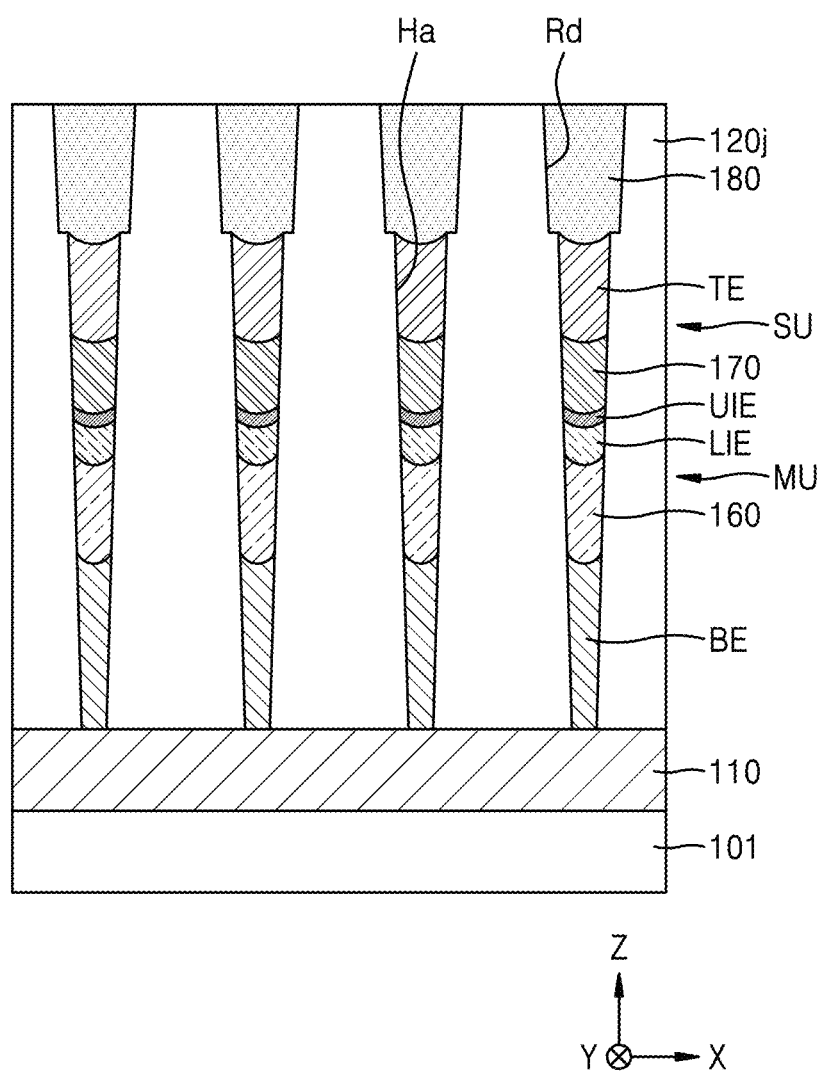

FIGS. 22A and 23A are plan views for explaining a method of manufacturing a memory device according to an example embodiment of the inventive concepts, FIGS. 22B and 23B are front views for explaining the method of manufacturing the memory device according to the example embodiment of the inventive concepts, and FIGS. 22C to 23C are side views for explaining the method of manufacturing the memory device according to the example embodiment of the inventive concepts. According to the method of manufacturing the memory device of the inventive concepts shown in FIGS. 22A to 23C, the plurality of upper conductive lines 180, the plurality of switch units SU and the plurality of memory units MU (see FIGS. 23A to 23C) may be formed using the damascene technique.

Referring to FIGS. 22A to 22C, the plurality of lower conductive lines 110 and the first insulating layer 120a may be formed as described with reference to FIGS. 1A to 1C. Next, the tenth insulating layer 120j may be formed on the plurality of lower conductive lines 110 and the first insulating layer 120a. The tenth insulating layer 120j may include the plurality of fourth recesses Rd and the plurality of first holes Ha, the plurality of fourth recesses Rd may each extend in parallel in the second direction (the Y direction) and the plurality of first holes Ha may be connected to the plurality of fourth recesses Rd below the plurality of fourth recesses Rd and may expose the plurality of lower conductive lines 110. The plurality of first holes Ha may be spaced apart from each other in the first direction (the X direction) and the second direction (the Y direction) and may each extend in the third direction (the Z direction).

For example, the tenth insulating layer 120j may be formed on the plurality of lower conductive lines 110 and the first insulating layer 120a, and then the plurality of fourth recesses Rd and the plurality of first holes Ha may be formed in the tenth insulating layer 120j. In some example embodiments, the plurality of fourth recesses Rd may be formed in the tenth insulating layer 120j, and then the plurality of first holes Ha may be formed in the tenth insulating layer 120j. In another example embodiment, the plurality of first holes Ha may be formed in the tenth insulating layer 120j, and then the plurality of fourth recesses Rd may be formed in the tenth insulating layer 120j.

Figure 23C:
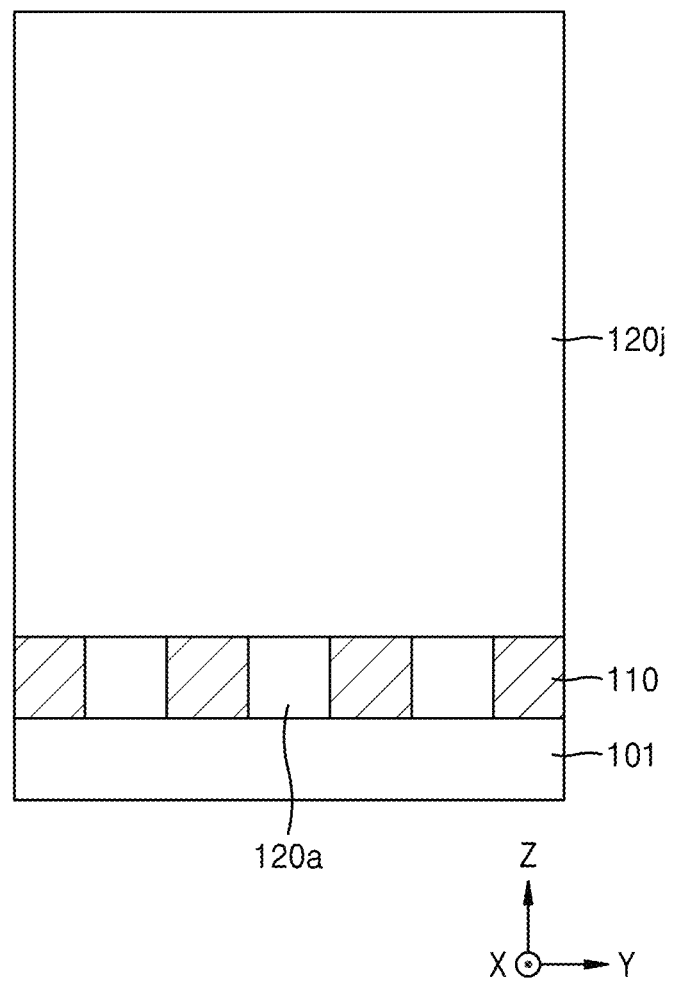

Referring to FIGS. 23A to 23C, the plurality of memory units MU and the plurality of switch units SU may be formed in the plurality of first holes Ha in the tenth insulating layer 120j. For example, a lower electrode layer (not shown) may be formed on the tenth insulating layer 120j and the plurality of lower conductive lines 110, and then the plurality of lower electrode patterns BE may be formed by polishing and/or etching the lower electrode layer so that an upper end of the lower electrode layer is lower than a bottom of each of the plurality of fourth recesses Rd. Next, a phase change layer (not shown) may be formed on the tenth insulating layer 120j and the plurality of lower electrode patterns BE, and then the plurality of phase change patterns 160 may be formed by polishing and/or etching the phase change layer so that an upper end of the phase change layer is lower than a bottom of each of the plurality of fourth recesses Rd. For example, a lower intermediate electrode layer (not shown) may be formed on the tenth insulating layer 120j and the plurality of phase change patterns 160, and then a plurality of lower intermediate electrode patterns LIE may be formed by polishing and/or etching the lower intermediate electrode layer so that an upper end of the lower intermediate electrode layer is lower than a bottom of each of the plurality of fourth recesses Rd. The plurality of switch units SU and the plurality of upper conductive lines 180 may be formed as described with reference to FIGS. 17A to 18C.

According to the method of manufacturing the memory device described with reference to FIGS. 22A to 23C, the plurality of memory units MU may be manufactured using the damascene technique. That is, the tenth insulating layer 120j may be formed first, and then the plurality of memory units MU may be formed in the plurality of first holes Ha in the tenth insulating layer 120j. Thus, even if an aspect ratio of each of the plurality of memory units MU becomes large, it may be possible to prevent some or all of the plurality of memory units MU from collapsing or breaking, wherein the aspect ratio is a ratio of a height in the third direction (the Z direction) of each of the plurality of memory units MU with respect to a width in the first direction (the X direction) or in the second direction (the Y direction) of each of the plurality of memory units MU. Thus, a highly integrated phase change memory device may be manufactured.

FIGS. 24A to 26A are plan views for explaining a method of manufacturing a memory device according to an example embodiment of the inventive concepts, FIGS. 24B to 26B are front views for explaining the method of manufacturing the memory device according to the example embodiment of the inventive concepts, and FIGS. 24C to 26C are side views for explaining the method of manufacturing the memory device according to the example embodiment of the inventive concepts. According to the method of manufacturing the memory device of the inventive concepts shown in FIGS. 24A to 26C, the plurality of upper conductive lines 180, the plurality of switch units SU and the plurality of memory units MU (see FIGS. 26A to 26C) may be formed using the damascene technique.

Figure 24A:
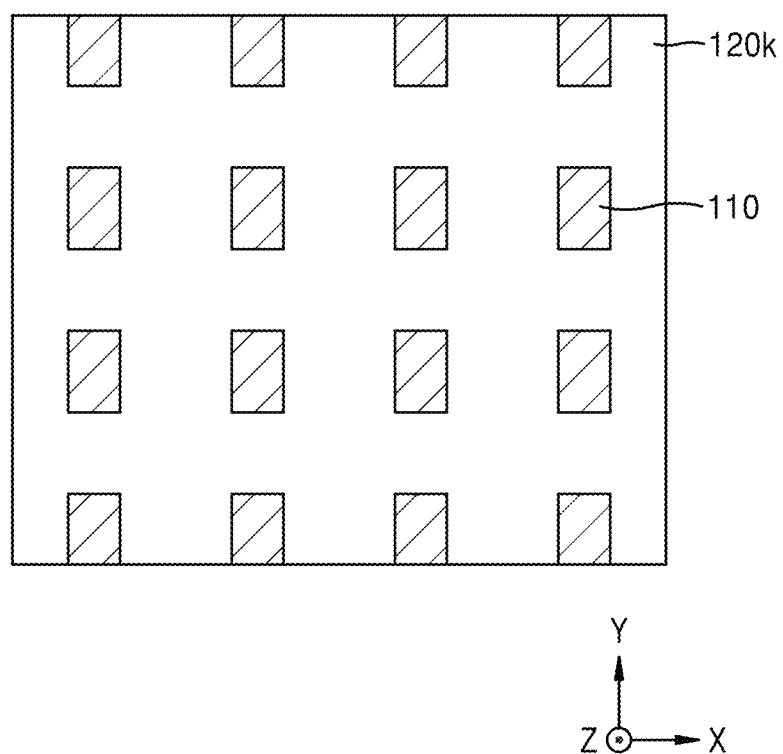
Figure 24B:
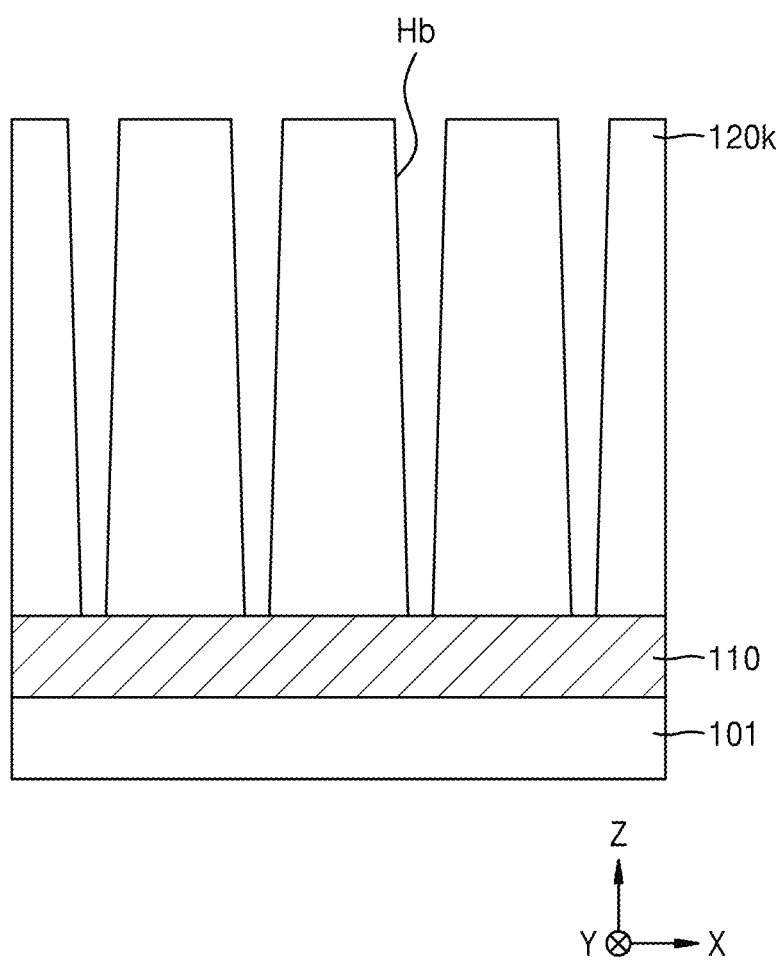
Figure 24C:
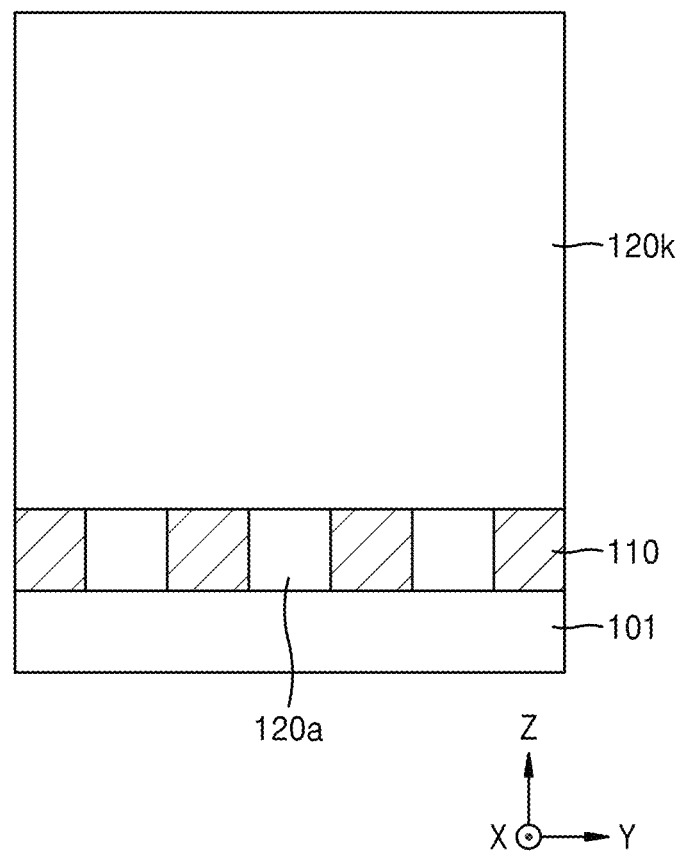

Referring to FIGS. 24A to 24C, the plurality of lower conductive lines 110 and the first insulating layer 120a may be formed as described with reference to FIGS. 1A to 1C. Next, the eleventh insulating layer 120k may be formed on the plurality of lower conductive lines 110 and the first insulating layer 120a. The eleventh insulating layer 120k may include a plurality of second holes Hb that expose the plurality of lower conductive lines 110 and each extend in the third direction (the Z direction) while being spaced apart from each other in the first direction (the X direction) and the second direction (the Y direction). For example, the eleventh insulating layer 120k may be formed on the plurality of lower conductive lines 110 and the first insulating layer 120a, and then the eleventh insulating layer 120k may be etched so that the plurality of second holes Hb may be formed in the eleventh insulating layer 120k.

Figure 25A:
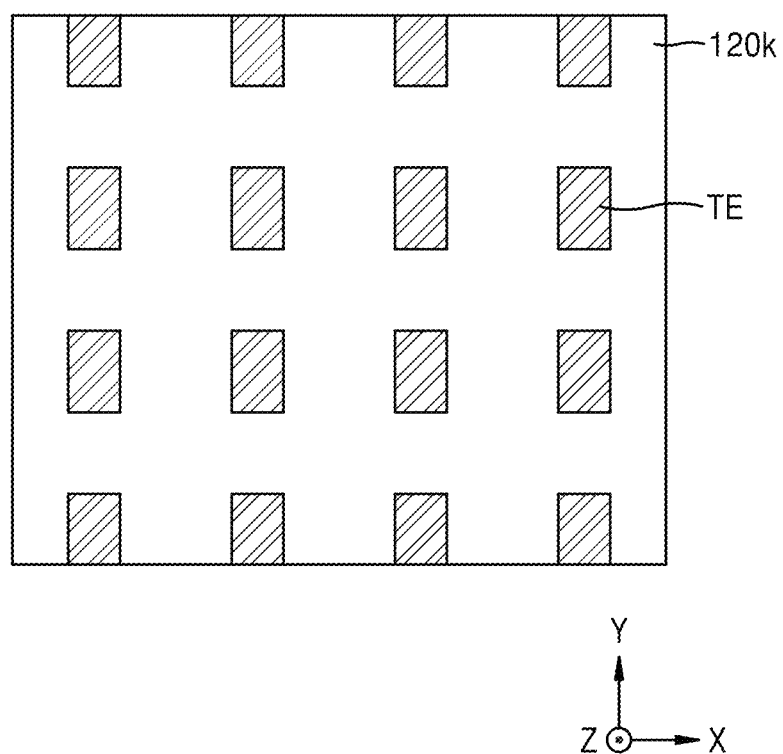
Figure 25B:
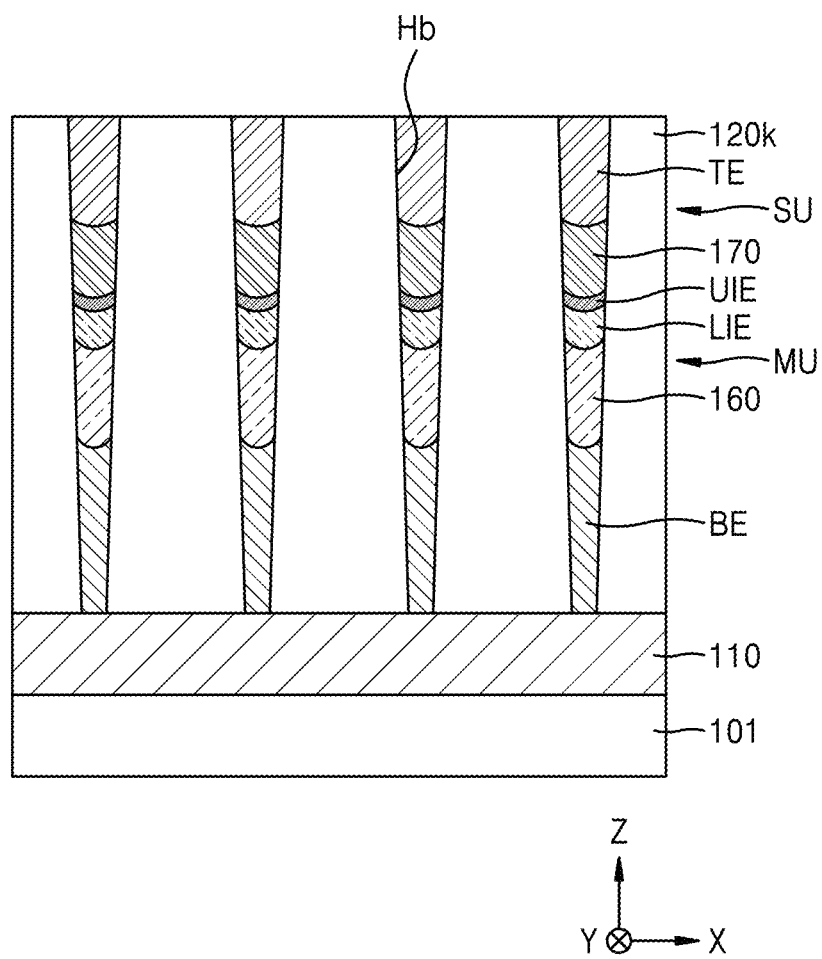
Figure 25C:
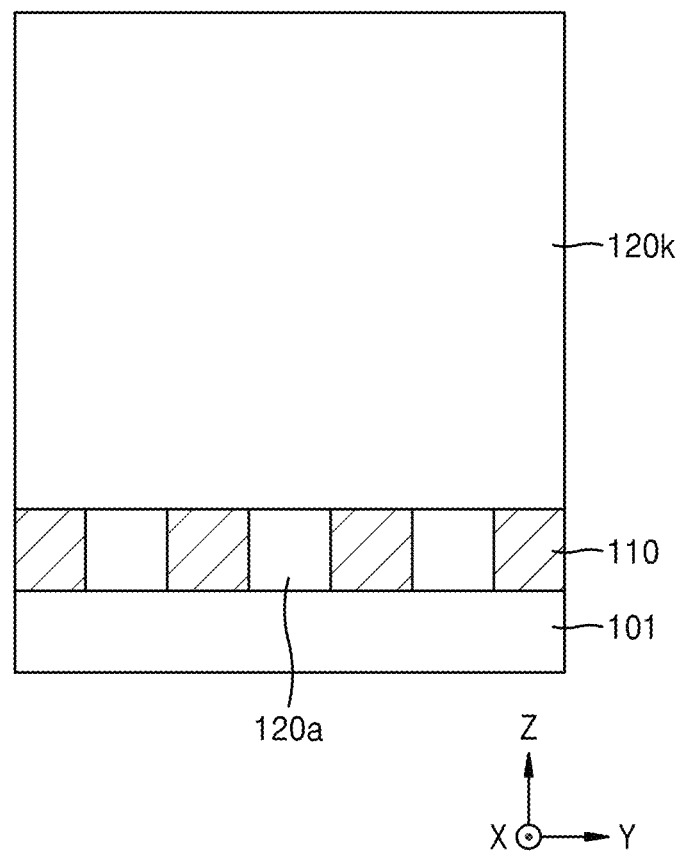

Referring to FIGS. 25A to 25C, the plurality of memory units MU and the plurality of switch units SU may be formed in the plurality of second holes Hb in the eleventh insulating layer 120k. For example, a lower electrode layer (not shown) may be formed on the eleventh insulating layer 120k and the plurality of lower conductive lines 110, and then the plurality of lower electrode patterns BE may be formed by polishing and/or etching the lower electrode layer so that an upper end of the lower electrode layer is lower than an upper surface of the eleventh insulating layer 120*k*. Next, a phase change layer (not shown) may be formed on the eleventh insulating layer 120*k* and the plurality of lower electrode patterns BE, and then the plurality of phase change patterns 160 may be formed by polishing and/or etching the phase change layer so that an upper end of the phase change layer is lower than the upper surface of the eleventh insulating layer 120*k*. For example, a lower intermediate electrode layer (not shown) may be formed on the eleventh insulating layer 120*k* and the plurality of phase change patterns 160, and then the plurality of lower intermediate electrode patterns LIE may be formed by polishing and/or etching the lower intermediate electrode layer so that an upper end of the lower intermediate electrode layer is lower than the upper surface of the eleventh insulating layer 120*k*. The plurality of switch units SU may be formed as described with reference to FIGS. 20A to 20C.

Figure 26A:
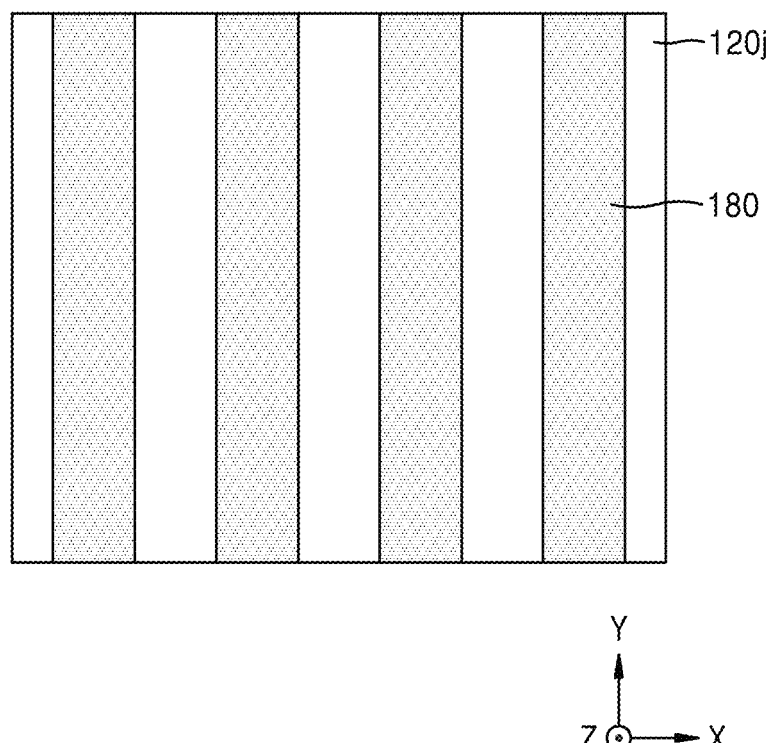
Figure 26B:
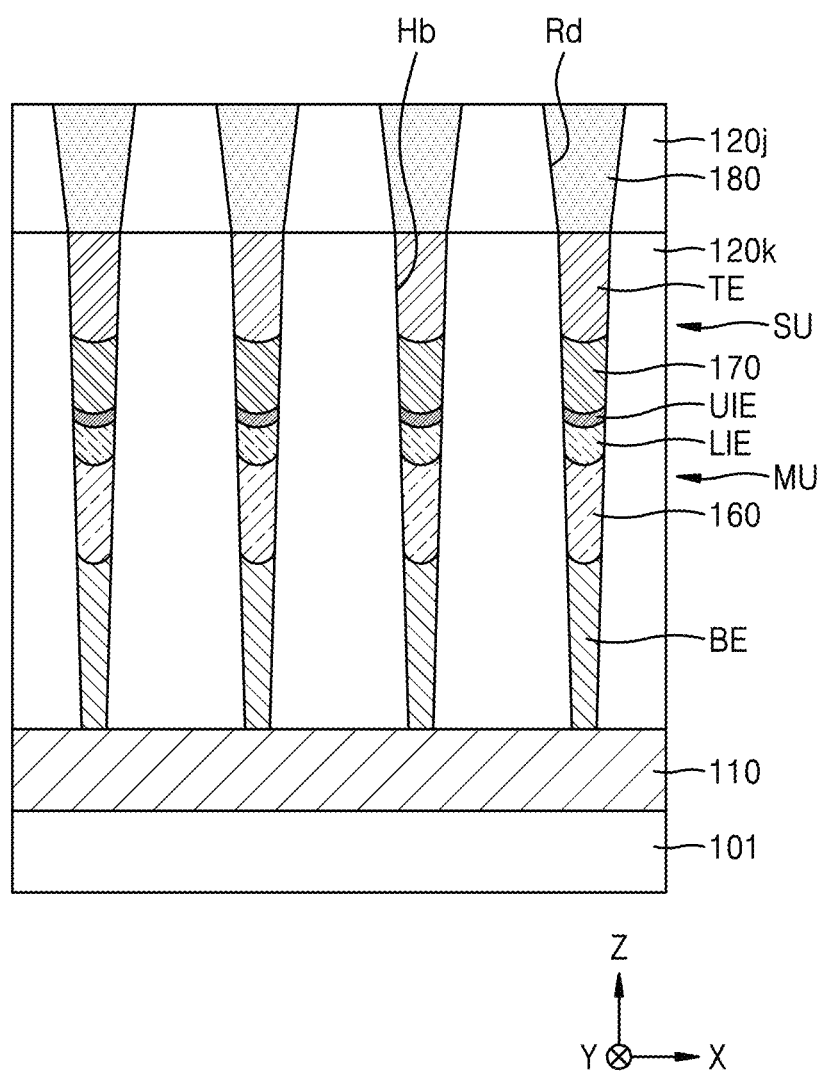
Figure 26C:
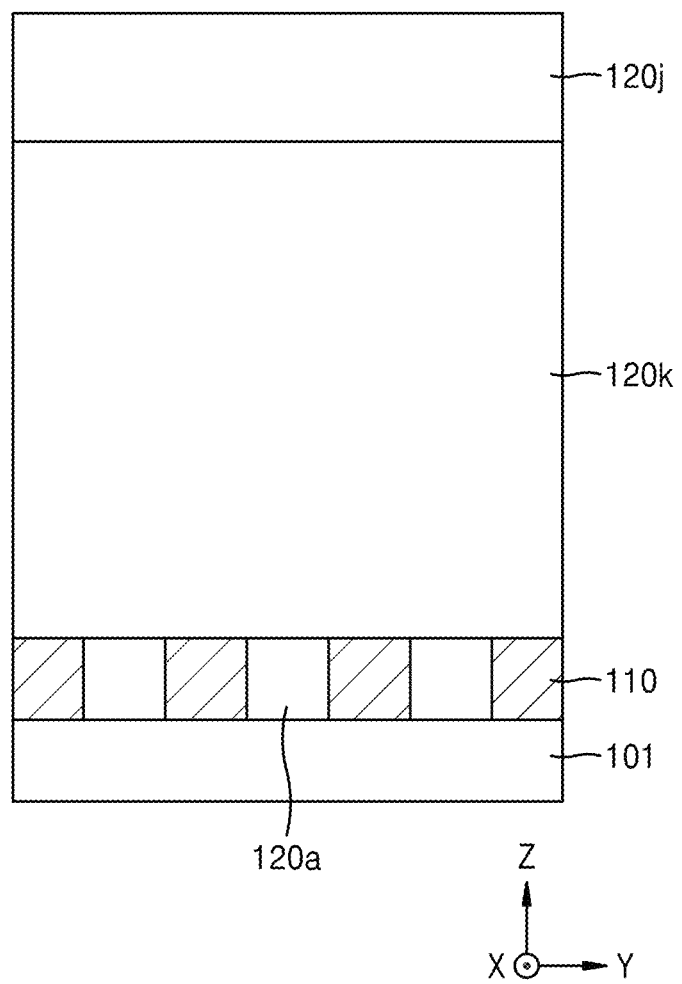

Referring to FIGS. 26A to 26C, the tenth insulating layer 120*j* may be formed to include a plurality of fourth recesses Rd that each extend in parallel in the second direction (the Y direction) on the eleventh insulating layer 120*k* and to expose the plurality of switch units SU. Next, the plurality of upper conductive lines 180 may be formed in the plurality of fourth recesses Rd in the tenth insulating layer 120*j*. The tenth insulating layer 120*j* and the plurality of upper conductive lines 180 may be formed as described with reference to FIGS. 21A to 21C.

FIGS. 27A to 29A are plan views for explaining a method of manufacturing a memory device according to an example embodiment of the inventive concepts, FIGS. 27B to 29B are front views for explaining the method of manufacturing the memory device according to the example embodiment of the inventive concepts, and FIGS. 27C to 29C are side views for explaining the method of manufacturing the memory device according to the example embodiment of the inventive concepts. According to the method of manufacturing the memory device of the inventive concepts shown in FIGS. 27A to 29C, the plurality of upper conductive lines 180, the plurality of switch units SU and the plurality of memory units MU (see FIGS. 29A to 29C) may be formed using the damascene technique.

Figure 27A:
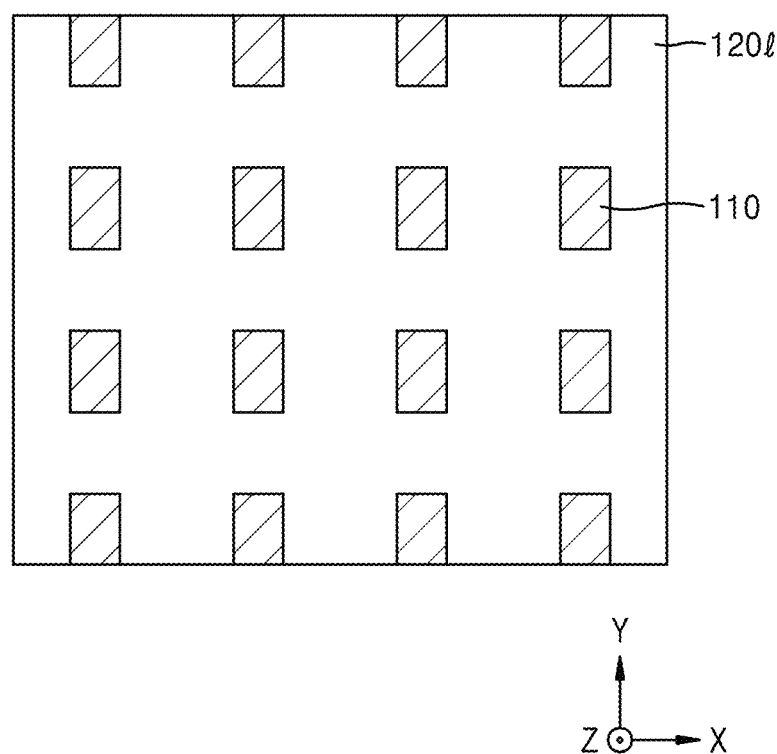
Figure 27B:
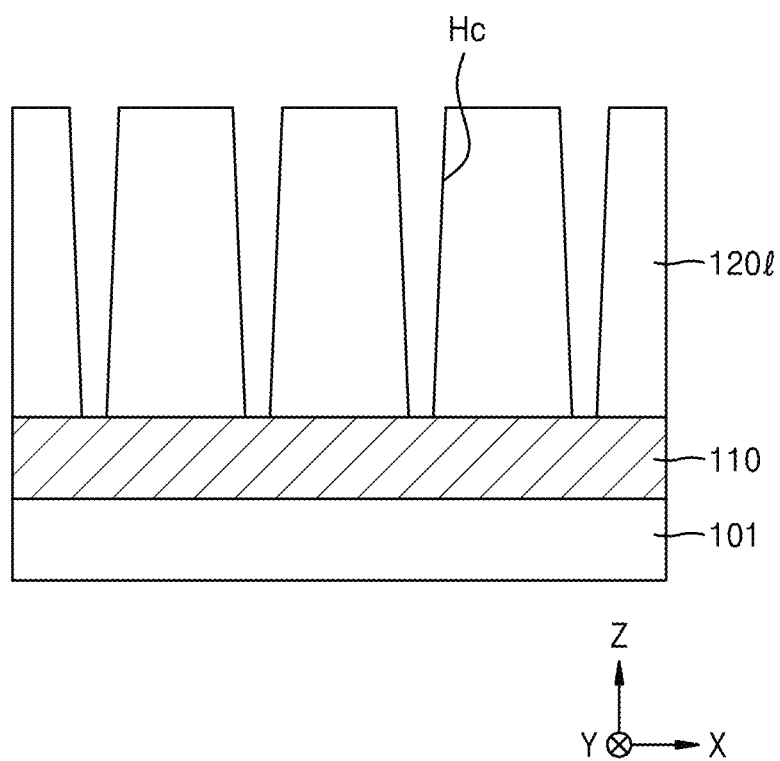
Figure 27C:
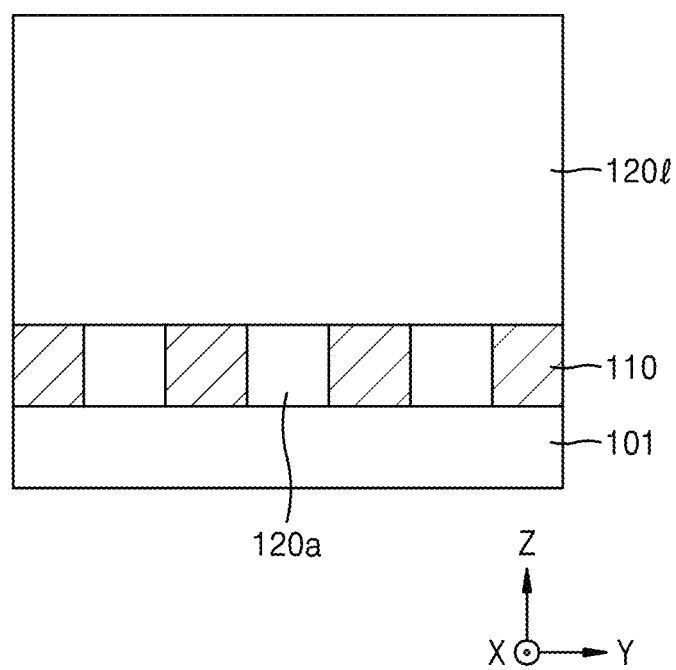

Referring to FIGS. 27A to 27C, the plurality of lower conductive lines 110 and the first insulating layer 120*a* may be formed as described with reference to FIGS. 1A to 1C. Next, the twelfth insulating layer 120*f* may be formed on the plurality of lower conductive lines 110 and the first insulating layer 120*a*. The twelfth insulating layer 120*f* may include silicon oxide, silicon nitride, or a combination thereof. The twelfth insulating layer 120*l* may include a plurality of third holes Hc that expose the plurality of lower conductive lines 110 and each extend in the third direction (the Z direction) while being spaced apart from each other in the first direction (the X direction) and the second direction (the Y direction). For example, the twelfth insulating layer 120*e* may be formed on the plurality of lower conductive lines 110 and the first insulating layer 120*a*, and then the twelfth insulating layer 120*e* may be etched so that the plurality of third holes Hc may be formed in the twelfth insulating layer 120*l*.

Figure 28A:
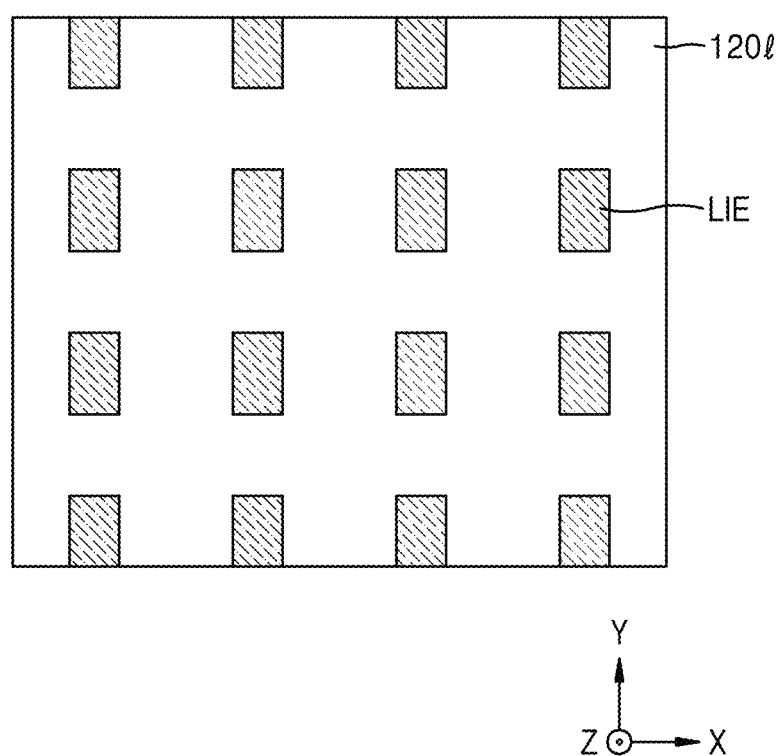
Figure 28B:
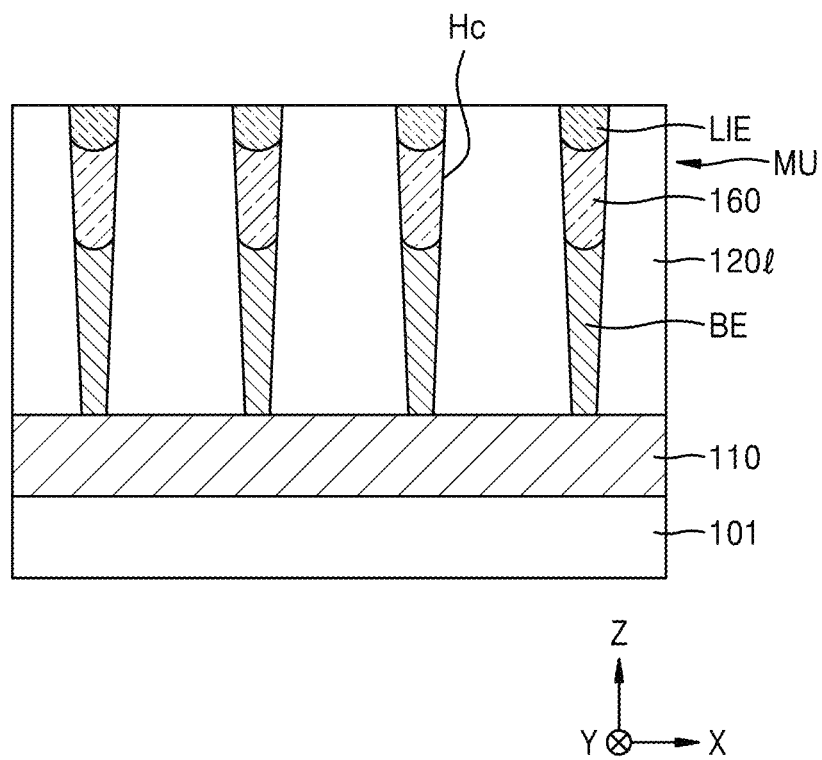
Figure 28C:
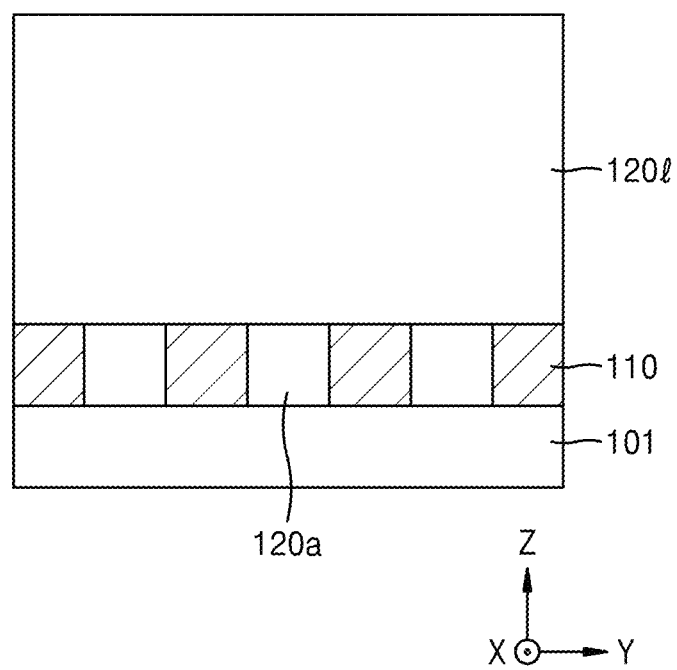

Referring to FIGS. 28A to 28C, the plurality of switch units SU may be formed in the plurality of third holes Hc in the twelfth insulating layer 120*e*. For example, a lower electrode layer (not shown) may be formed on the twelfth insulating layer 120*e* and the plurality of lower conductive lines 110, and then the plurality of lower electrode patterns BE may be formed by polishing and/or etching the lower electrode layer so that an upper end of the lower electrode layer is lower than an upper surface of the twelfth insulating layer 120*e*. Next, a phase change layer (not shown) may be formed on the twelfth insulating layer 120*e* and the plurality of lower electrode patterns BE, and then the plurality of phase change patterns 160 may be formed by polishing and/or etching the phase change layer so that an upper end of the phase change layer is lower than the upper surface of the twelfth insulating layer 120*e*. Further, an lower intermediate electrode layer (not shown) may be formed on the twelfth insulating layer 120*f* and the plurality of phase change patterns 160, and then the plurality of lower intermediate electrode patterns LIE may be formed by polishing and/or etching the lower intermediate electrode layer so that the upper surface of the twelfth insulating layer 120*e* is exposed.

Figure 29A:
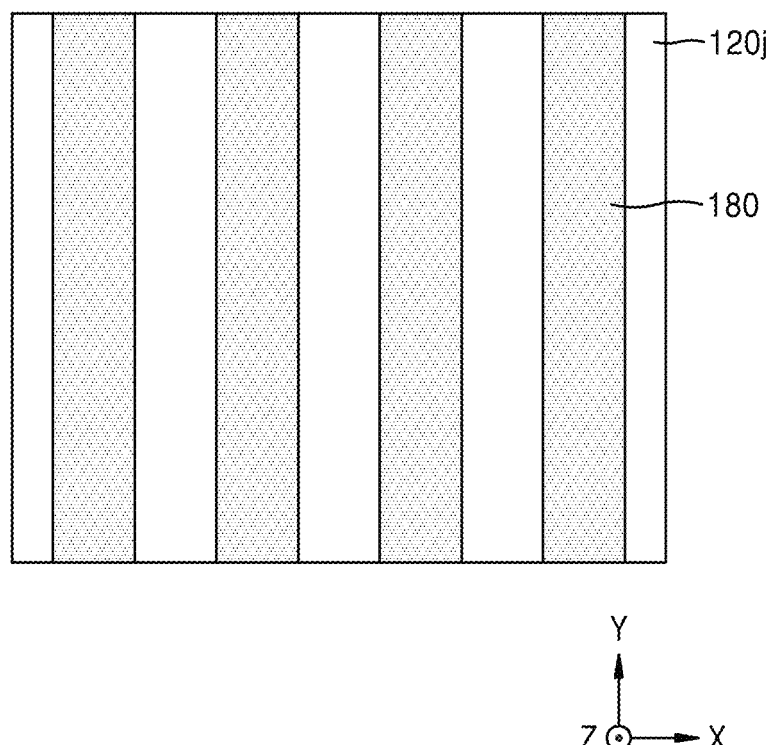
Figure 29B:
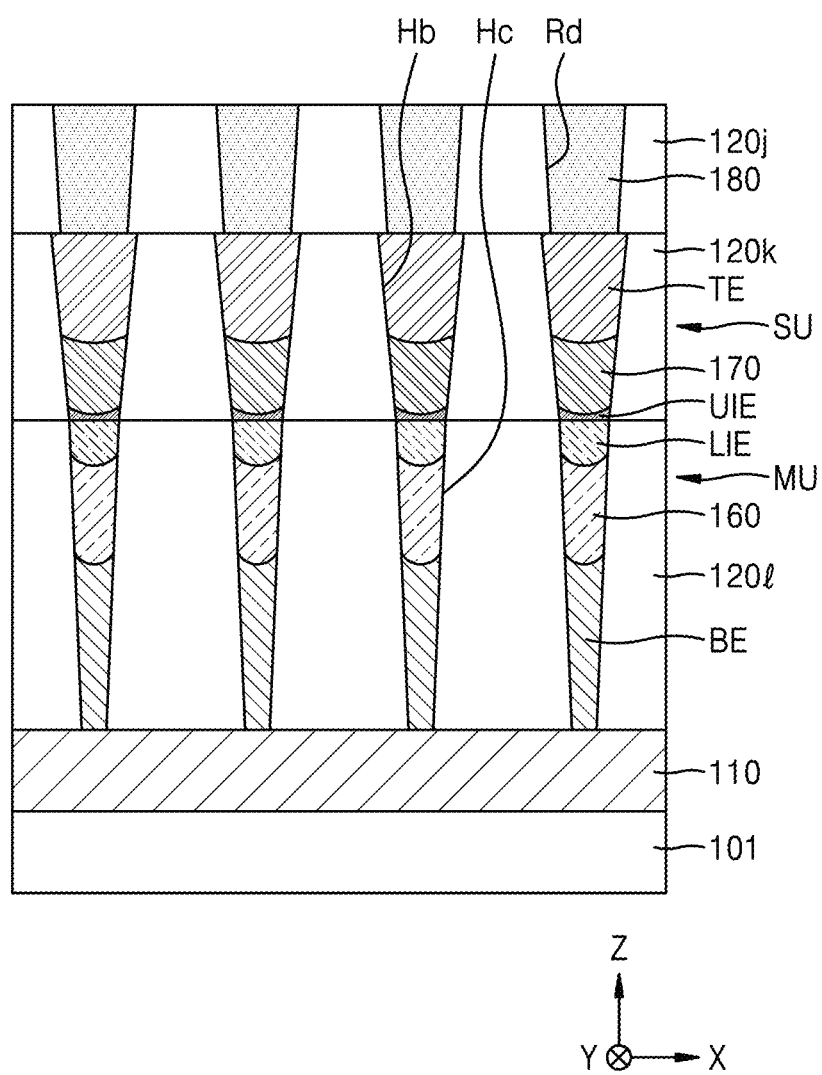
Figure 29C:
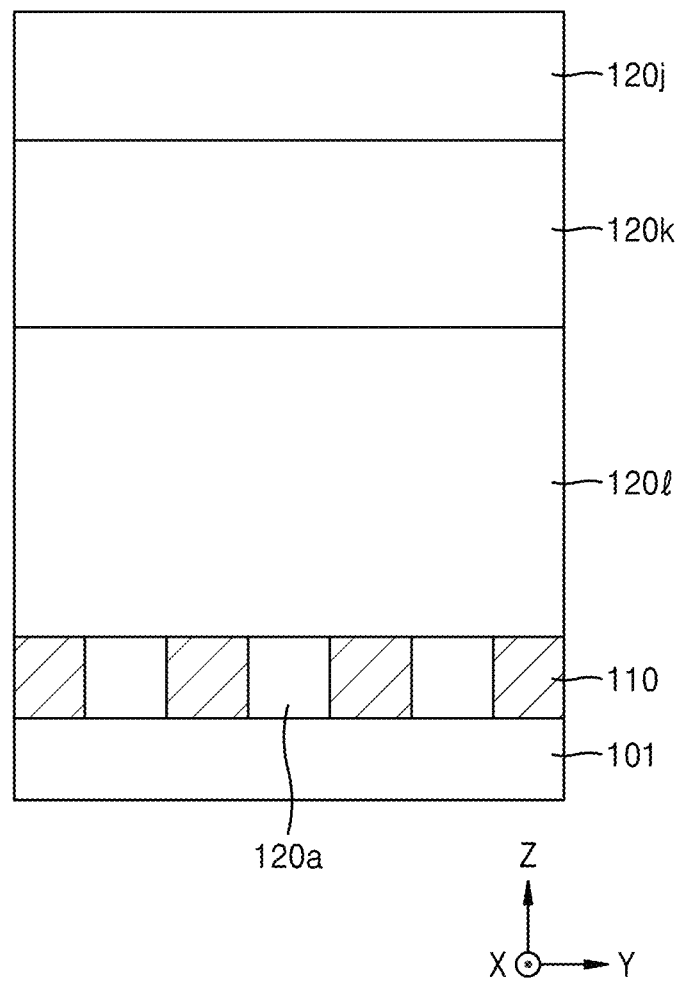

Referring to FIGS. 29A to 29C, the plurality of switch units SU and the plurality of upper conductive lines 180 may be formed on a plurality of memory units MU. The eleventh insulating layer 120*k* may be formed on the twelfth insulating layer 120*e* and the plurality of switch units SU may be formed in the plurality of second holes Hb in the eleventh insulating layer 120*k*. Thereafter, the tenth insulating layer 120*j* may be formed on the eleventh insulating layer 120*k* and then the plurality of upper conductive lines 180 may be formed in the plurality of fourth recesses Rd in the tenth insulating layer 120*j*. The plurality of switch units SU and the plurality of upper conductive lines 180 may be formed as described with reference to FIGS. 19A to 21C.

Figure 30A:
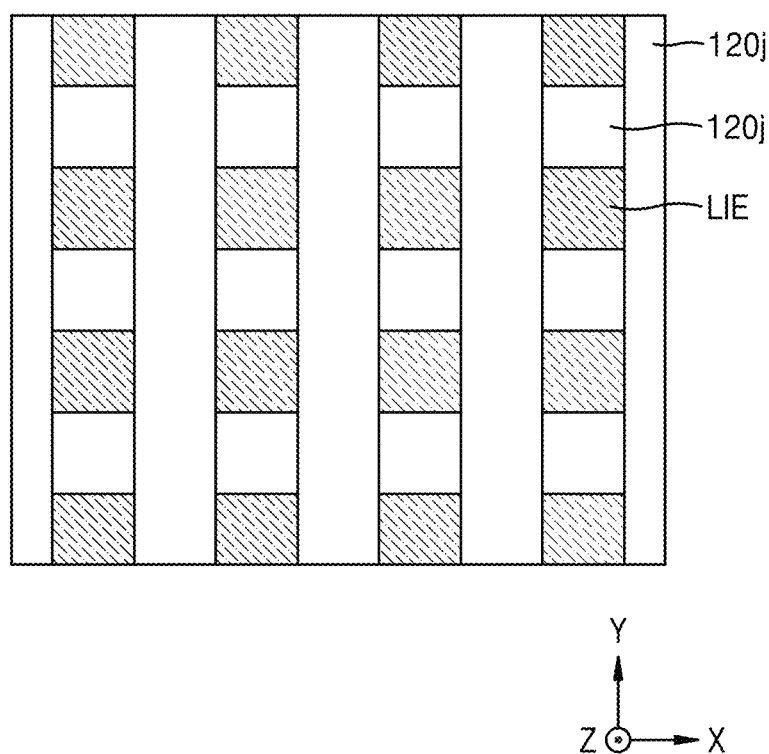
FIGS. 30A and 31A are plan views for explaining a method of manufacturing a memory device according to an example embodiment of the inventive concepts.
Figure 30B:
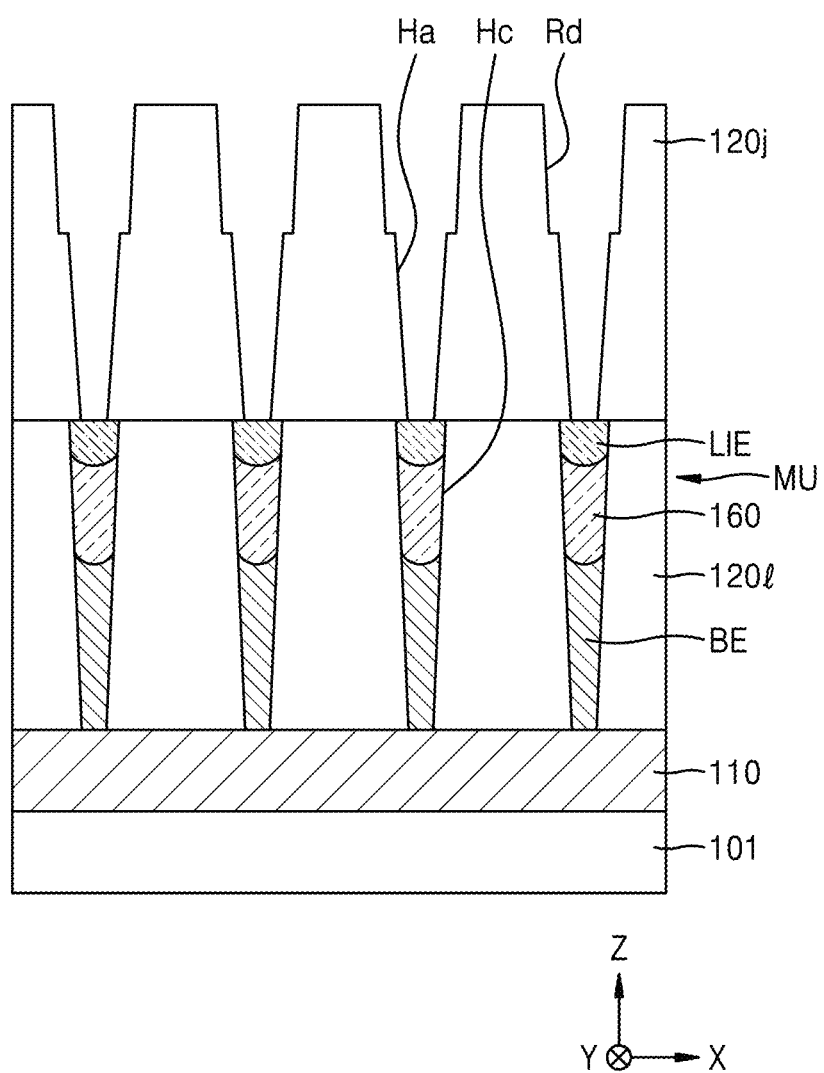
FIGS. 30B and 31B are front views for explaining the method of manufacturing the memory device according to the example embodiment of the inventive concepts.
Figure 30C:
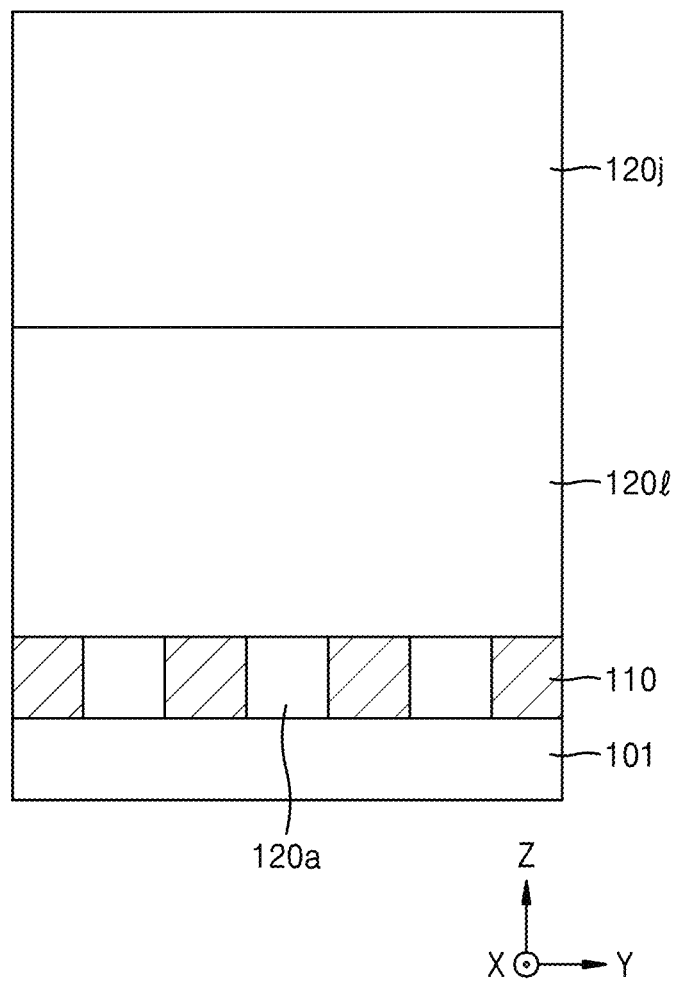
FIGS. 30C and 31C are side views for explaining the method of manufacturing the memory device according to the example embodiment of the inventive concepts.
Figure 31A:
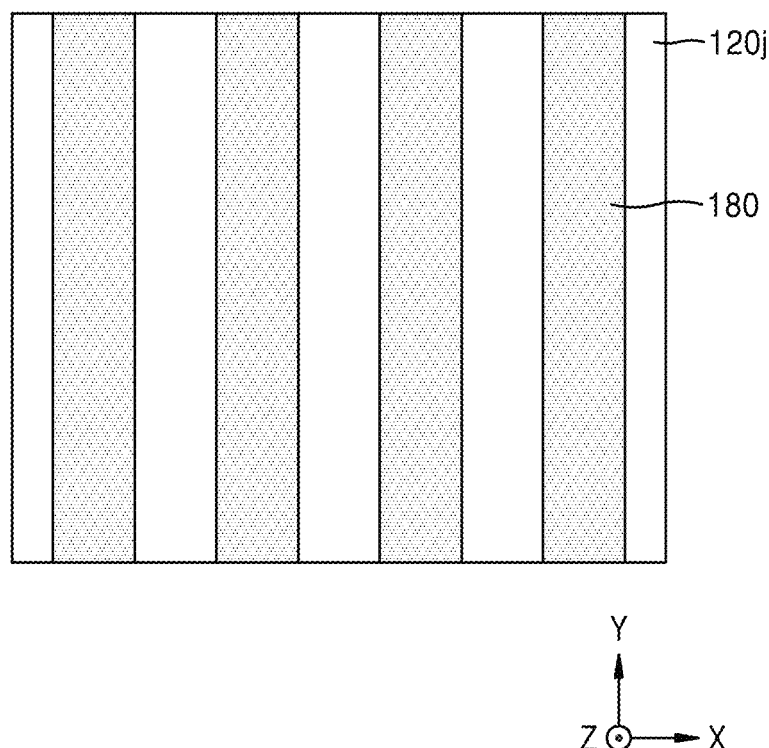
Figure 31B:
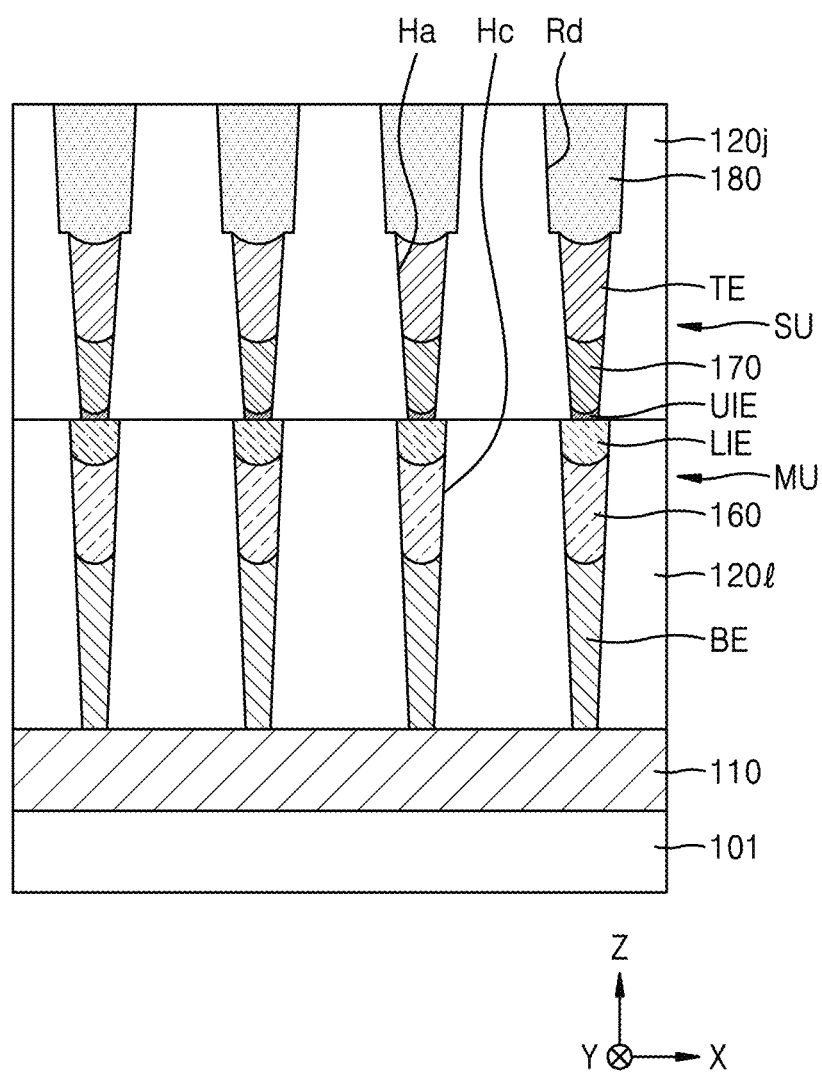
Figure 31C:
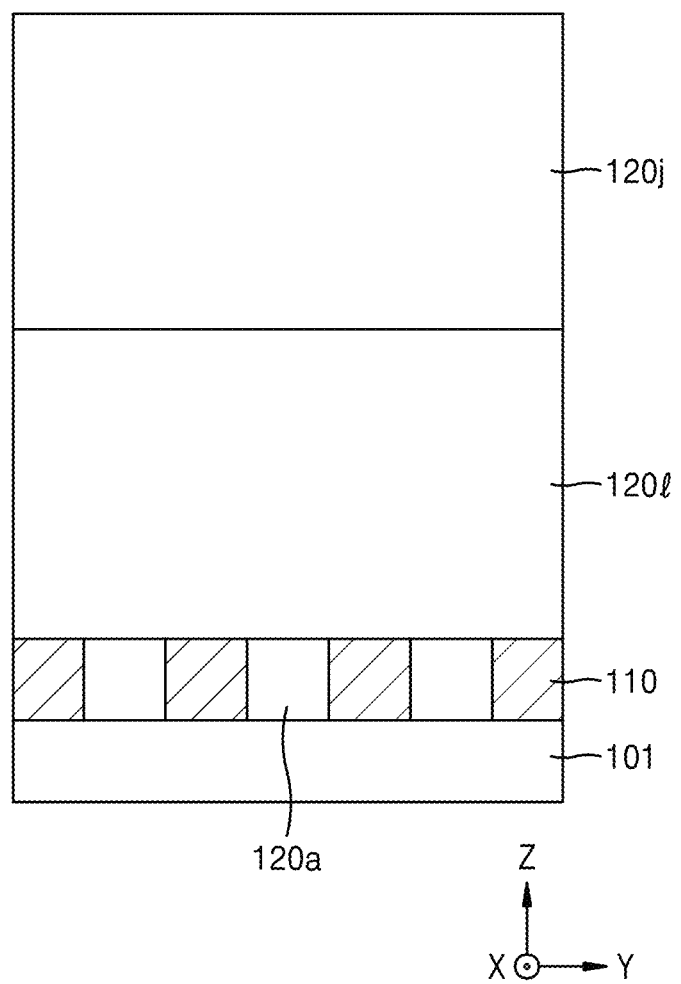

FIGS. 30A and 31A are plan views for explaining a method of manufacturing a memory device according to an example embodiment of the inventive concepts, FIGS. 30B and 31B are front views for explaining the method of manufacturing the memory device according to the example embodiment of the inventive concepts, and FIGS. 30C and 31C are side views for explaining the method of manufacturing the memory device according to the example embodiment of the inventive concepts. According to the method of manufacturing the memory device of the inventive concepts shown in FIGS. 30A to 31C, the plurality of upper conductive lines 180, the plurality of switch units SU and the plurality of memory units MU (see FIGS. 31A to 31C) may be formed using the damascene technique.

Referring to FIGS. 30A to 30C, the plurality of lower conductive lines 110, the first insulating layer 120*a*, the twelfth insulating layer 120*l*, and the plurality of memory units (MU) may be formed as described with reference to FIGS. 1A to 1C and 27A to 28C. Then, the tenth insulating layer 120*j* including the plurality of fourth recesses Rd and the plurality of first holes Ha may be formed on the twelfth insulating layer 120*l*. The tenth insulating layer 120*j* may be formed as described with reference to FIGS. 16A to 16C.

Referring to FIGS. 31A to 31C, the plurality of switch units SU may be formed in the plurality of first holes Ha in the tenth insulating layer 120*j* and then the plurality of upper conductive line 180 may be formed in the plurality of fourth recesses Rd. The plurality of switch units SU and the plurality of upper conductive lines 180 may be formed as described with reference to FIGS. 17A to 18C.

FIGS. 32A to 34A are plan views for explaining a method of manufacturing a memory device according to an example embodiment of the inventive concepts, FIGS. 32B to 34B are front views for explaining the method of manufacturing the memory device according to the example embodiment of the inventive concepts, and FIGS. 32C to 34C are side views for explaining the method of manufacturing the memory device according to the example embodiment of the inventive concepts. According to the method of manufacturing the memory device of the inventive concepts shown in FIGS. 32A to 34C, a plurality of first electrode patterns Ea, a plurality of switch patterns 170, a plurality of second electrode patterns Eb, a plurality of phase change patterns 160, and a plurality of third electrode patterns Ec (see FIGS. 34A to 34C) may be formed using the damascene technique.

Figure 32A:
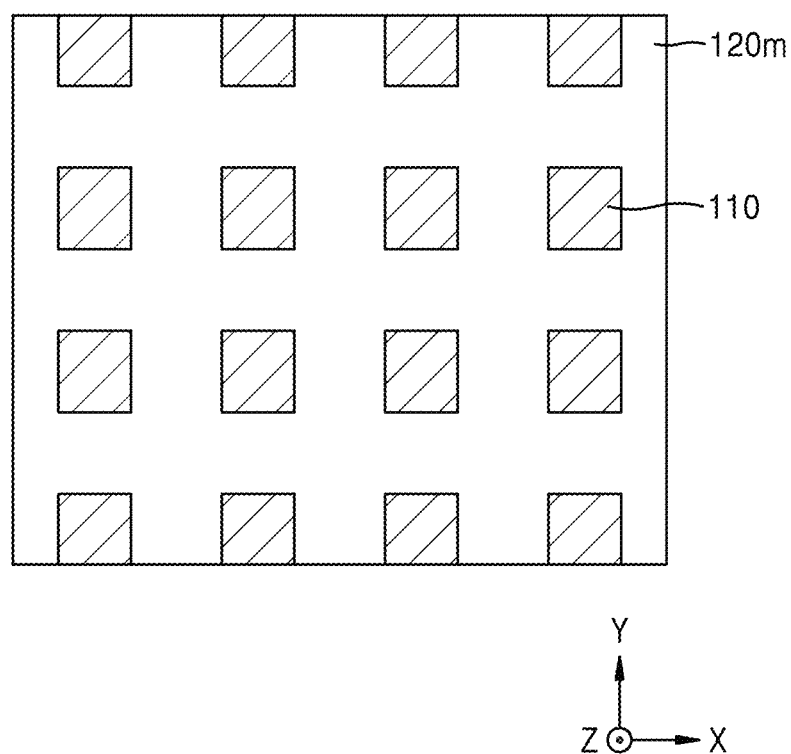
Figure 32B:
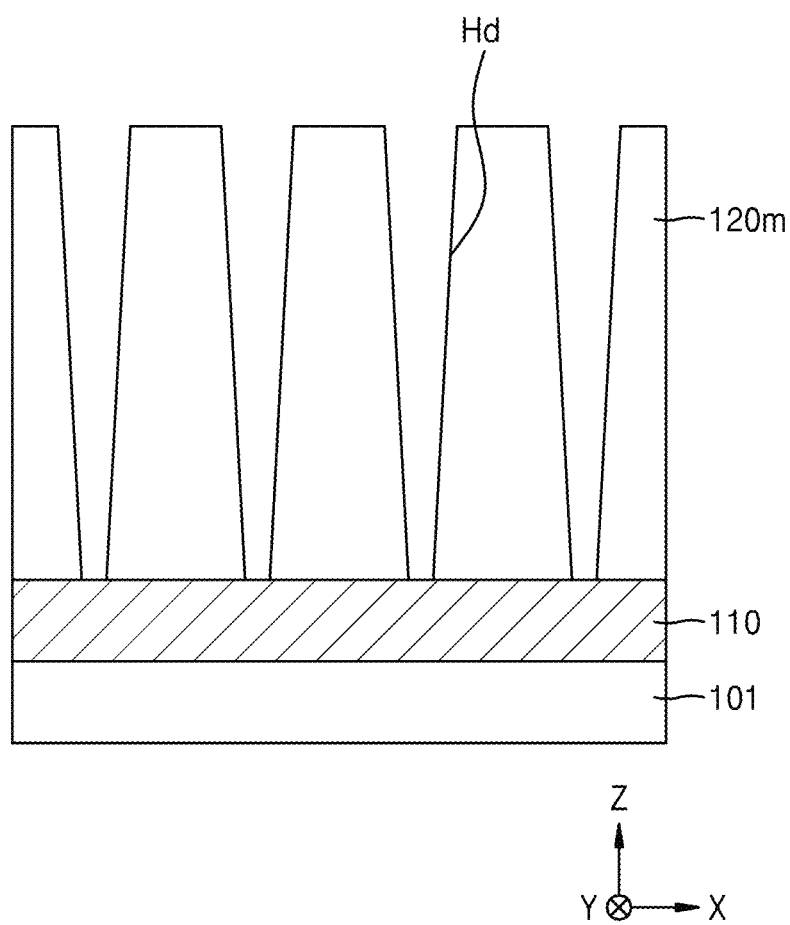
Figure 32C:
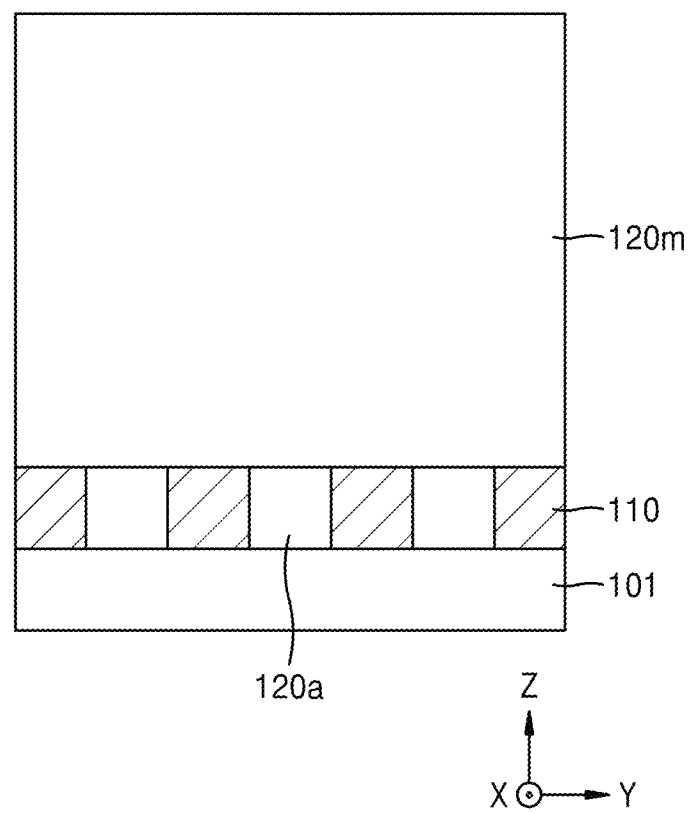

Referring to FIGS. 32A to 32C, the plurality of lower conductive lines 110 and the first insulating layer 120a may be formed as described with reference to FIGS. 1A to 1C. Next, a thirteenth insulating layer 120m may be formed on the plurality of lower conductive lines 110 and the first insulating layer 120a. The thirteenth insulating layer 120m may include silicon oxide, silicon nitride, or a combination thereof. The thirteenth insulating layer 120m may include a plurality of fourth holes Hd that expose the plurality of lower conductive lines 110 and each extend in the third direction (the Z direction) while being spaced apart from each other in the first direction (the X direction) and the second direction (the Y direction). For example, the thirteenth insulating layer 120m may be formed on the plurality of lower conductive lines 110 and the first insulating layer 120a, and then the thirteenth insulating layer 120m may be etched so that the plurality of fourth holes Hd may be formed in the thirteenth insulating layer 120m.

Figure 33A:
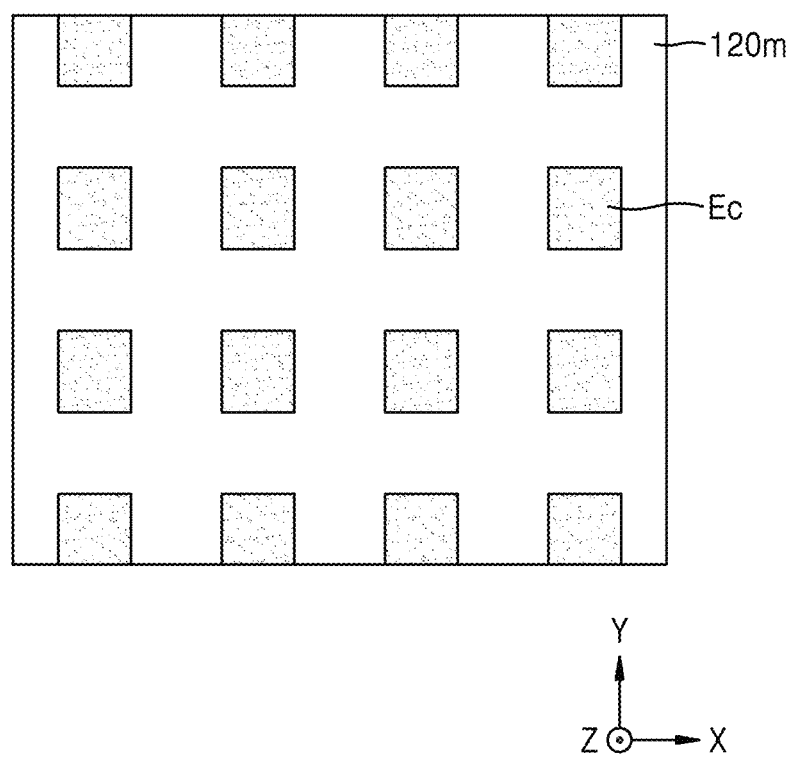
Figure 33B:
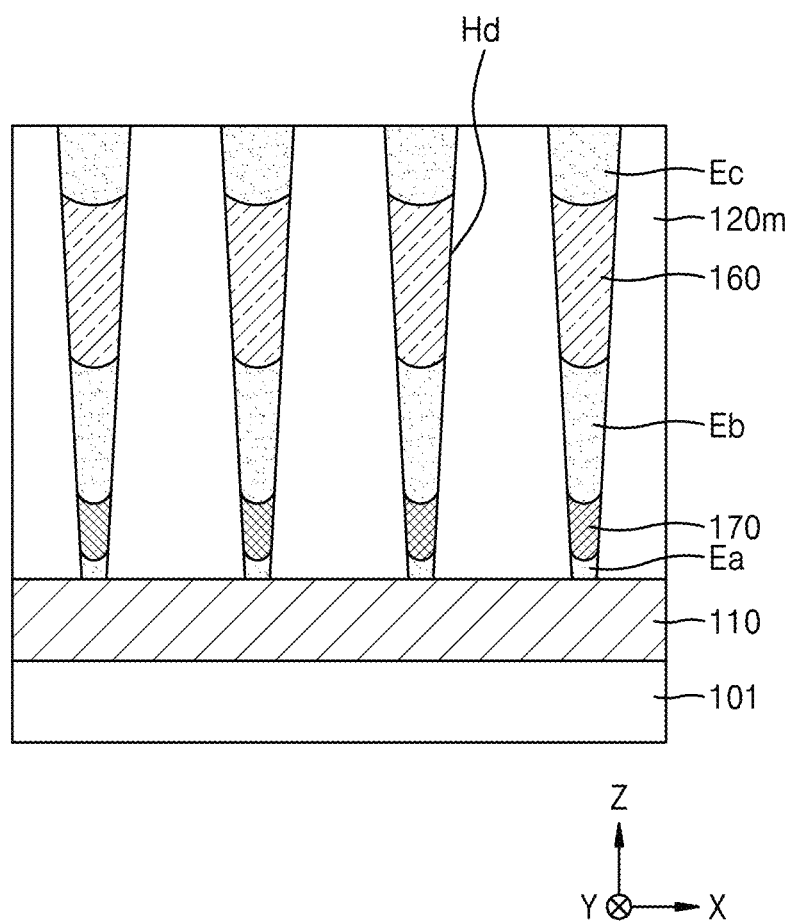
Figure 33C:
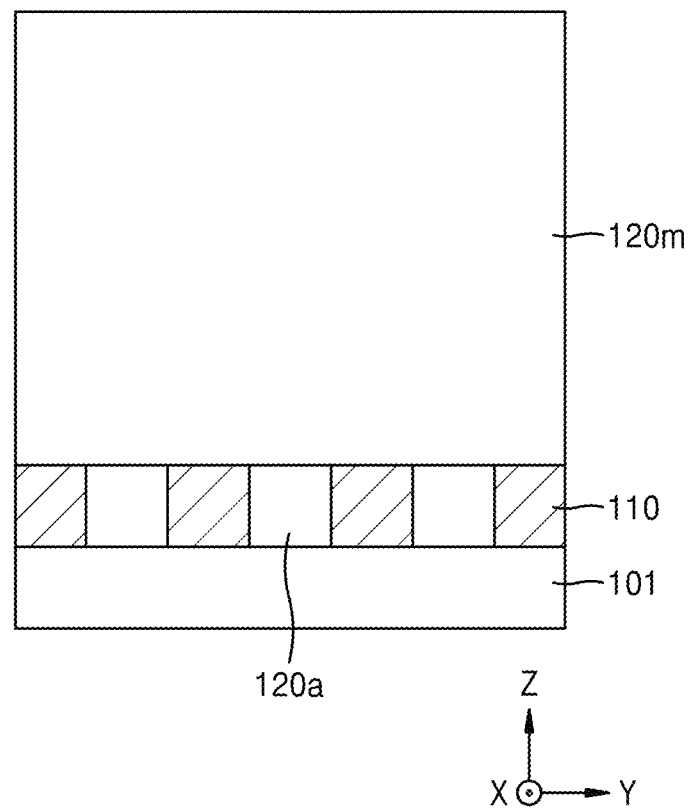

Referring to FIGS. 33A to 33C, the plurality of first electrode patterns Ea, the plurality of switch patterns 170, the plurality of second electrode patterns Ea, the plurality of phase change patterns 160, and the plurality of third electrode patterns Ec may be formed in the plurality of fourth holes Hd in the thirteenth insulating layer 120m. FIG. 33B shows that the plurality of switch patterns 170 are located between the plurality of first electrode patterns Ea and the plurality of second electrode patterns Eb and the plurality of phase change patterns 160 are formed between the plurality of second electrode patterns Eb and the plurality of third electrode patterns Ec. However, in another example embodiment, the plurality of switch patterns 170 may be located between the plurality of second electrode patterns Eb and the plurality of third electrode patterns Ec and the plurality of phase change patterns 160 may be formed between the plurality of first electrode patterns Ea and the plurality of second electrode patterns Eb.

For example, a first electrode layer (not shown) may be formed on the thirteenth insulating layer 120m and the plurality of lower conductive lines 110, and then the plurality of first electrode patterns Ea may be formed by polishing and/or etching the first electrode layer so that an upper end of the first electrode layer is lower than an upper surface of the thirteenth insulating layer 120m. Next, a switch layer (not shown) may be formed on the thirteenth insulating layer 120m and the plurality of first electrode patterns Ea, and then the plurality of switch patterns 170 may be formed by polishing and/or etching the switch layer so that an upper end of the switch layer is lower than the upper surface of the thirteenth insulating layer 120m. Thereafter, a second electrode layer (not shown) may be formed on the thirteenth insulating layer 120m and the plurality of switch patterns 170, and then the plurality of second electrode patterns Eb may be formed by polishing and/or etching the second electrode layer so that an upper end of the second electrode layer is lower than the upper surface of the thirteenth insulating layer 120m. Next, a phase change layer (not shown) may be formed on the thirteenth insulating layer 120m and the plurality of second electrode patterns Eb, and then the plurality of phase change patterns 160 may be formed by polishing and/or etching the phase change layer so that an upper end of the phase change layer is lower than the upper surface of the thirteenth insulating layer 120m. Next, a third electrode layer (not shown) may be formed on the thirteenth insulating layer 120m and the plurality of phase change patterns 160, and then the plurality of third electrode patterns Ec may be formed by polishing and/or etching the third electrode layer so that the upper surface of the thirteenth insulating layer 120m is exposed.

The plurality of first electrode patterns Ea, the plurality of second electrode patterns Eb, and the plurality of third electrode patterns Ec may include metal, metal nitride, carbon-based conductive material, or combinations thereof. For example, the plurality of first electrode patterns Ea, the plurality of second electrode patterns Eb, and the plurality of third electrode patterns Ec may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or combinations thereof.

Figure 34A:
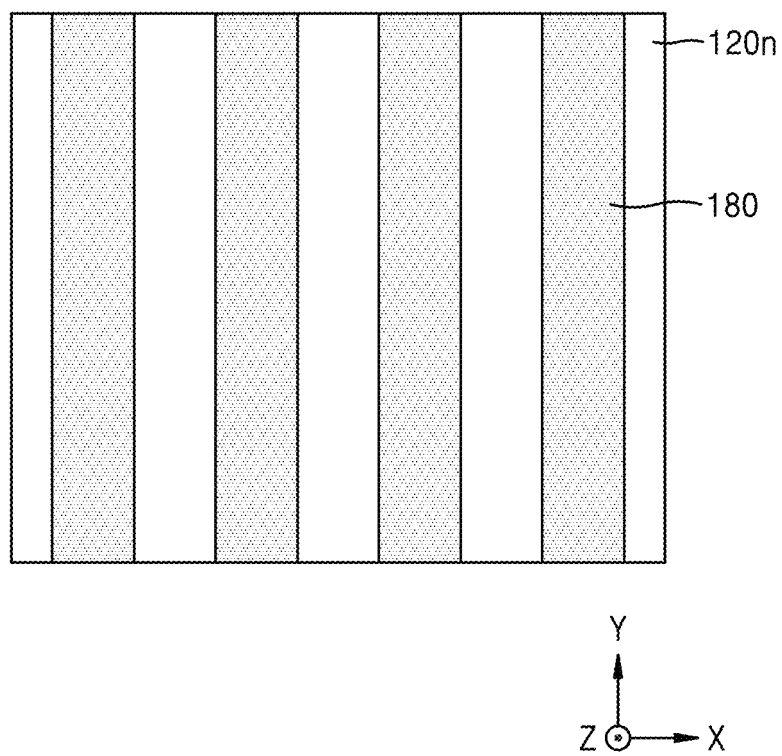
Figure 34B:
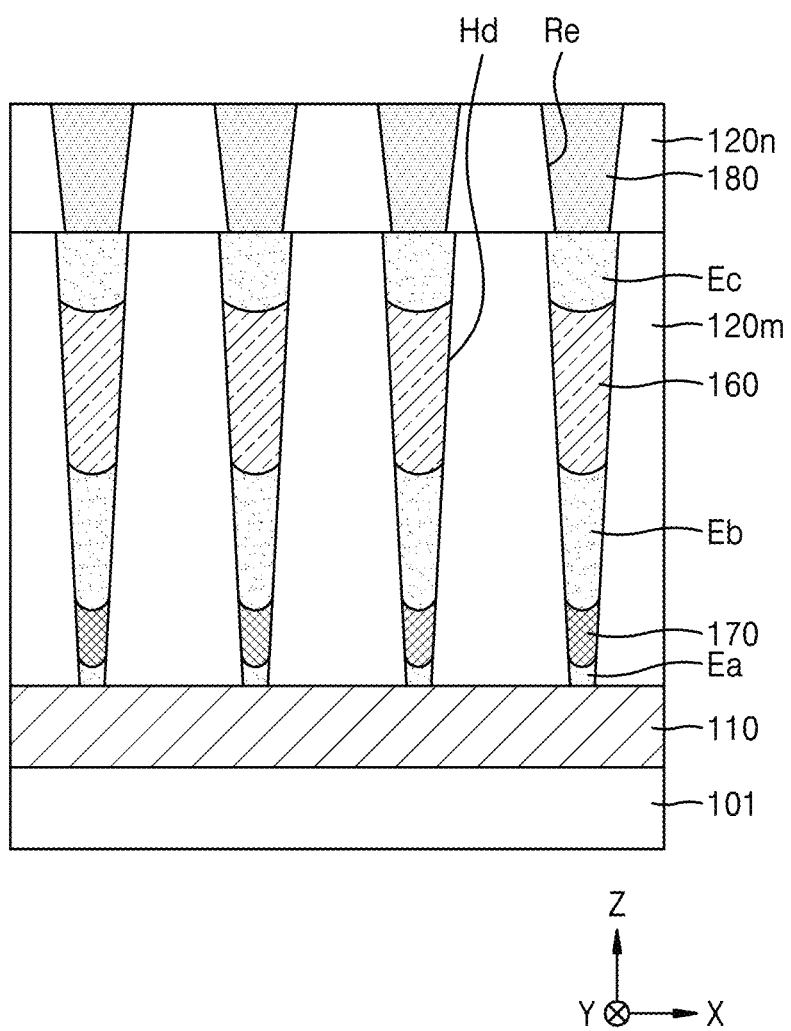
Figure 34C:
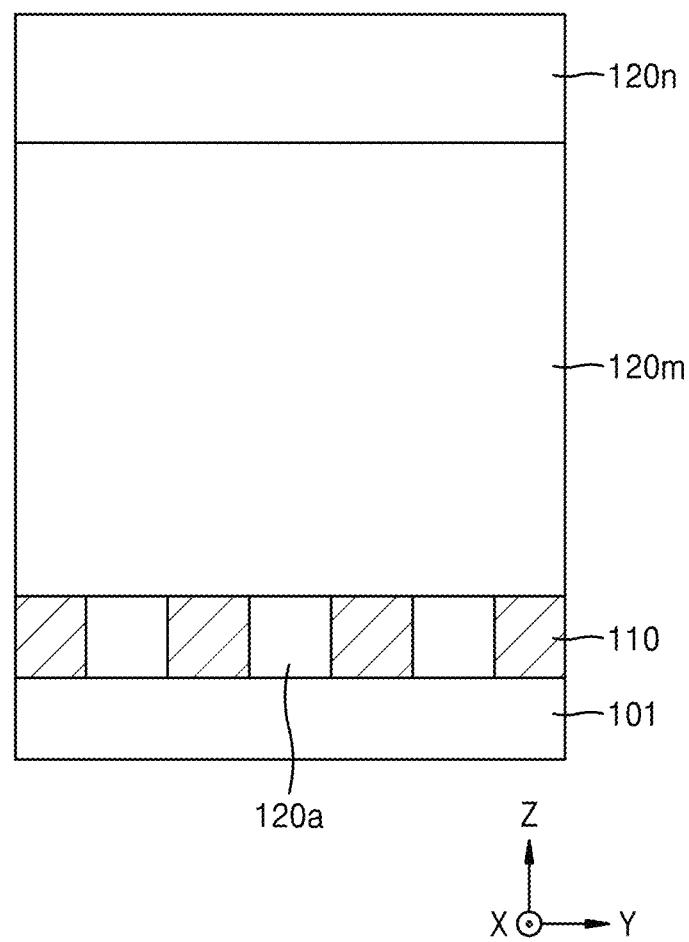

Referring to FIGS. 34A to 34C, a fourteenth insulating layer 120n and the plurality of upper conductive lines 180 may be formed on the plurality of third electrode patterns Ec and the thirteenth insulating layer 120m. The fourteenth insulating layer 120n may include silicon oxide, silicon nitride, or a combination thereof.

In some example embodiments, the plurality of upper conductive lines 180 may be formed using the damascene technique. That is, the fourteenth insulating layer 120n may be formed to include a plurality of fifth recesses Re extending in the second direction (the Y direction) and exposing the plurality of third electrode patterns Ec, and then the plurality of upper conductive lines 180 may be formed in the plurality of fifth recesses Re in the fourteenth insulating layer 120n. For example, the fourteenth insulating layer 120n may be formed on the thirteenth insulating layer 120m and the plurality of third electrode patterns Ec, and then the plurality of fourteenth insulating layer 120n may be etched to form the plurality of fifth recesses Re in the fourteenth insulating layer 120n. Next, an upper conductive layer may be formed on the plurality of third electrode patterns Ec and the fourteenth insulating layer 120n, and then the upper conductive layer may be polished and/or etched so that an upper surface of the fourteenth insulating layer 120n is exposed.

In another example embodiment, the plurality of upper conductive lines 180 may be formed using the etch technique. That is, the plurality of upper conductive lines 180 may be formed on the thirteenth insulating layer 120m and the plurality of third electrode patterns Ec, and then the fourteenth insulating layer 120n may be formed. For example, an upper conductive layer (not shown) may be formed on the thirteenth insulating layer 120m and the plurality of third electrode patterns Ec, and then the plurality of upper conductive lines 180 may be formed by etching the upper conductive layer so that the plurality of upper conductive lines 180 extend in the second direction (the Y direction) in parallel. Next, the fourteenth insulating layer 120n may be formed on the plurality of upper conductive lines 180 and the thirteenth insulating layer 120m, and then the fourteenth insulating layer 120n may be polished and/or etched so that the upper surface of each of the plurality of upper conductive lines 180 is exposed.

Figure 35A:
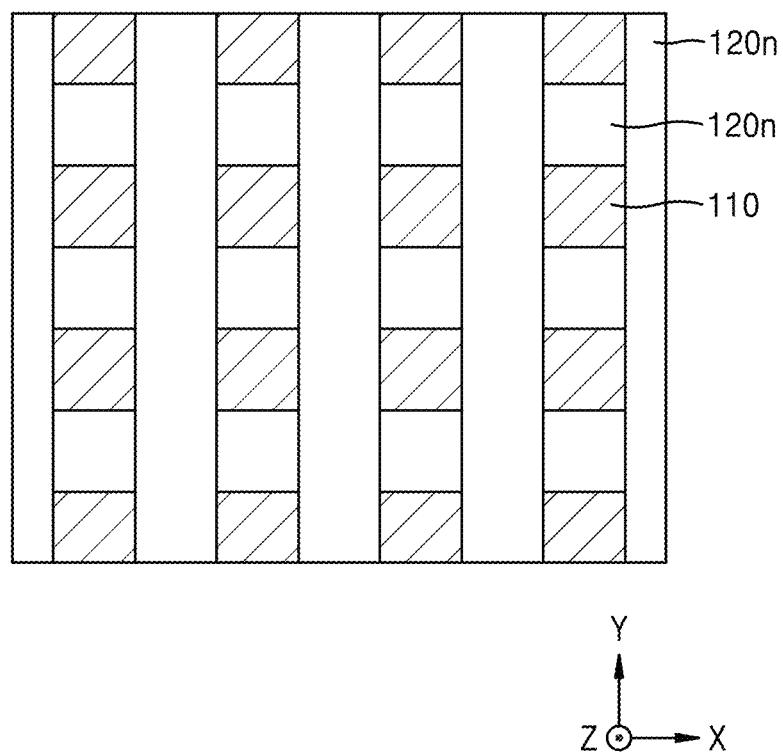
FIGS. 35A and 36A are plan views for explaining a method of manufacturing a memory device according to an example embodiment of the inventive concepts.
Figure 35B:
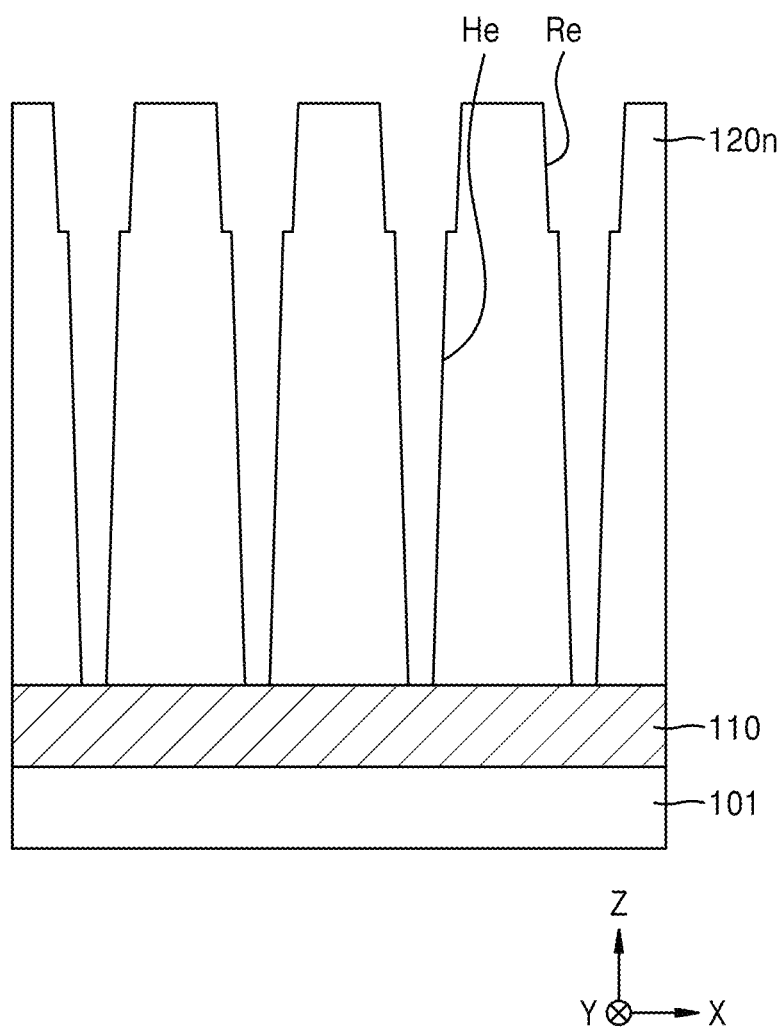
FIGS. 35B and 36B are front views for explaining the method of manufacturing the memory device according to the example embodiment of the inventive concepts.
Figure 35C:
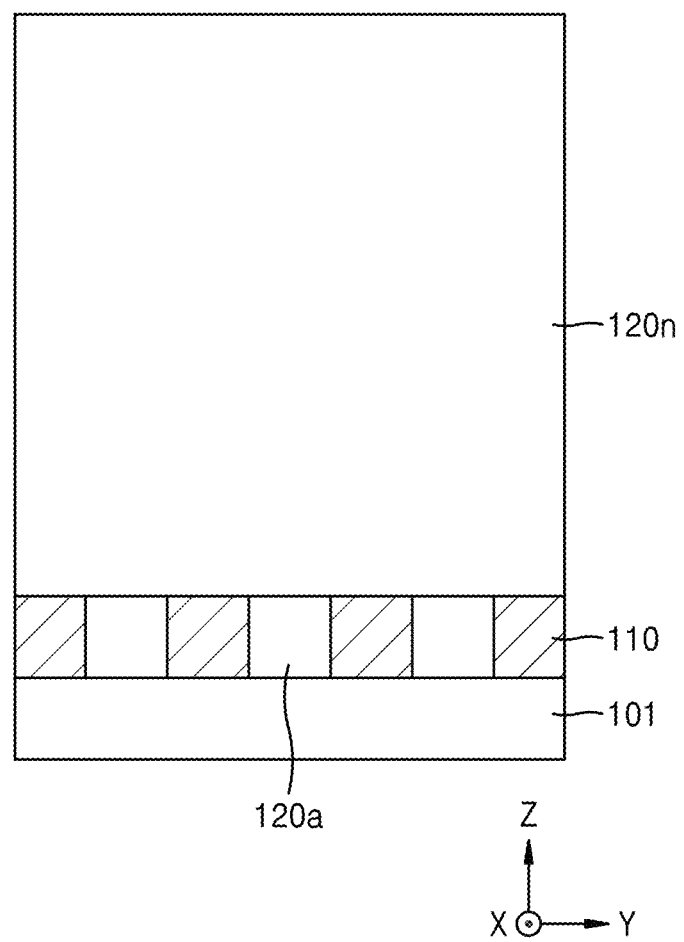
FIGS. 35C and 36C are side views for explaining the method of manufacturing the memory device according to the example embodiment of the inventive concepts.
Figure 36A:
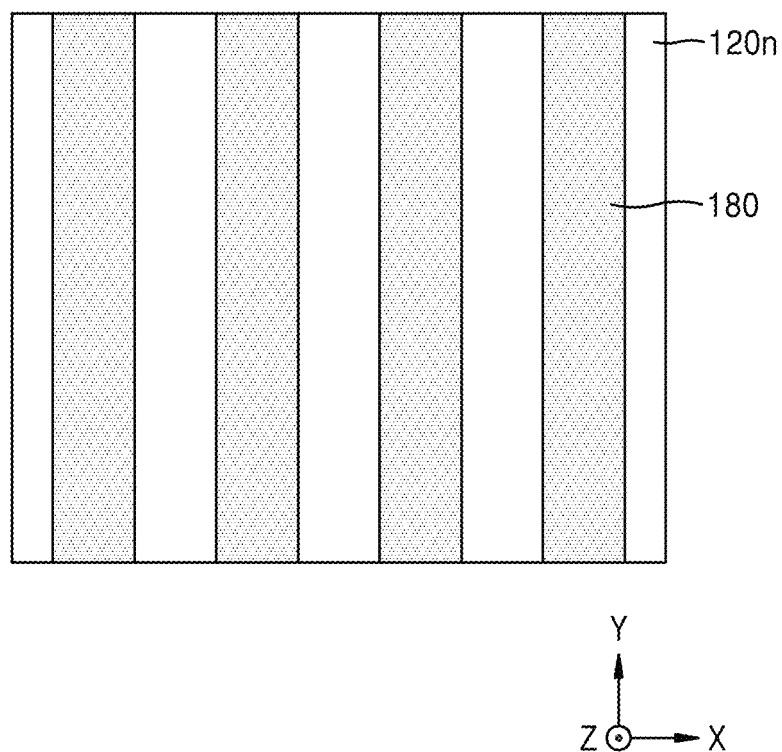
Figure 36B:
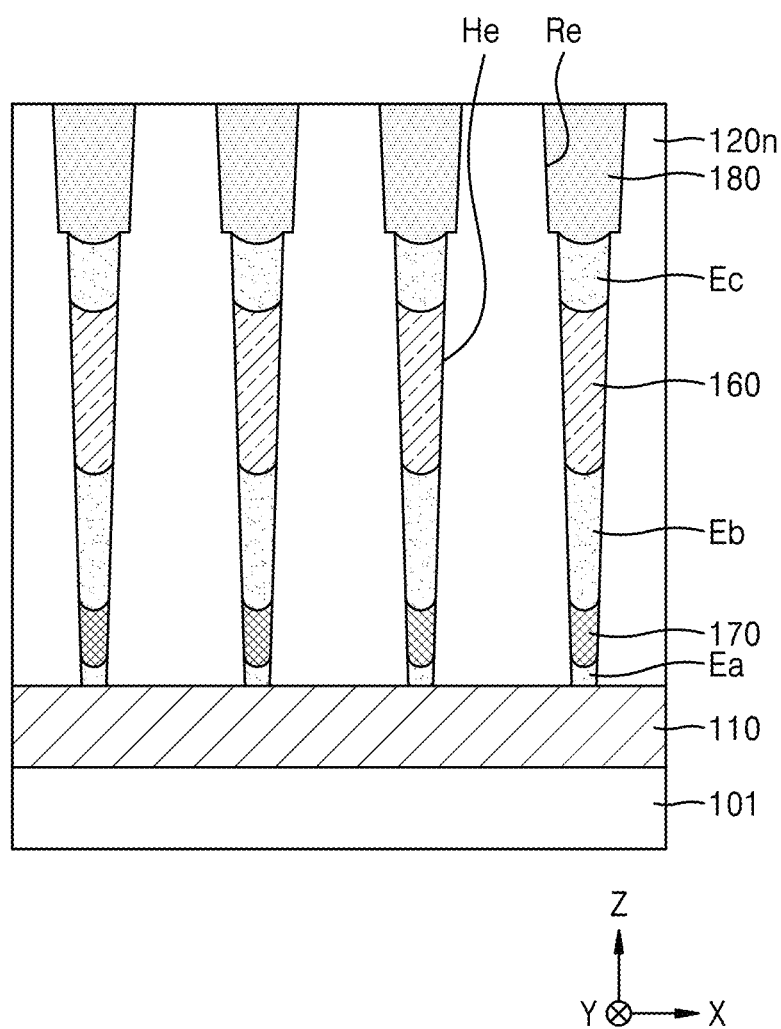
Figure 36C:
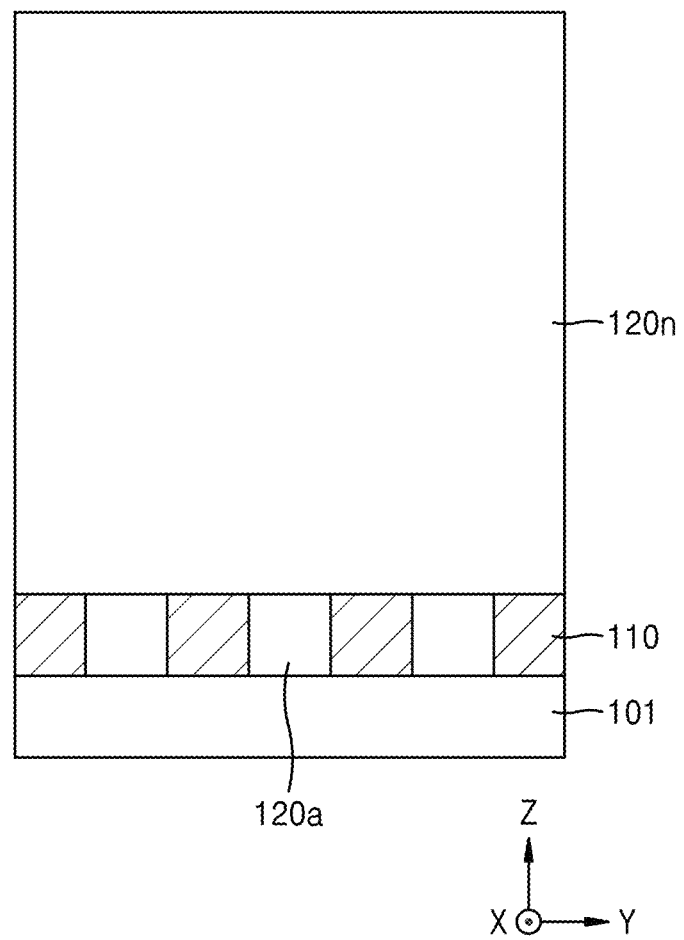

FIGS. 35A and 36A are plan views for explaining a method of manufacturing a memory device according to an example embodiment of the inventive concepts, FIGS. 35B and 36B are front views for explaining the method of manufacturing the memory device according to the example embodiment of the inventive concepts, and FIGS. 35C and 36C are side views for explaining the method of manufacturing the memory device according to the example embodiment of the inventive concepts. According to the method of manufacturing the memory device of the inventive concepts shown in FIGS. 35A to 36C, a plurality of first electrode patterns Ea, a plurality of switch patterns 170, a plurality of second electrode patterns Eb, a plurality of phase change patterns 160, a plurality of third electrode patterns Ec, and a plurality of upper conductive lines 180 (see FIGS. 36A to 36C) may be formed using the damascene technique.

Referring to FIGS. 35A to 35C, the plurality of lower conductive lines 110 and the first insulating layer 120a may be formed as described with reference to FIGS. 1A to 1C. Next, a fourteenth insulating layer 120n may be formed on the plurality of lower conductive lines 110 and the first insulating layer 120a. The fourteenth insulating layer 120n may include the plurality of fifth recesses Re each extending in parallel in the second direction (the Y direction) and the plurality of fifth holes He connected to the plurality of fifth recesses Re below the plurality of fifth recesses Re and exposing the plurality of lower conductive lines 110. The plurality of fifth holes He may be spaced apart from each other in the first direction (the X direction) and the second direction (the Y direction) and may each extend in the third direction (the Z direction).

Referring to FIGS. 36A to 36C, the plurality of first electrode patterns Ea, the plurality of switch patterns 170, the plurality of second electrode patterns Eb, the plurality of phase change patterns 160 and the plurality of third electrode patterns Ec may be formed in the plurality of fifth recesses Re in the fourteenth insulating layer 120n, and then the plurality of upper conductive lines 180 may be formed in the plurality of fifth recesses Re in the fourteenth insulating layer 120n.

For example, a first electrode layer (not shown) may be formed on the fourteenth insulating layer 120n and the plurality of lower conductive lines 110, and then the plurality of first electrode patterns Ea may be formed by polishing and/or etching the first electrode layer so that an upper end of the first electrode layer is lower than a bottom of each of the plurality of fifth recesses Re. Next, a switch layer (not shown) may be formed on the fourteenth insulating layer 120n and the plurality of first electrode patterns Ea, and then the plurality of switch patterns 170 may be formed by polishing and/or etching the switch layer so that an upper end of the switch layer is lower than the bottom of each of the plurality of fifth recesses Re. Next, a second electrode layer (not shown) may be formed on the fourteenth insulating layer 120n and the plurality of switch patterns 170, and then the plurality of second electrode patterns Eb may be formed by polishing and/or etching the second electrode layer so that an upper end of the second electrode layer is lower than the bottom of each of the plurality of fifth recesses Re. Next, a phase change layer (not shown) may be formed on the fourteenth insulating layer 120n and the plurality of second electrode patterns Eb, and then the plurality of phase change patterns 160 may be formed by polishing and/or etching the phase change layer so that an upper end of the phase change layer is lower than the bottom of each of the plurality of fifth recesses Re. Next, a third electrode layer (not shown) may be formed on the fourteenth insulating layer 120n and the plurality of phase change patterns 160, and then the plurality of third electrode patterns Ec may be formed by polishing and/or etching the third electrode layer so that the bottom of each of the fifth recesses Re is exposed. Finally, an upper conductive layer (not shown) may be formed on the fourteenth insulating layer 120n and the plurality of third patterns Ec, and then the plurality of upper conductive lines 180 may be formed by polishing and/or etching the upper conductive layer so that the upper surface of the fourteenth insulating layer 120n is exposed.

Figure 37A:
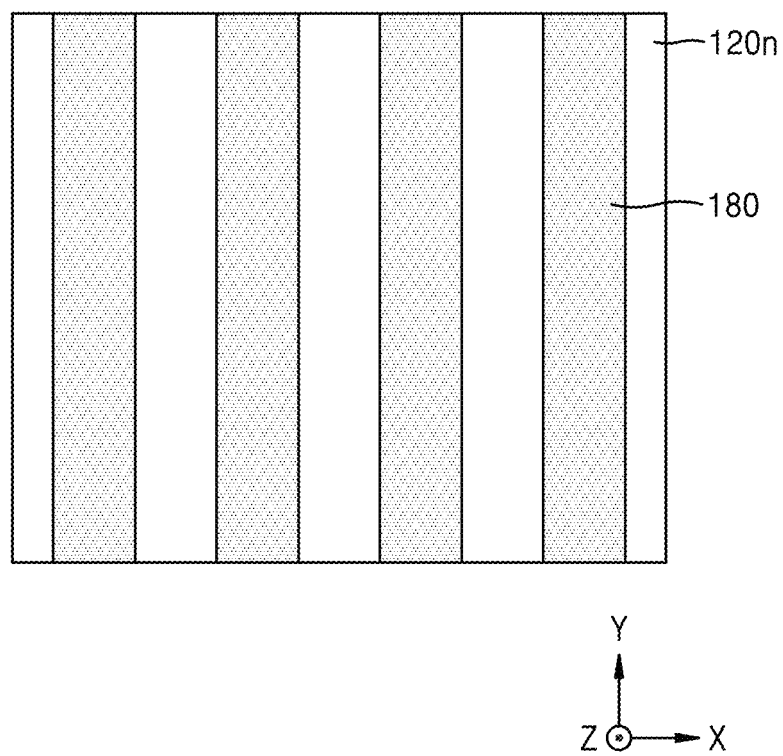
FIG. 37A is a plan view for explaining a method of manufacturing a memory device according to an example embodiment of the inventive concepts.
Figure 37B:
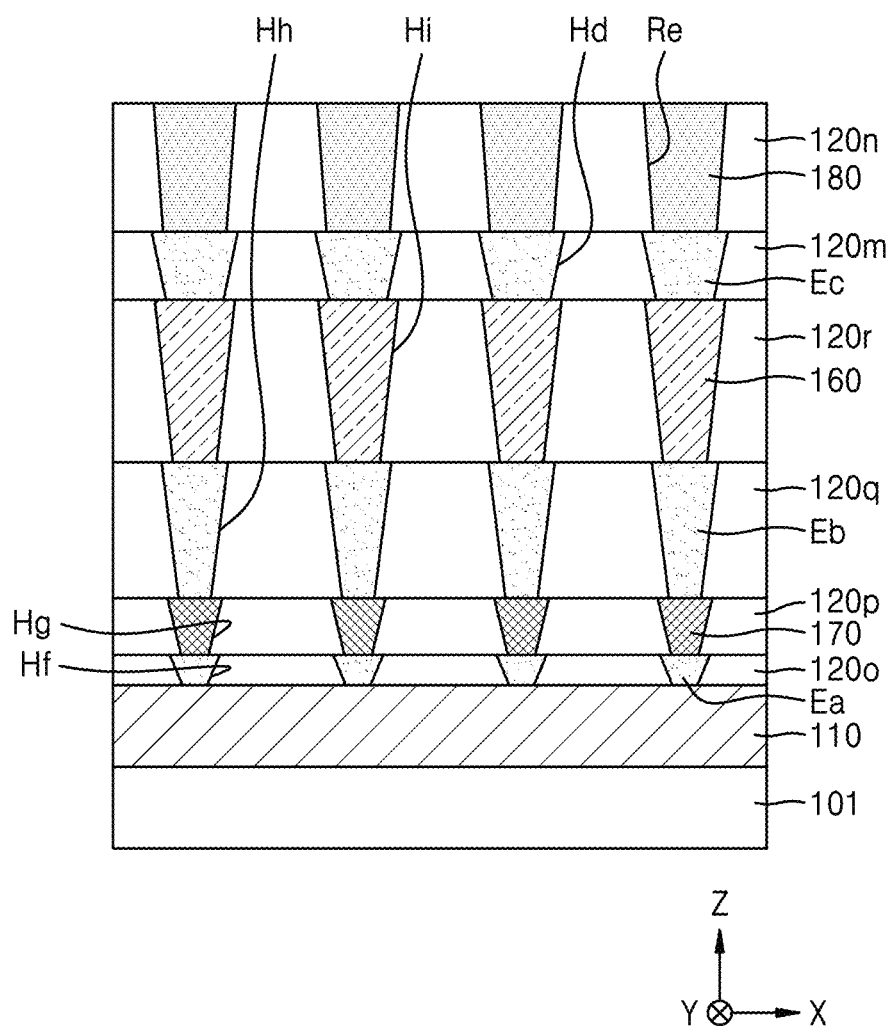
FIG. 37B is a front view for explaining the method of manufacturing the memory device according to the example embodiment of the inventive concepts.
Figure 37C:
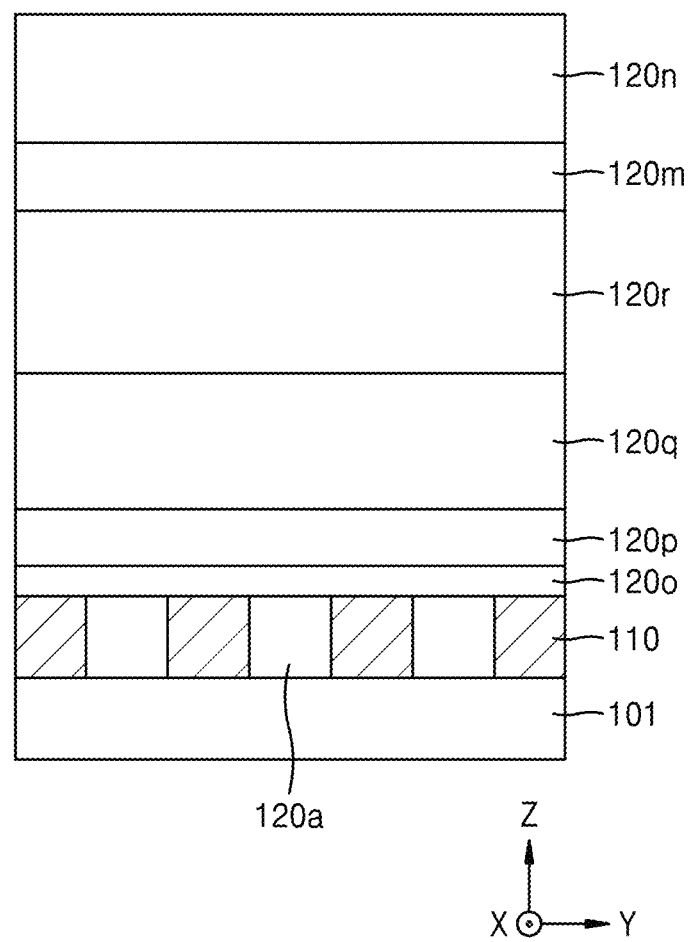
FIG. 37C is a side view for explaining the method of manufacturing the memory device according to the example embodiment of the inventive concepts.

FIG. 37A is a plan view for explaining a method of manufacturing a memory device according to an example embodiment of the inventive concepts, FIG. 37B is a front view for explaining the method of manufacturing the memory device according to the example embodiment of the inventive concepts, and FIG. 37C is a side view for explaining the method of manufacturing the memory device according to the example embodiment of the inventive concepts. According to the method of manufacturing the memory device of the inventive concepts shown in FIGS. 37A to 37C, a plurality of first electrode patterns Ea, a plurality of switch patterns 170, a plurality of second electrode patterns Eb, a plurality of phase change patterns 160, and a plurality of third electrode patterns Ec (see FIGS. 37A to 37C) may be formed using the damascene technique.

Referring to FIGS. 37A to 37C, the first insulating layer 120a and the plurality of lower conductive lines 110 may be formed as described with reference to FIGS. 1A to 1C. Next, the plurality of first electrode patterns Ea, the plurality of switch patterns 170, the plurality of second electrode patterns Eb, the plurality of phase change patterns 160, the plurality of third electrode patterns Ec, and the plurality of upper conductive lines 180 may be formed in a fifteenth insulating layer 120o, a sixteenth insulating layer 120p, a seventeenth insulating layer 120q, an eighteenth insulating layer 120r, a thirteenth insulating layer 120m, and a fourteenth insulating layer 120n using the damascene technique.

That is, the plurality of first electrode patterns Ea may be formed in a plurality of sixth holes Hf after the fifteenth insulating layer 120o having the plurality of sixth holes Hf is formed, the plurality of switch patterns 170 may be formed in a plurality of seventh holes Hg after the sixteenth insulating layer 120p having the plurality of seventh holes Hg is formed, the plurality of second electrode patterns Eb may be formed in a plurality of eighth holes Hh after the seventeenth insulating layer 120q having the plurality of eighth holes Hh is formed, the plurality of phase change patterns 160 may be formed in a plurality of ninth holes Hi after the eighteenth layer 120r having the plurality of ninth holes Hi is formed, the plurality of third electrode patterns Ec may be formed in the plurality of fourth holes Hd after the thirteenth insulating layer 120m having a plurality of fourth holes Hd is formed, and then the plurality of upper conductive lines 180 may be formed in the plurality of fifth recesses Re after the fourteenth insulating layer 120n having the plurality of fifth recesses Re is formed.

For example, the fifteenth insulating layer 120o may be formed on the plurality of lower conductive lines 110 and the first insulating layer 120a, and then the fifteenth insulating layer 120o may be etched to form the plurality of sixth holes Hf that may be spaced apart from each other in the first direction (the X direction) and in the second directions (the Y direction) and extending in the third direction (the Z direction) and exposing the plurality of lower conductive lines 110. Thereafter, a first electrode layer may be formed on the fifteenth insulating layer 120o and the plurality of lower conductive lines 110, and then the plurality of first electrode patterns Ea may be formed in the plurality of sixth holes Hf by polishing and/or etching the first electrode layer so that an upper surface of the fifteenth insulating layer 120o is exposed. Next, the sixteenth insulating layer 120p may be formed on the fifteenth insulating layer 120o and the plurality of first electrode patterns Ea, and then the sixteenth insulating layer 120p may be etched to form the plurality of seventh holes Hg exposing the plurality of first electrode patterns Ea that are spaced from each other in the first direction (the X direction) and in the second direction (the Y direction) and each extend in the third direction (the Z direction). Thereafter, a switch layer may be formed on the sixteenth insulating layer 120p and the plurality of first electrode patterns Ea, and then the plurality of switch patterns 170 may be formed in the seventh holes Hg by polishing and/or etching the switch layer so that an upper surface of the sixteenth insulating layer 120p is exposed. In addition, the seventeenth insulating layer 120q may be formed on the sixteenth insulating layer 120p and the plurality of switch patterns 170, and then the seventeenth insulating layer 120q may be etched so as to form the plurality of eighth holes Hh exposing the plurality of switch patterns 170 that are spaced apart from each other in the first direction (the X direction) and in the second direction (the Y direction) and each extend in the third direction (the Z direction). Thereafter, a second electrode layer may be formed on the seventeenth insulating layer 120q and the plurality of switch patterns 170, and then the plurality of second electrode patterns Eb may be formed in the plurality of eighth holes Hf by polishing and/or etching the second electrode layer so that an upper surface of the seventeenth insulating layer 120q is exposed. Next, the eighteenth insulating layer 120r may be formed on the seventeenth insulating layer 120q and the plurality of second electrode patterns Eb, and then the eighteenth insulating layer 120r may be etched to form the plurality of ninth holes Hi exposing the plurality of second electrode patterns Eb that are spaced from each other in the first direction (the X direction) and in the second direction (the Y direction) and each extend in the third direction (the Z direction). Thereafter, a phase change layer may be formed on the eighteenth insulating layer 120r and the plurality of second electrode patterns Eb, and then the plurality of phase change patterns 160 may be formed in the ninth holes Hi by polishing and/or etching the phase change layer so that an upper surface of the eighteenth insulating layer 120r is exposed. In addition, the thirteenth insulating layer 120m may be formed on the eighteenth insulating layer 120r and the plurality of phase change patterns 160, and then the thirteenth insulating layer 120m may be etched so as to form the plurality of fourth holes Hd exposing the plurality of phase change patterns 160 that are spaced apart from each other in the first direction (the X direction) and in the second direction (the Y direction) and each extend in the third direction (the Z direction). Thereafter, a third electrode layer may be formed on the thirteenth insulating layer 120m and the plurality of phase change patterns 160, and then the plurality of third electrode patterns Ec may be formed in the plurality of fourth holes Hd by polishing and/or etching the third electrode layer so that an upper surface of the thirteenth insulating layer 120m is exposed. Next, the fourteenth insulating layer 120n may be formed on the thirteenth insulating layer 120m and the plurality of third electrode patterns Ec, and then the fourteenth insulating layer 120n may be etched to form the plurality of fifth recesses Re exposing the plurality of third electrode patterns Ec that each extend in parallel in the second direction (the Y direction). Thereafter, an upper electrode layer may be formed on the fourteenth insulating layer 120n and the plurality of third patterns Ec, and then the plurality of upper conductive lines 180 may be formed in the plurality of fifth recesses Re by polishing and/or etching the upper electrode layer so that an upper surface of the fourteenth insulating layer 120n is exposed.

As described with reference to FIGS. 32A to 37C, some example embodiments of the inventive concepts may include the steps of forming the lower conductive line 110, forming at least one insulating layer (for example, the thirteenth insulating layer 120m to the eighteenth insulating layer 120r) including at least one hole (for example, the fourth hole Hd to the ninth hole Hi) on the lower conductive line 110, forming the first electrode pattern Ea, the switch pattern 170, the second electrode pattern Eb, the phase change pattern 160 and the third electrode pattern Ec in the at least one hole (for example, the fourth hole Hd to the ninth hole Hi) in the at least one insulating layer (for example, the thirteenth insulating layer 120m to the eighteenth insulating layer 120r), and forming the upper conductive line 180 on the third electrode pattern Ec.

In some example embodiments of the inventive concepts, it may not necessary that all of the at least one insulating layer (for example, the thirteenth insulating layer 120m to the eighteenth insulating layer 120r) should be formed, and then all of the first electrode patterns Ea, the switch pattern 170, the second electrode pattern Eb, the phase change pattern 160, and the third electrode pattern Ec should be formed. For example, as described with reference to FIGS. 37A to 37C, the fifteenth insulating layer 120o, the first electrode pattern Ea, the sixteenth insulating layer 120p, the switch pattern 170, the seventeenth insulating layer 120q, the second electrode pattern Eb, the eighteenth insulating layer 120r, and the third electrode pattern Ec may be formed in order.

While the inventive concepts have been particularly shown and described with reference to some example embodiments thereof, it will be understood that various changes in form and details may be made therein without departing from the spirit and scope of the following claims.

What is claimed is:

1. A method of manufacturing a memory device comprising:
    forming a plurality of lower conductive lines on a substrate;
    forming a plurality of memory units on the plurality of lower conductive lines;
    forming a switch stack that defines a plurality of first lines, the plurality of first lines extending in parallel in a first direction on the plurality of memory units;
    forming an upper conductive layer on the switch stack;
    forming an etch mask that defines a plurality of second lines, the plurality of second lines extending in parallel in a second direction on the upper conductive layer, the second direction being different from the first direction; and
    forming a plurality of upper conductive lines and a plurality of switch units by etching the upper conductive layer and the switch stack using the etch mask,
    wherein the forming the plurality of memory units comprises,
        forming a first insulating layer comprising a plurality of recesses, the plurality of recesses extending in parallel on the plurality of lower conductive lines and exposing the plurality of lower conductive lines, and
        forming a lower electrode layer in the plurality of recesses.

2. The method of manufacturing the memory device of claim 1, wherein the forming the plurality of memory units further comprises:

forming a material layer for forming a second insulating layer on the lower electrode layer; and forming a plurality of lower electrode patterns and the second insulating layer by polishing the lower electrode layer and the material layer for forming the second insulating layer so that an upper surface of the first insulating layer is exposed.

3. The method of manufacturing the memory device of claim 2, wherein the forming the plurality of memory units further comprises forming a spacer layer between the lower electrode layer and the material layer for forming the second insulating layer.

4. The method of manufacturing the memory device of claim 2, wherein the forming the plurality of memory units further comprises:

etching an upper portion of each of the plurality of lower electrode patterns; and forming a plurality of phase change patterns between the first insulating layer and the second insulating layer and above corresponding ones of the plurality of lower electrode patterns, respectively.

5. The method of manufacturing the memory device of claim 4, wherein the forming the plurality of memory units further comprises forming a plurality of lower intermediate electrode patterns between the first insulating layer and the second insulating layer and above corresponding ones of the plurality of phase change patterns, respectively.

6. The method of manufacturing the memory device of claim 2, wherein two neighboring memory units of the plurality of memory units share a corresponding one of the plurality of lower electrode patterns of the plurality of lower electrode patterns.

7. A method of manufacturing a memory device comprising:

forming a plurality of lower conductive lines;

forming a plurality of memory units on the plurality of lower conductive lines;

forming a plurality of switch units on the plurality of memory units;

forming a plurality of upper conductive lines on the plurality of switch units;

forming a first insulating layer comprising a plurality of first recesses extending in parallel; and forming a second insulating layer comprising a plurality of second holes, wherein the plurality of upper conductive lines are formed in the plurality of first recesses in the first insulating layer after the first insulating layer is formed, and wherein the forming the plurality of switch units forms the plurality of switch units in the plurality of second holes in the second insulating layer after the forming the second insulating layer is performed.

8. The method of manufacturing the memory device of claim 7, further comprising:

forming a third insulating layer comprising a plurality of second recesses, the plurality of second recesses extending in parallel and exposing the plurality of lower conductive lines, wherein the forming the plurality of memory units forms the plurality of memory units in the plurality of second recesses in the third insulating layer after the forming the third insulating layer is performed.

9. The method of manufacturing the memory device of claim 7, further comprising:

forming a third insulating layer comprising a plurality of third holes, wherein the forming the plurality of memory units forms the plurality of memory units in the plurality of third holes in the third insulating layer after forming the third insulating layer is performed.

10. The method of manufacturing the memory device of claim 7 wherein the forming the plurality of memory units forms the plurality of memory units in the plurality of second holes in the second insulating layer after the forming the second insulating layer is performed.

11. A method of manufacturing a memory device comprising:

forming a lower conductive line;

forming at least one insulating layer on the lower conductive line, the at least one insulating layer comprising at least one hole;

sequentially forming a first electrode pattern, a switch pattern, a second electrode pattern, a phase change pattern, and a third electrode pattern in the at least one hole in the at least one insulating layer; and forming an upper conductive line on the third electrode pattern.

12. The method of manufacturing the memory device of claim 11, wherein the forming the at least one insulating layer comprises forming a first insulating layer including a first hole, and wherein the switch pattern and the phase change pattern are formed in the first hole after the first insulating layer is formed.

13. The method of manufacturing the memory device of claim 11, wherein the forming the at least one insulating layer comprises forming a first insulating layer comprising a first hole and forming a second insulating layer comprising a second hole, and wherein the switch pattern is formed in the first hole after the first insulating layer is formed, and the phase change pattern is formed in the second hole after the second insulating layer is formed.

* * * * *